(12) United States Patent
Nakata et al.

(10) Patent No.: US 9,177,596 B2
(45) Date of Patent: Nov. 3, 2015

(54) DECODING DEVICE AND DECODING METHOD

(71) Applicant: Panasonic Corporation, Osaka (JP)

(72) Inventors: Kohei Nakata, Nara (JP); Yasumori Hino, Nara (JP); Yuji Takagi, Osaka (JP); Tsuyoshi Nakasendo, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/117,475

(22) PCT Filed: Mar. 28, 2013

(86) PCT No.: PCT/JP2013/002109
§ 371 (c)(1),
(2) Date: Nov. 13, 2013

(87) PCT Pub. No.: WO2013/145747
PCT Pub. Date: Oct. 3, 2013

(65) Prior Publication Data
US 2014/0334282 A1 Nov. 13, 2014

(30) Foreign Application Priority Data

Mar. 29, 2012 (JP) ................. 2012-076763
Oct. 1, 2012 (JP) ................. 2012-219328

(51) Int. Cl.
*G11B 20/10* (2006.01)
*G11B 7/005* (2006.01)
(Continued)

(52) U.S. Cl.
CPC ............ *G11B 20/10* (2013.01); *G11B 7/005* (2013.01); *G11B 20/10277* (2013.01);
(Continued)

(58) Field of Classification Search
CPC combination set(s) only.
See application file for complete search history.

(56) References Cited

U.S. PATENT DOCUMENTS 5,822,143 A  10/1998  Cloke et al.
6,201,840 B1  3/2001  Rub et al.
(Continued)

FOREIGN PATENT DOCUMENTS

JP  2000-151425  5/2000
JP  2003-141823  5/2003
(Continued)

OTHER PUBLICATIONS

International Search Report issued May 7, 2013 in International (PCT) Application No. PCT/JP2013/002109.
(Continued)

*Primary Examiner* — Dionne Pendleton
(74) *Attorney, Agent, or Firm* — Wenderoth, Lind & Ponack, L.L.P.

(57) ABSTRACT

A decoding device includes: an interference canceling circuit (104) which extracts, from states of $2^K$-number (where K is a natural number) of detected signals that are likely within a range of K bit width where an interference between bits of the digital information occurs due to predetermined frequency characteristics, most likely $2^M$-number (where M is a natural number) of detected signals respectively corresponding to states of $2^M$-number of detected signals which exist within a range of M bit width that is included in the range of K bit width; and a Viterbi decoding circuit (105) which generates a decoded signal by calculating differences between the $2^M$-number of detected signals extracted by the interference canceling circuit (104) and expectation signals respectively corresponding to the $2^M$-number of detected signals and also by selecting a transition sequence of a state of a detected signal for which the calculated difference is smallest.

17 Claims, 41 Drawing Sheets

(51) Int. Cl.
*H03M 13/00* (2006.01)
*H04L 1/00* (2006.01)
*H03M 13/41* (2006.01)
*H03M 13/11* (2006.01)
*H03M 13/15* (2006.01)

(52) U.S. Cl.
CPC .......... *H03M 13/6331* (2013.01); *H04L 1/004* (2013.01); *H03M 13/1105* (2013.01); *H03M 13/1515* (2013.01); *H03M 13/41* (2013.01)

(56) References Cited

U.S. PATENT DOCUMENTS

| 2003/0081655 | A1* | 5/2003 | Nakamura et al. | 375/141 |
| 2005/0213652 | A1 | 9/2005 | Higashino | |
| 2007/0104078 | A1* | 5/2007 | Yin et al. | 369/124.03 |
| 2007/0237059 | A1 | 10/2007 | Kasahara | |
| 2011/0228839 | A1* | 9/2011 | Agrawal et al. | 375/232 |

FOREIGN PATENT DOCUMENTS

| JP | 2005-135557 | 5/2005 |
| JP | 2005-267840 | 9/2005 |
| JP | 2007-124341 | 5/2007 |
| JP | 2008-176898 | 7/2008 |
| WO | 97/11544 | 3/1997 |

OTHER PUBLICATIONS

Blu-ray Disc Association, "White Paper Blu-ray Disc Format 1. A Physical Format Specifications for BD-RE", Oct. 2010.
Hosein Nikopour et al., "Turbo-Coded OFDM Transmission Over a Nonlinear Channel", IEEE Transactions on Vehicular Technology, vol. 54, No. 4, Jul. 2005.
Supplementary European Search Report issued Jan. 30, 2015 in corresponding European Application No. 13769315.6.

* cited by examiner

DECODING DEVICE AND DECODING METHOD

TECHNICAL FIELD

The present invention relates to a decoding device and a decoding method for decoding digital information based on a reproduced signal detected from a recording medium such as an optical disk or on a reception signal received via a communication medium such as an optical fiber.

BACKGROUND ART

In recent years, due to higher density of optical disks, a shortest mark length that is a length of a shortest recording mark is approaching a limit of optical resolution and an increase in intersymbol interferences and degradation of SNRs (Signal Noise Rates) are becoming more noticeable. In consideration thereof, a PRML (Partial Response Maximum Likelihood) system is generally used as a signal processing method.

The PRML system is a technique that combines a partial response (PR) with maximum likelihood decoding (ML) and is a system which selects a most likely signal sequence from a reproduced waveform on the premise that a known intersymbol interference is to occur. Therefore, the PRML system is known for improved decoding performance as compared to conventional level judgment systems.

A signal reproduced from an optical disk is first subjected to partial response equalization using a waveform equalizer, a digital filter, and the like so as to have predetermined frequency characteristics and is subsequently decoded to corresponding binarized data by selecting a most likely state transition sequence from a trellis diagram using Viterbi decoding or the like. Generally, a value L which represents a likelihood of a state transition to a state Sn (where n denotes the number of states) until time k is defined by Equation (1) below.

$$L = \sum_{i=0}^{k} (y_i - E_i)^2 \qquad (1)$$

In Equation (1) above, $y_i$ denotes a value of a reproduced signal at time i and $E_i$ denotes an expected ideal value of the reproduced signal. In a maximum likelihood decoding system, a state transition sequence for which the value L representing likelihood as calculated by Equation (1) is smallest is selected and decoded to corresponding binarized data (for example, refer to Patent Literature 1).

As the density of optical disks become higher, intersymbol interferences and SNR degradation become more problematic. Reproduction performance can be maintained by adopting a high-order PRML system as the PRML system. For example, when a 12 cm-diameter optical disk has a storage capacity of 25 GB per recording layer, favorable reproduction performance can be maintained by adopting a PR (1, 2, 2, 1) ML system. Meanwhile, when the storage capacity per layer is 33.3 GB, a PR (1, 2, 2, 2, 1) ML system must be adopted. In actuality, BDXLs which have a storage capacity of 33.4 GB per layer are already in practical use. BDXLs adopt the PR (1, 2, 2, 2, 1) ML system (for example, refer to Non Patent Literature 1).

In addition, the development of high-speed optical communication is being promoted in order to accommodate an explosion of information traffic in recent years. With the increase in information traffic, there is an apparent upward trend in inputted optical power and a physical limit of optical fibers where non-linear optical effects and thermal destruction occur is quickly approaching. In order to improve the communication efficiency of optical communication, there is a primary focus on improving the performance of transmitters and optical fibers which constitute transmission paths such as an optical wavelength multiplexing modulation system which uses light with a plurality of wavelengths and a dispersion-compensating fiber or an optical amplifier which compensate for distortion of an optical signal waveform due to dispersion caused by propagation characteristics of optical fibers.

With a PRML system used in optical disks as described above, a reproduced signal is equalized to frequency characteristics of a target PR class, and maximum likelihood decoding by a Viterbi algorithm or the like is performed on the PR-equalized reproduced signal according to a trellis diagram constructed based on the same PR class. For example, in the case of a BDXL with a storage capacity of 33.4 GB per layer, a PR (1, 2, 2, 2, 1) class is used.

FIG. 38 is a diagram showing frequency characteristics of an optical transfer function (OTF) of a BDXL and the PR (1, 2, 2, 2, 1) class. With a BDXL, high frequency noise is prevented from being greatly amplified by using the PR (1, 2, 2, 2, 1) class that is close to the frequency characteristics of the OTF. In this case, a reproduced signal corresponding to a recording mark of 1 channel bit is PR-equalized to a signal waveform of 5 channel bit width having an amplitude of (1, 2, 2, 2, 1). This is a state where an intersymbol interference of 5 channel bit width is created.

FIG. 39 is a diagram showing a trellis diagram that is applied to a Viterbi decoding circuit. As shown in FIG. 39, a trellis diagram used in maximum likelihood decoding has a constraint length of 5 in conformance with the intersymbol interference of 5 channel bit width and uses a BD RLL (1, 7) modulation system. In the trellis diagram shown in FIG. 39, the number of states at each time is 10.

FIG. 40 is a diagram showing frequency characteristics of an OTF of an optical disk with a recording line density that is twice of that of a BDXL and a PR (1, 2, 3, 4, 5, 6, 6, 6, 5, 4, 3, 2, 1) class that conforms to the OTF of the optical disk.

In this case, a reproduced signal corresponding to a recording mark of 1 channel bit is PR-equalized to a signal waveform of 11 channel bit width having an amplitude of (1, 2, 3, 4, 5, 6, 6, 6, 5, 4, 3, 2, 1). This is a state where an intersymbol interference of 13 channel bit width has occurred. A trellis diagram used in maximum likelihood decoding is to be constituted by the intersymbol interference of 13 channel bit width and a RLL (1, 7) modulation system of BD. As a result, the number of states increases to 466 and an enormous amount of processing becomes necessary.

FIG. 41 is a diagram showing a relationship between a width of an intersymbol interference and the number of states of a trellis diagram. FIG. 41 shows that as the width of the intersymbol interference increases, the number of states increases exponentially. Therefore, in order to simplify the trellis diagram, a length of a PR class must be reduced. However, reducing the length of a PR class increases high frequency gain, and causes a significant amplification of noise, a deterioration of SNR, and a degradation of decoding performance. Therefore, it is difficult to achieve a balance between decoding performance and simplification of a trellis diagram.

As described above, conventional PRML systems have a problem in that the amount of processing necessary for decoding increases as density of optical disks increase.

In addition, in optical communication, efficiency is achieved by the optical wavelength multiplexing modulation system, a dispersion-compensating fiber, or an optical amplifier as described earlier. Alternatively, in order to increase the amount of information that is transferred per wavelength of light, speed of optical modulation can be increased and a wider frequency band can be used to increase communication rate. However, in order to accurately receive an optical signal waveform modulated using a wide frequency band, an optical detector of a receiver must be improved. An optical detector converts a received optical signal waveform into an electric signal. Frequency bands that can be efficiently converted by an optical detector are limited.

Therefore, an intersymbol interference occurs during photoelectric conversion by an optical detector in which a signal transmitted at 1 channel bit width is detected as a waveform that has spread beyond the 1 channel bit width. The higher a channel frequency at an optical modulator of a transmitter, the wider the channel bit width of the intersymbol interference. Therefore, in a similar manner to optical disks, there is a problem in conventional optical communication in that when decoding digital information from a reception signal, the difficulty in achieving a balance between decoding performance and simplification of a trellis diagram prevents an improvement in communication rate or prevents a reduction in delay time. In addition, while sensitivity of an optical detector can be increased, this problematically requires an optical detector with a large size and greater power consumption.

CITATION LIST

Patent Literature

Patent Literature 1: Japanese Patent Application Laid-open No. 2003-141823
Patent Literature 2: Japanese Patent Application Laid-open No. 2007-124341 Non Patent Literature
Non Patent Literature 1: Blu-ray Disc Association, "White Paper Blu-ray Disc Format 1. A Physical Format Specifications for BD-RE", October 2010.
Non Patent Literature 2: Hosein Nikopour, "Turbo-Coded OFDM Transmission Over a Nonlinear Channel", IEEE TRANSACTIONS ON VEHICULAR TECHNOLOGY, VOL. 54, NO. 4, JULY 2005.

SUMMARY OF THE INVENTION

The present invention has been made in order to solve the problems described above and an object thereof is to provide a decoding device and a decoding method capable of reducing constraint length without worsening SNR and preventing degradation of decoding performance.

A decoding device according to an aspect of the present invention is a decoding device which decodes digital information based on a detected signal obtained from a medium having predetermined frequency characteristics, the decoding device comprising: an interference canceling unit which extracts, from states of $2^K$-number (where K is a natural number) of detected signals that are likely within a range of K bit width where an interference between bits of the digital information occurs due to the predetermined frequency characteristics, most likely $2^M$-number (where M is a natural number) of detected signals respectively corresponding to states of $2^M$-number of detected signals which exist within a range of M bit width that is included in the range of K bit width; and a first decoding unit which generates a decoded signal by calculating differences between the $2^M$-number of detected signals extracted by the interference canceling unit and expectation signals respectively corresponding to the $2^M$-number of detected signals and also by selecting a transition sequence of a state of a detected signal for which the calculated difference is smallest.

According to this configuration, an interference canceling unit extracts, from states of $2^K$-number (where K is a natural number) of detected signals that are likely within a range of K bit width where an interference between bits of the digital information occurs due to the predetermined frequency characteristics, most likely $2^M$-number (where M is a natural number) of detected signals respectively corresponding to states of $2^M$-number of detected signals which exist within a range of M bit width that is included in the range of K bit width. A first decoding unit generates a decoded signal by calculating differences between the $2^M$-number of detected signals extracted by the interference canceling unit and expectation signals respectively corresponding to the $2^M$-number of detected signals and selecting a transition sequence of a state of a detected signal for which the calculated difference is smallest.

According to the present invention, since a component corresponding to an intersymbol interference can be canceled from a detected signal, a constraint length can be reduced without worsening an SNR and degradation of decoding performance can be prevented.

This and other objects, features, and advantages of the present invention will become more apparent as the following detailed description is read with reference to the accompanying drawings.

DESCRIPTION OF EMBODIMENTS

Hereinafter, embodiments of a decoding device and a decoding method according to the present invention will be described with reference to the drawings. However, it should be noted that the following embodiments are merely embodied examples of the present invention and are not intended to limit the technical scope of the present invention.

First Embodiment

Figure 1:
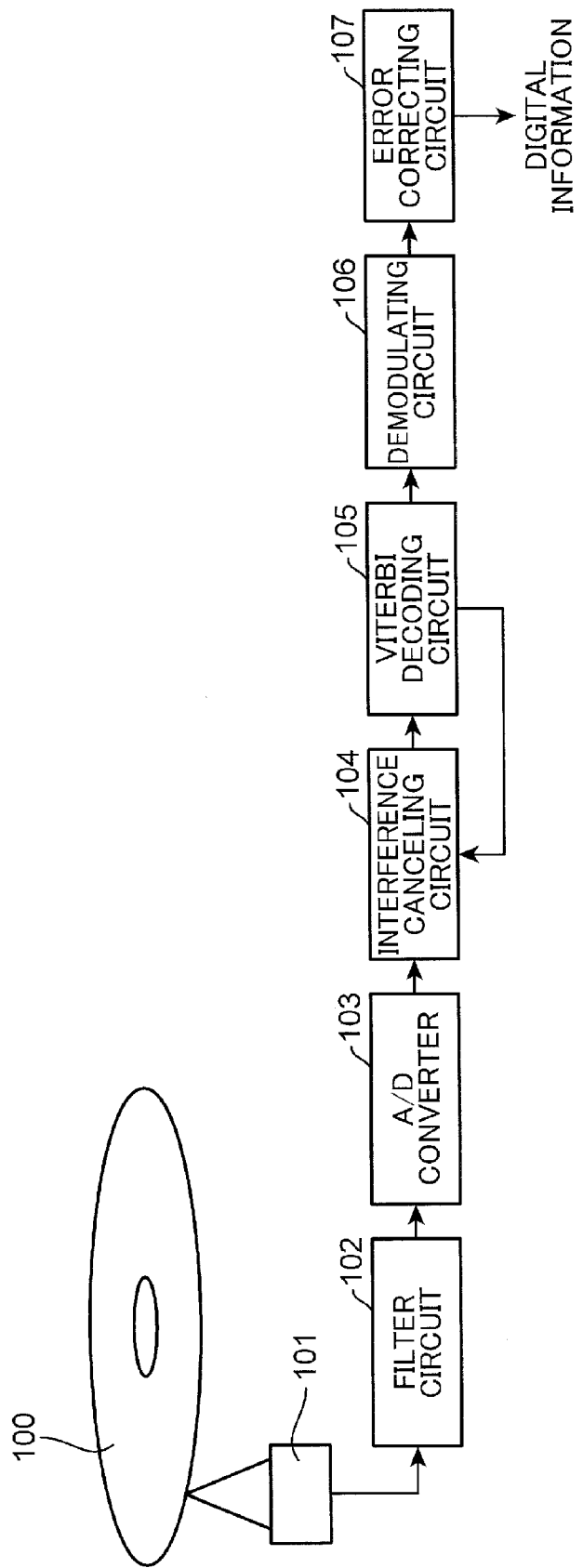
FIG. 1 is a diagram showing a configuration of an optical disk device according to a first embodiment of the present invention.

FIG. 1 is a diagram showing a configuration of an optical disk device according to a first embodiment of the present invention. Moreover, FIG. 1 shows a configuration of a portion related to a processing system which reproduces digital information from an optical disk 100. The optical disk device shown in FIG. 1 comprises an optical pickup 101, a filter circuit 102, an A/D converter 103, an interference canceling circuit 104, a Viterbi decoding circuit 105, a demodulating circuit 106, and an error correcting circuit 107.

On the optical disk 100, a recording mark is formed on a track in accordance with a recorded code obtained by performing error correction encoding according to a predetermined error correction encoding system and modulation encoding according to a predetermined modulation system on digital information. A reproduction process for reproducing recorded digital information is performed by utilizing the fact that the amount of reflected light with respect to laser light irradiated from the optical pickup 101 on a track varies in accordance with a recording mark that is formed on the track.

The optical pickup 101 irradiates laser light on the optical disk 100 and receives reflected light from the optical disk 100. The optical pickup 101 detects a reproduced signal (a detected signal) corresponding to the amount of reflected light from the optical disk 100. The filter circuit 102 reduces a low frequency band noise component and a high frequency band noise component within a range which does not adversely affect a component of a frequency band of a modulation code included in the reproduced signal detected by the optical pickup 101. The A/D converter 103 converts an output signal from the filter circuit 102 into a digital signal which is sampled at a 1 channel bit interval that is a unit of the modulation code.

The interference canceling circuit 104 cancels an interference component corresponding to an intersymbol interference from a digital signal in order to keep the number of states of a trellis diagram in the Viterbi decoding circuit 105 down to a predetermined number. The interference canceling circuit 104 extracts, from states of $2^K$-number (where K is a natural number) of detected signals that are likely within a range of K bit width where an interference between bits of the digital information occurs due to the predetermined frequency characteristics, most likely $2^M$-number (where M is a natural number) of detected signals respectively corresponding to states of $2^M$-number of detected signals which exist within a range of M bit width that is included in the range of K bit width.

The Viterbi decoding circuit 105 decodes the digital signal from which the intersymbol interference has been canceled by the interference canceling circuit 104 to the recorded code that is recorded on the track. The Viterbi decoding circuit 105 generates a decoded signal by calculating differences between the $2^M$-number of detected signals extracted by the interference canceling circuit 104 and expectation signals respectively corresponding to the $2^M$-number of detected signals and selecting a transition sequence of a state of a detected signal for which the calculated difference is smallest. The Viterbi decoding circuit 105 selects a transition sequence of a state using a Viterbi algorithm.

The demodulating circuit 106 demodulates the recorded code decoded by the Viterbi decoding circuit 105 into a bit sequence prior to the modulation encoding in accordance with the modulation system. The error correcting circuit 107 corrects an error included in the bit sequence demodulated by the demodulating circuit 106 in accordance with the error correction encoding system and outputs digital information.

Hereinafter, the interference canceling circuit 104 and the Viterbi decoding circuit 105 which decode a digital signal to a recorded code in an optical disk device will be described in detail.

Figure 2:
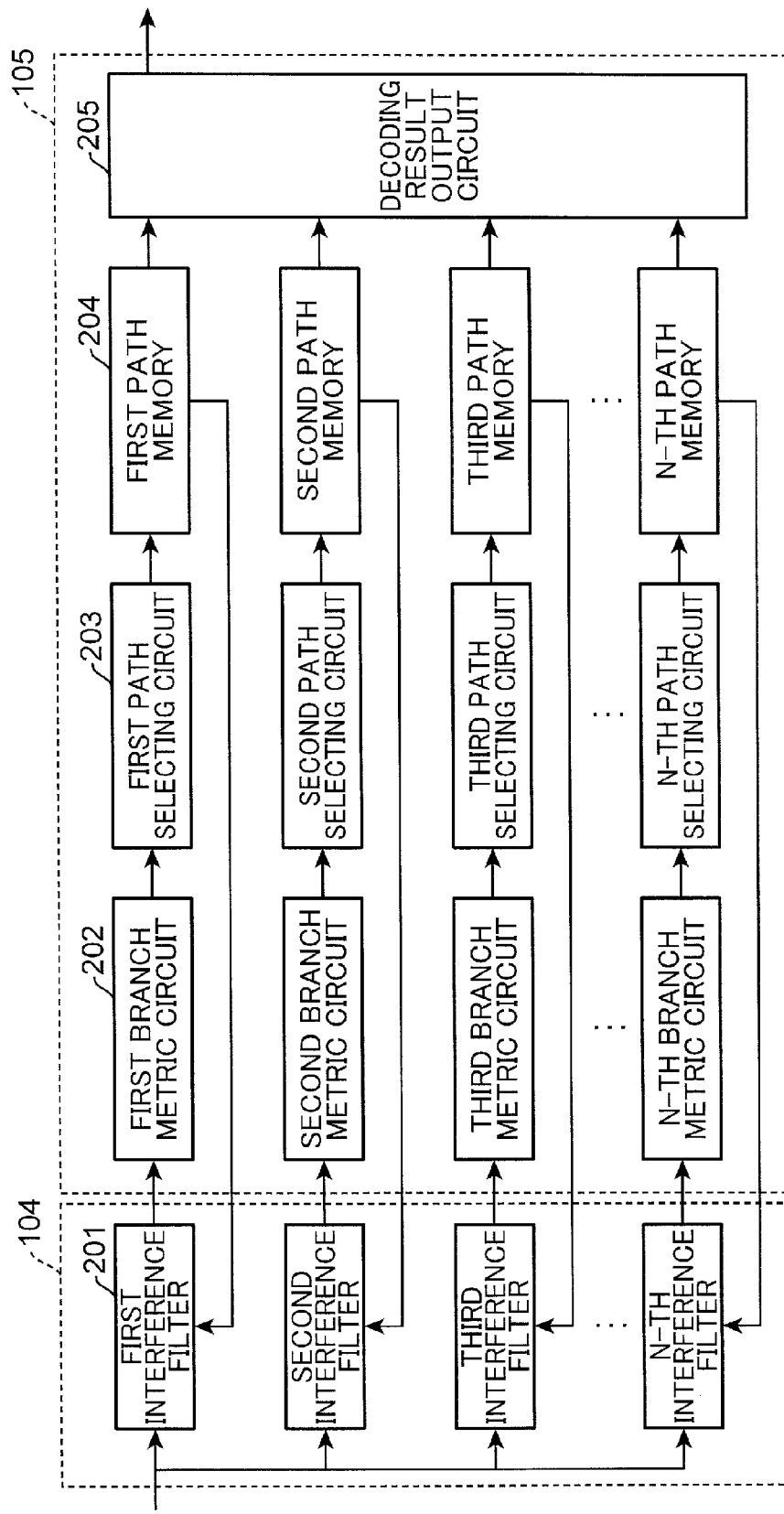
FIG. 2 is a block diagram showing detailed configurations of an interference canceling circuit and a Viterbi decoding circuit shown in FIG. 1.

FIG. 2 is a block diagram showing detailed configurations of the interference canceling circuit 104 and the Viterbi decoding circuit 105 shown in FIG. 1. The interference canceling circuit 104 comprises a plurality of interference filters (first to N-th interference filters) 201. The Viterbi decoding circuit 105 comprises a plurality of branch metric circuits (first to N-th branch metric circuits) 202, a plurality of path selecting circuits (first to N-th path selecting circuits) 203, a plurality of path memories (first to N-th path memories) 204, and a decoding result output circuit 205.

The plurality of interference filters 201, the plurality of branch metric circuits 202, the plurality of path selecting circuits 203, and the plurality of path memories 204 are respectively provided in accordance with the number of states in the trellis diagram in the Viterbi decoding circuit 105 and have the same functions.

A digital signal outputted from the A/D converter 103 is inputted to the interference filter 201 of the interference canceling circuit 104. The interference filter 201 is provided for each state of the trellis diagram in the Viterbi decoding circuit 105. The interference filter 201 uses a bit sequence of the path memory 204 which stores a judgment result in each state and a bit sequence corresponding to a state transition sequence which is consecutive to each state to cancel an interference signal component which is attributable to each bit sequence from the digital signal.

The branch metric circuit 202 of the Viterbi decoding circuit 105 calculates a branch metric value that indicates a difference between an output signal of the interference filter 201 and an expectation signal in accordance with a branch of the trellis diagram. The path selecting circuit 203 integrates a branch metric value at the present time with a path metric value up to an immediately previous time for each state to update the path metric value and selects a state transition sequence (path) with a minimum path metric value for each state. The path selecting circuit 203 stores the path metric value of the selected path in order to perform a similar process for the next time. The path memory 204 stores a bit sequence corresponding to the path selected by the path selecting circuit 203 for each state. A length of the bit sequence stored by the path memory 204 is a length that is necessary for values of bit sequences of the respective paths to converge to a same value. When the values of the bit sequences of the respective path memories 204 converge to the same value, the decoding result output circuit 205 outputs the converged bit sequence value as a decoding result.

Figure 3:
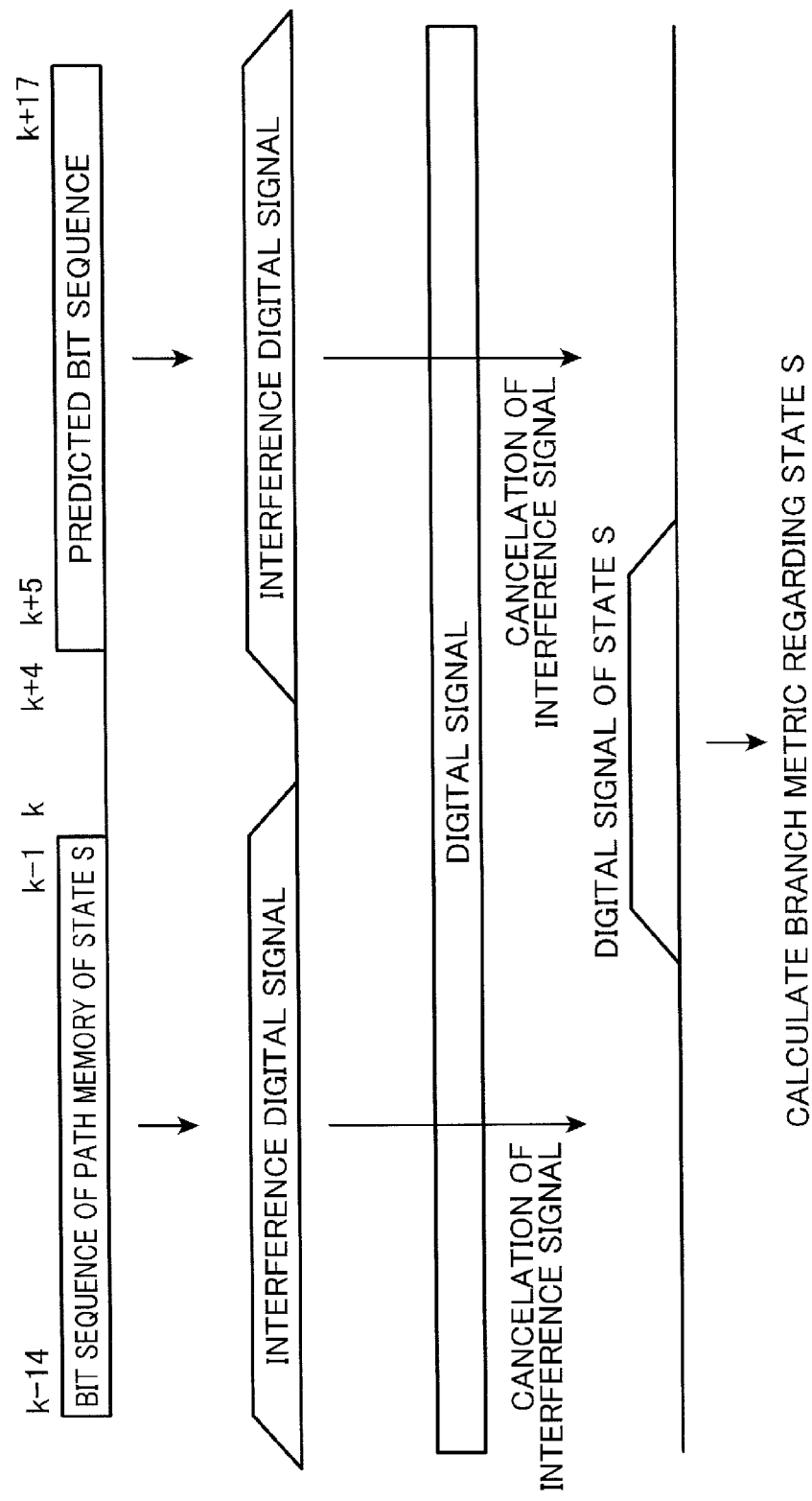
FIG. 3 is a diagram for describing operations of an interference filter shown in FIG. 2.

FIG. 3 is a diagram for describing operations of the interference filter 201 shown in FIG. 2.

At the present time k, the interference filter 201 extracts a bit sequence that is judged with respect to a state S in a 14 channel bit interval from previous time k−14 to previous time k−1 from the path memory 204. In addition, the interference filter 201 extracts a plurality of bit sequences that are predicted in a 13 channel bit interval from time k+5 to time k+17 that are consecutive to the state S. In this manner, the interference filter 201 generates a bit sequence of 32 channel bits excluding a 5 channel bit interval corresponding to the state S from the present time k to time k+4.

The interference filter 201 calculates a bit sequence preceding the present time and a bit sequence after the present time which are recorded on the optical disk 100 as an interference digital signal that is included in a digital signal obtained through frequency characteristics of a corresponding reproduction processing system from detection by the optical pickup 101 until passage through the filter circuit 102 and the A/D converter 103. The interference filter 201 calculates the interference digital signal by multiplying a frequency spectrum that is a Fourier transform of a bit sequence by the frequency characteristics of the reproduction processing system. Alternatively, the interference filter 201 may calculate an interference digital signal by calculating a reproduced signal of a 1 channel bit recording mark from the frequency characteristics of the reproduction processing system and performing a convolution computation of the calculated reproduced signal and a bit sequence.

The interference filter 201 subtracts the interference digital signal obtained as described above from the digital signal outputted from the A/D converter 103. Accordingly, signal components attributable to bit sequences of an interval from time k−14 to time k−1 and an interval from time k+5 to time k+17 are canceled. Moreover, when a signal component of a bit sequence prior to time k−15 and a signal component of a bit sequence subsequent to time k+18 remains, the interference filter 201 can extract a digital signal of only a bit sequence of an interval from time k to time k+4 by further multiplying a signal obtained by subtracting the interference digital signal from the digital signal outputted from the A/D converter 103 by a window function.

Figure 39:
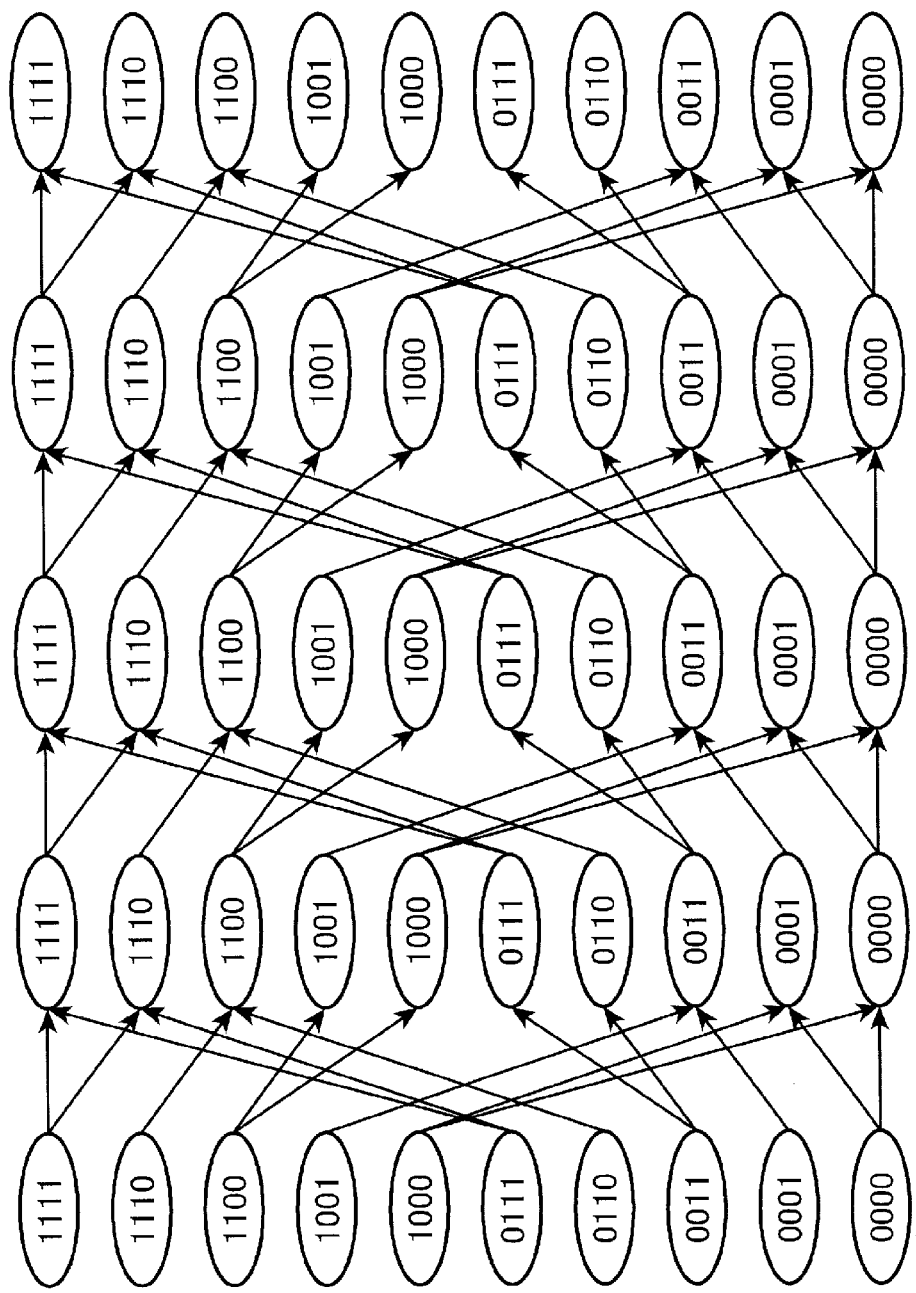
FIG. 39 is a diagram showing a trellis diagram that is applied to a Viterbi decoding circuit.
Figure 40:
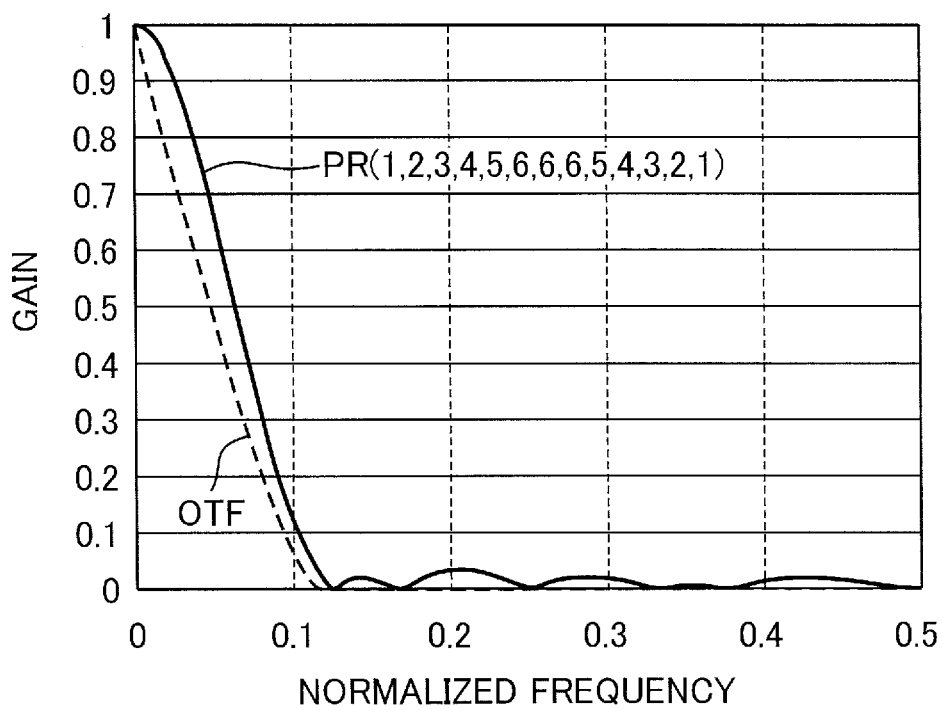
FIG. 40 is a diagram showing frequency characteristics of an OTF of an optical disk with a recording line density that is twice that of a BDXL and a PR (1, 2, 3, 4, 5, 6, 6, 6, 5, 4, 3, 2, 1) class that conforms to the OTF of the optical disk.
Figure 41:
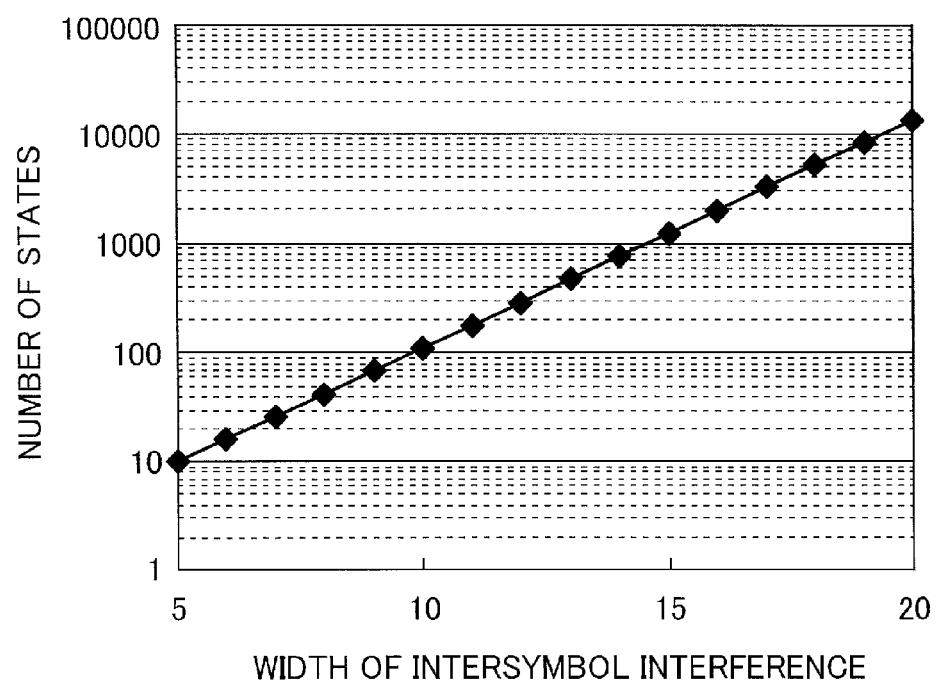
FIG. 41 is a diagram showing a relationship between a width of an intersymbol interference and the number of states of a trellis diagram.

The branch metric circuit 202 calculates a branch metric value related to the state S using the extracted digital signal. The digital signal only includes a bit sequence of the interval from time k to time k+4. Therefore, a trellis diagram in the Viterbi decoding circuit 105 can be given a simple configuration with a constraint length of 5 as shown in FIG. 39.

With respect to a plurality of predicted bit sequences, the interference filter 201 calculates a branch metric value at the state S when using each of the predicted bit sequences, and calculates a bit sequence of the interval from time k+5 to time k+17 which has not been decoded by selecting a predicted bit sequence which has a minimum branch metric value. Accordingly, an optimum cancellation of an intersymbol interference can also be performed for the interval from time k+5 to time k+17 which has not been decoded.

Figure 4:
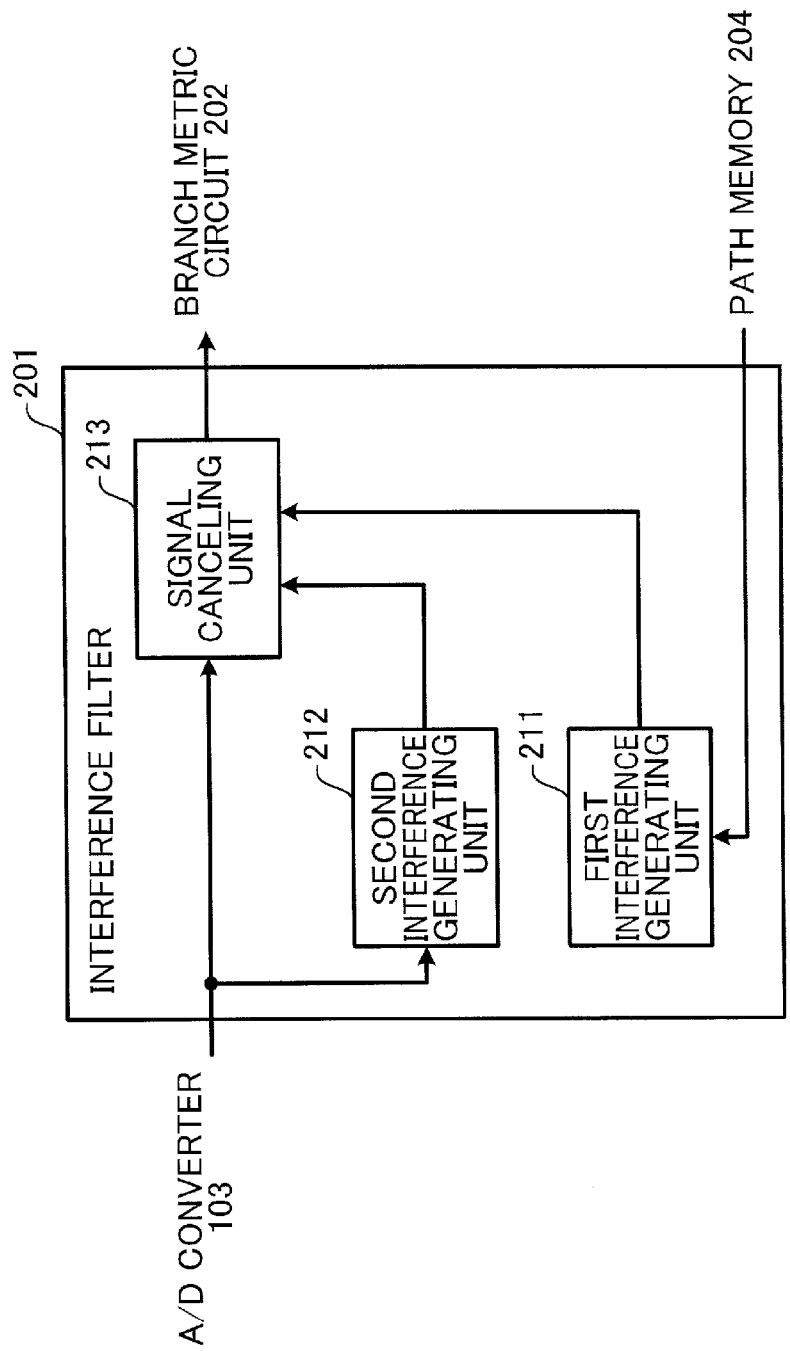
FIG. 4 is a diagram showing a configuration of the interference filter shown in FIG. 2.

A configuration of the interference filter 201 which functions as shown above will now be described. FIG. 4 is a diagram showing a configuration of the interference filter 201 shown in FIG. 2. The interference filter 201 comprises a first interference generating unit 211, a second interference generating unit 212, and a signal canceling unit 213.

For each state of $2^M$-number of detected signals (digital signals), the first interference generating unit 211 generates a first interference component (a first interference digital signal) which is obtained when passing a bit sequence in accordance with a transition sequence of a state of a first predetermined interval that corresponds to a time prior to an M bit-width range within a K bit-width range through the optical disk 100. The first interference generating unit 211 generates the first interference component using a transition sequence for each state which is selected by the Viterbi decoding circuit 105. Moreover, the M bit width is smaller than a spreading width of a response signal that is obtained when a 1 bit width signal is passed through the optical disk 100.

For each state of $2^M$-number of detected signals (digital signals), the second interference generating unit 212 generates a second interference component (a second interference digital signal) which is obtained when passing a bit sequence in accordance with a transition sequence of a state of a second predetermined interval that corresponds to a time subsequent to the M bit-width range within the K bit-width range through the optical disk 100. Among a plurality of second interference components that are generated from the transition sequences of a plurality of states that are likely in the second predetermined interval, the second interference generating unit 212 uses a second interference component for which a state transition sequence of a most likely has been obtained for each state in the Viterbi decoding circuit 105.

The signal canceling unit 213 outputs a signal obtained by canceling the first interference component (the first interference digital signal) and the second interference component (the second interference digital signal) from the detected signal (the digital signal) to the branch metric circuit 202 of the Viterbi decoding circuit 105.

In addition, the first interference generating unit 211 generates a first interference component that is expressed by a frequency spectrum. The second interference generating unit 212 generates a second interference component that is expressed by a frequency spectrum. The signal canceling unit 213 outputs a frequency spectrum that is obtained by subtracting the frequency spectrum of the first interference component and the frequency spectrum of the second interference component from a frequency spectrum of the detected signal.

Alternatively, the first interference generating unit 211 may generate a first interference component that is expressed by a signal waveform on a time axis. The second interference generating unit 212 may generate a second interference component that is expressed by a signal waveform on a time axis. The signal canceling unit 213 may output a signal obtained by subtracting the first interference component and the second interference component from the detected signal.

Furthermore, in the present first embodiment, the optical disk device corresponds to an example of the decoding device, the optical disk 100 corresponds to an example of the medium, the optical pickup 101 corresponds to an example of the optical pickup, the interference canceling circuit 104 corresponds to an example of the interference canceling unit, the Viterbi decoding circuit 105 corresponds to an example of the first decoding unit, the first interference generating unit 211 corresponds to an example of the first interference generating unit, the second interference generating unit 212 corresponds to an example of the second interference generating unit, and the signal canceling unit 213 corresponds to an example of the signal canceling unit.

Although a processing interval of the interference filter 201 is set to 32 channel bits in the description above, a width of the processing interval is favorably longer than a spreading width (a width of an intersymbol interference) of a reproduced signal with respect to a 1 channel bit recording mark. When the width of the processing interval is shorter than the width of an intersymbol interference, an influence of a signal component of a bit sequence of an interval other than that from time k to time k+4 remains in the digital signal from which the interference digital signal has been subtracted and is retained as an error in a branch metric value. An increase in the error of the branch metric value results in a degradation in decoding performance.

Figure 5:
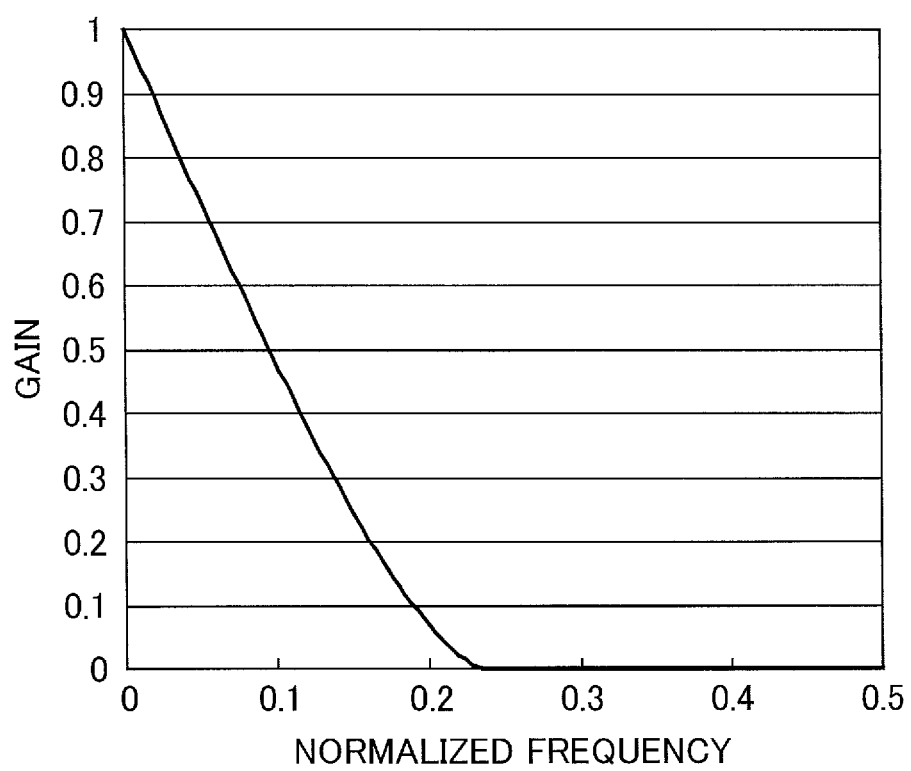
FIG. 5 is a diagram showing frequency characteristics of an OTF of a BDXL.
Figure 6:
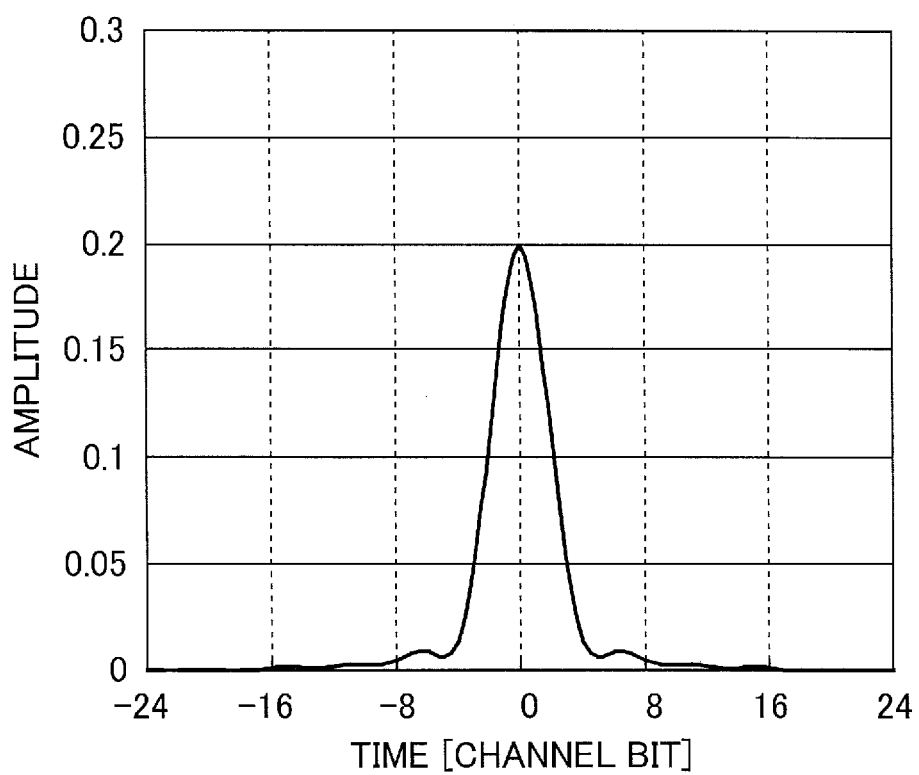
FIG. 6 is a diagram showing a reproduced signal that is obtained when reproducing a 1 channel bit recording mark according to the frequency characteristics shown in FIG. 5.

FIG. 5 is a diagram showing frequency characteristics of an OTF of a BDXL, and FIG. 6 is a diagram showing a reproduced signal that is obtained when reproducing a 1 channel bit recording mark according to the frequency characteristics shown in FIG. 5. As shown in FIG. 6, since the reproduced signal is spread over a width of approximately 20 channel bits, the processing interval is favorably set to 20 channel bits or more.

Figure 7:
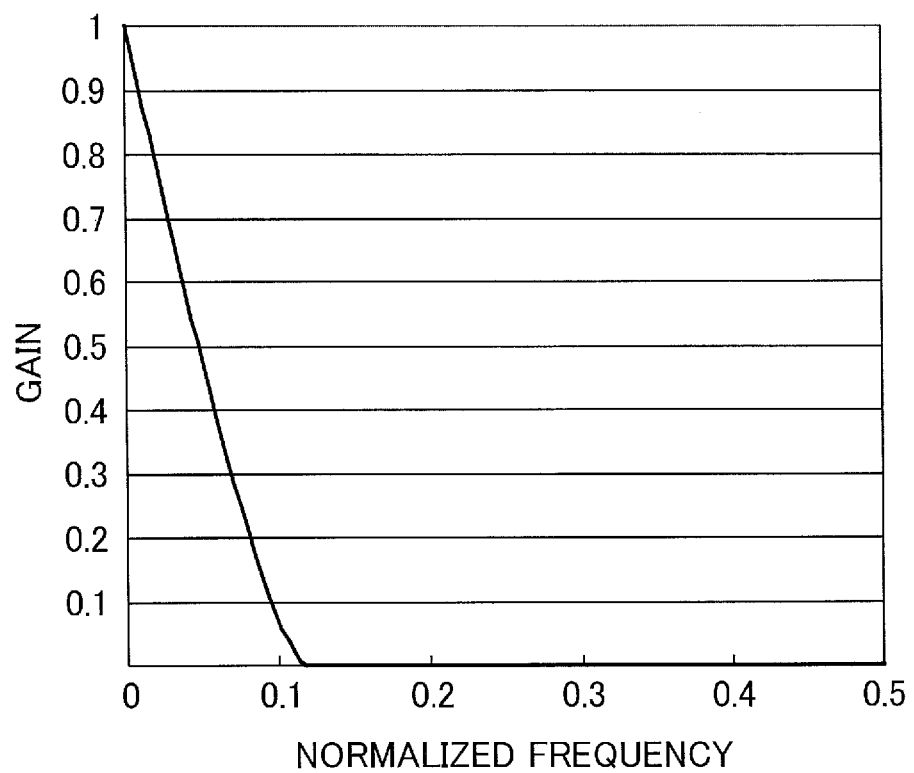
FIG. 7 is a diagram showing frequency characteristics of an OTF of an optical disk whose recording line density is twice of that of a BDXL.
Figure 8:
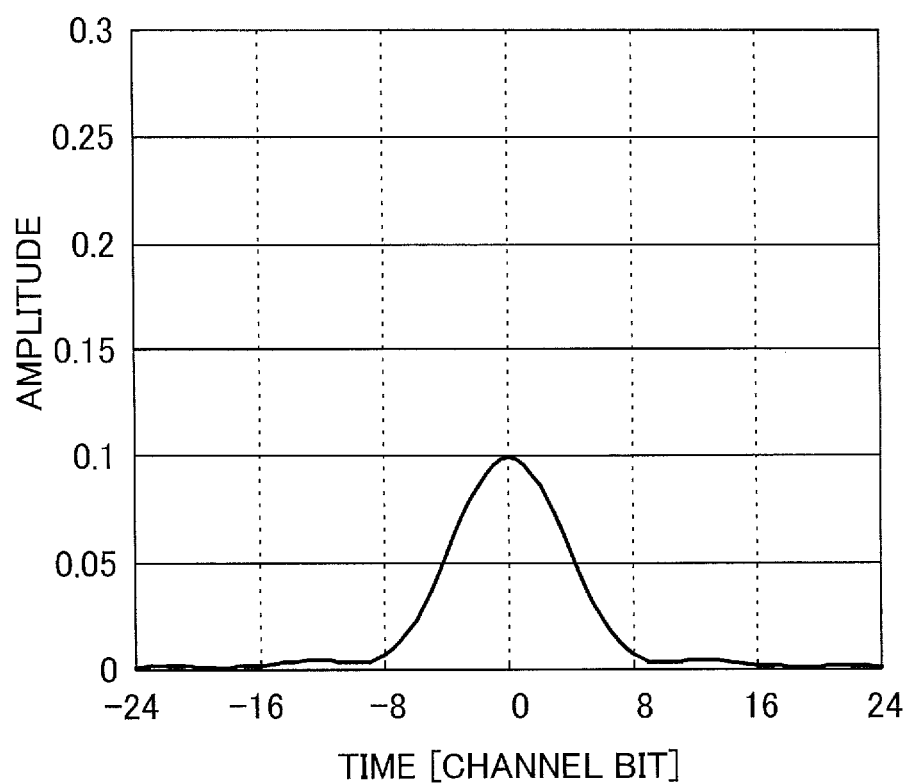
FIG. 8 is a diagram showing a reproduced signal that is obtained when reproducing a 1 channel bit recording mark according to the frequency characteristics shown in FIG. 7.

In addition, FIG. 7 is a diagram showing frequency characteristics of an OTF of an optical disk whose recording line density is twice of that of a BDXL, and FIG. 8 is a diagram showing a reproduced signal that is obtained when reproducing a 1 channel bit recording mark according to the frequency characteristics shown in FIG. 7. As shown in FIG. 8, the width of the reproduced signal has further spread from the width of a reproduced signal of a BDXL to a width of approximately 32 channel bits. Therefore, with an optical disk whose recording line density is twice of that of a BDXL, the processing interval is favorably set to 32 channel bits or more. In this case, a signal component of a bit sequence of an interval other than that from time k to time k+4 does not remain and decoding can be performed under optimum conditions.

Next, specific examples of processing by the interference filter 201 and the branch metric circuit 202 will be described with reference to FIGS. 9 and 10.

Figure 9:
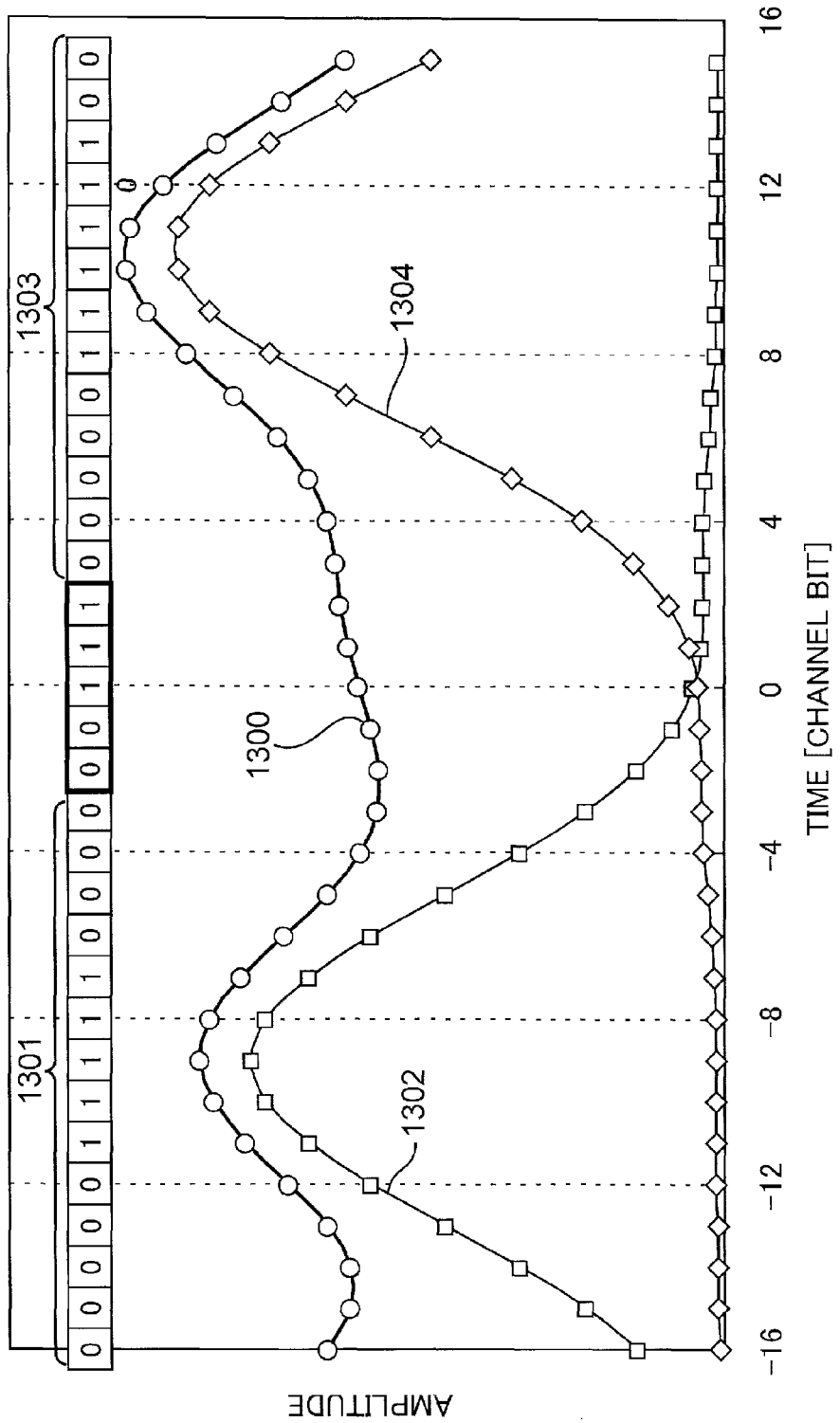
FIG. 9 is a diagram for describing processing of the interference filter shown in FIG. 2.

FIG. 9 is a diagram for describing processing by the interference filter 201 shown in FIG. 2. With a path "00111" which transitions from a state of "0011" at time k−1 to a state of "0111" at time k, a value of a path memory bit sequence 1301 is stored in the path memory 204 from a result of pass selection up to time k−1. The interference filter 201 calculates an interference digital signal 1302 from the path memory bit sequence 1301 that is stored in the path memory 204. As described earlier, the interference digital signal 1302 may be calculated by multiplying a frequency spectrum that is a Fourier transform of a bit sequence by the frequency characteristics of the reproduction processing system or by performing a convolution computation of a reproduced signal of a 1 channel bit recording mark and a bit sequence.

In a similar manner, the interference filter 201 calculates an interference digital signal 1304 from a predicted bit sequence subsequent to time k+5. The interference filter 201 extracts a digital signal from which signal components of the path memory bit sequence 1301 and the predicted bit sequence 1303 have been canceled by subtracting the interference digital signal 1302 and the interference digital signal 1304 from the digital signal 1300 and further multiplying the subtracted value by a window function.

Figure 10:
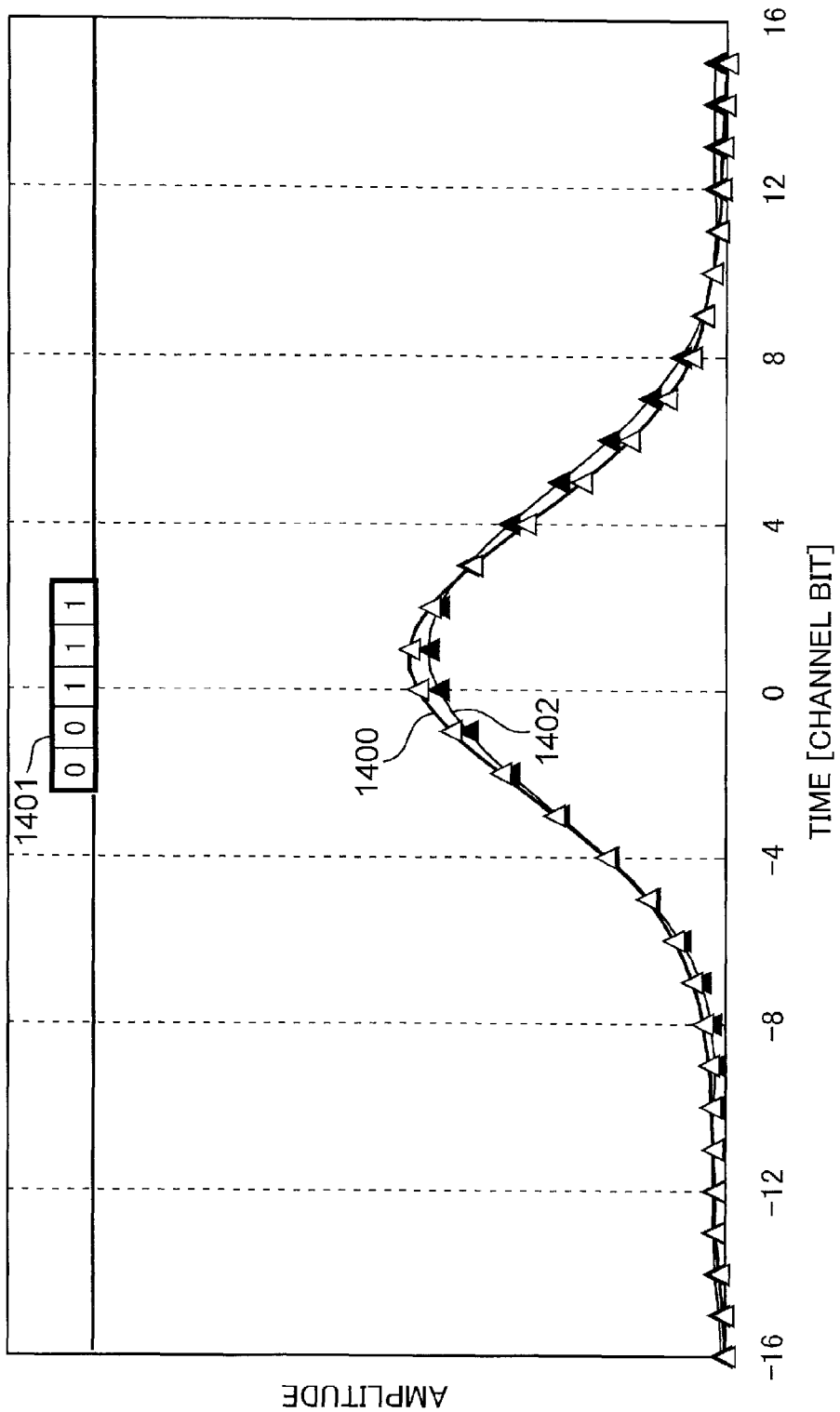
FIG. 10 is a diagram for describing processing of a branch metric circuit shown in FIG. 2.

FIG. 10 is a diagram for describing processing by the branch metric circuit 202 shown in FIG. 2. A digital signal 1400 extracted by the interference filter 201 is inputted to the branch metric circuit 202. A bit sequence 1401 is a bit sequence which corresponds to the path "00111" at time k. The branch metric circuit 202 calculates an expectation signal 1402 corresponding to the bit sequence 1401 in a similar manner to the calculation of the interference digital signals described earlier. The branch metric circuit 202 calculates a summation of squares of differences between an amplitude of the digital signal 1400 extracted for each time and an amplitude of the expectation signal 1402 as a branch metric value. A branch metric value with respect to a correct bit sequence has a minimum value.

There are a plurality of candidates of the predicted bit sequence 1303, and the interference digital signal 1304 is calculated for each candidate. Subsequently, a branch metric value is calculated from the interference digital signal 1304 and a bit sequence with a minimum branch metric value is selected as the predicted bit sequence 1303.

An interference digital signal that is most likely with respect to a state S at time k is generated by a bit sequence corresponding to a path that connects to the state S judged up to time k−1 and a predicted bit sequence subsequent to the selected time k+5. An interference digital signal is separately generated for each of the 10 states of the trellis diagram shown in FIG. 39. The branch metric circuit 202 calculates a branch metric value of each state from the digital signal from which the interference digital signal has been canceled. In this manner, by canceling an interference component due to bit sequences of intervals preceding and following the present time, a constraint length of a trellis diagram can be determined without being dependent on a width of an intersymbol interference.

According to the above, the number of states of a trellis diagram for Viterbi decoding can be kept to a limited number without degrading an SNR as is the case of a PRML system using a simple PR class, and density of an optical disk can be further increased.

Figure 11:
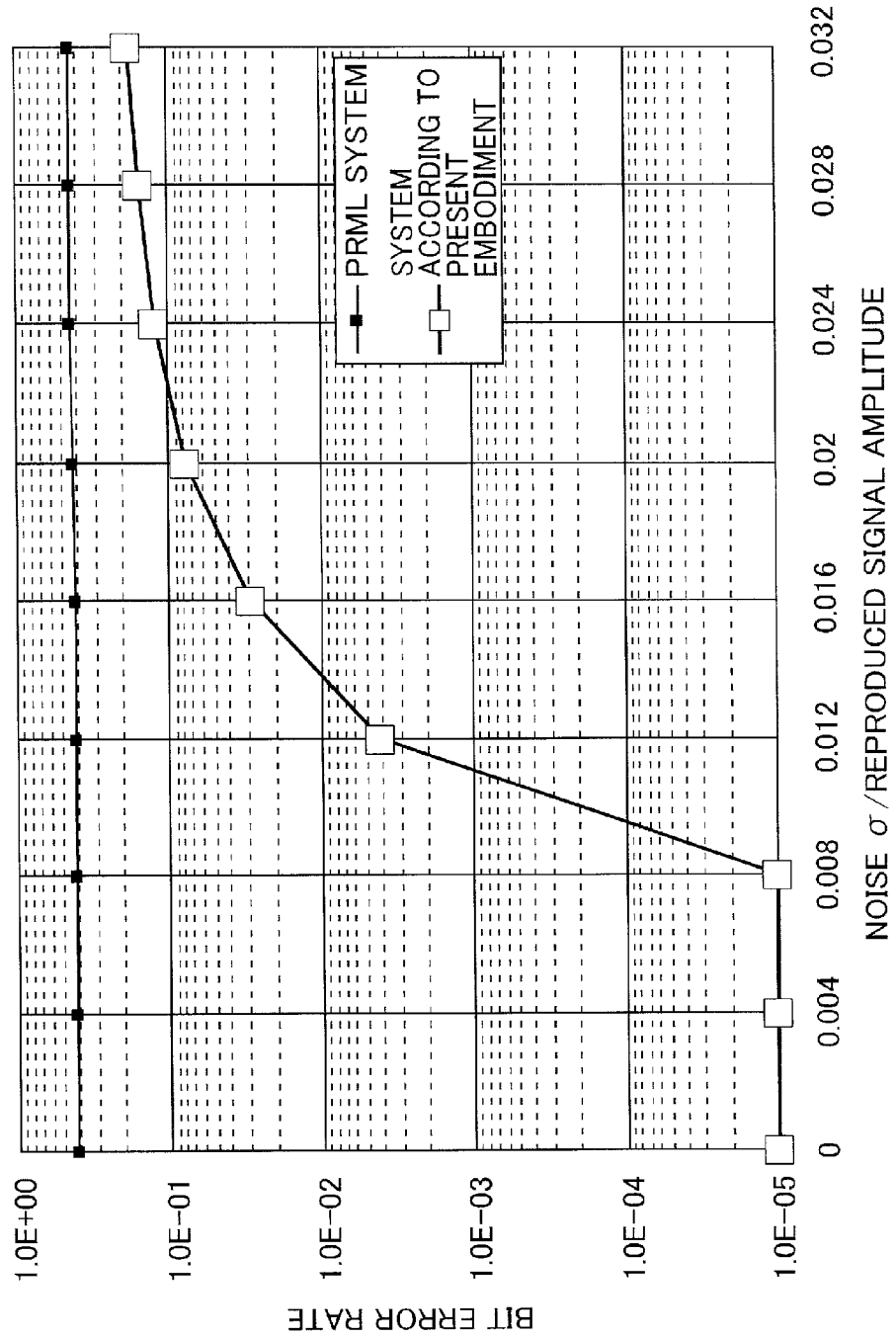
FIG. 11 is a diagram showing a simulation result of bit error rates of a recorded code decoded by a conventional PRML system and a recorded code decoded by a system according to the present first embodiment with respect to a reproduced signal detected from an optical disk whose recording line density is twice of that of a BDXL.

FIG. 11 is a diagram showing a simulation result of bit error rates of a recorded code decoded by a conventional PRML system and a recorded code decoded by a system according to the present first embodiment with respect to a reproduced signal detected from an optical disk whose recording line density is twice of that of a BDXL. In FIG. 11, a bit error rate of a recorded code outputted by the Viterbi decoding circuit 105 with respect to a reproduced signal that is detected from an optical disk whose recording line density has been increased to twice the capacity of a BDXL which has a storage capacity of 33.4 GB per layer is evaluated by simulation.

With a conventional PRML system using a simple PR class that can be realized with a constraint length of 10 or less and with the number of states of a trellis diagram at around 100 or less, even if there is no noise, the bit error rate is $4.0 \times 10^{-1}$. Therefore, with a conventional PRML system, no information can be reproduced. On the other hand, a bit error rate of a system according to the present first embodiment is lower than that of a conventional PRML system and enables information to be reproduced.

A feature of the present first embodiment is that most likely recorded code bit sequences are respectively predicted for the number of states of a trellis diagram used in the Viterbi decoding circuit 105, interference digital signals are generated via a filter created by predicting characteristics of an OTF based on the predicted recorded code bit sequences, and interference digital signals corresponding to the respective states of the trellis diagram are canceled.

Figure 12:
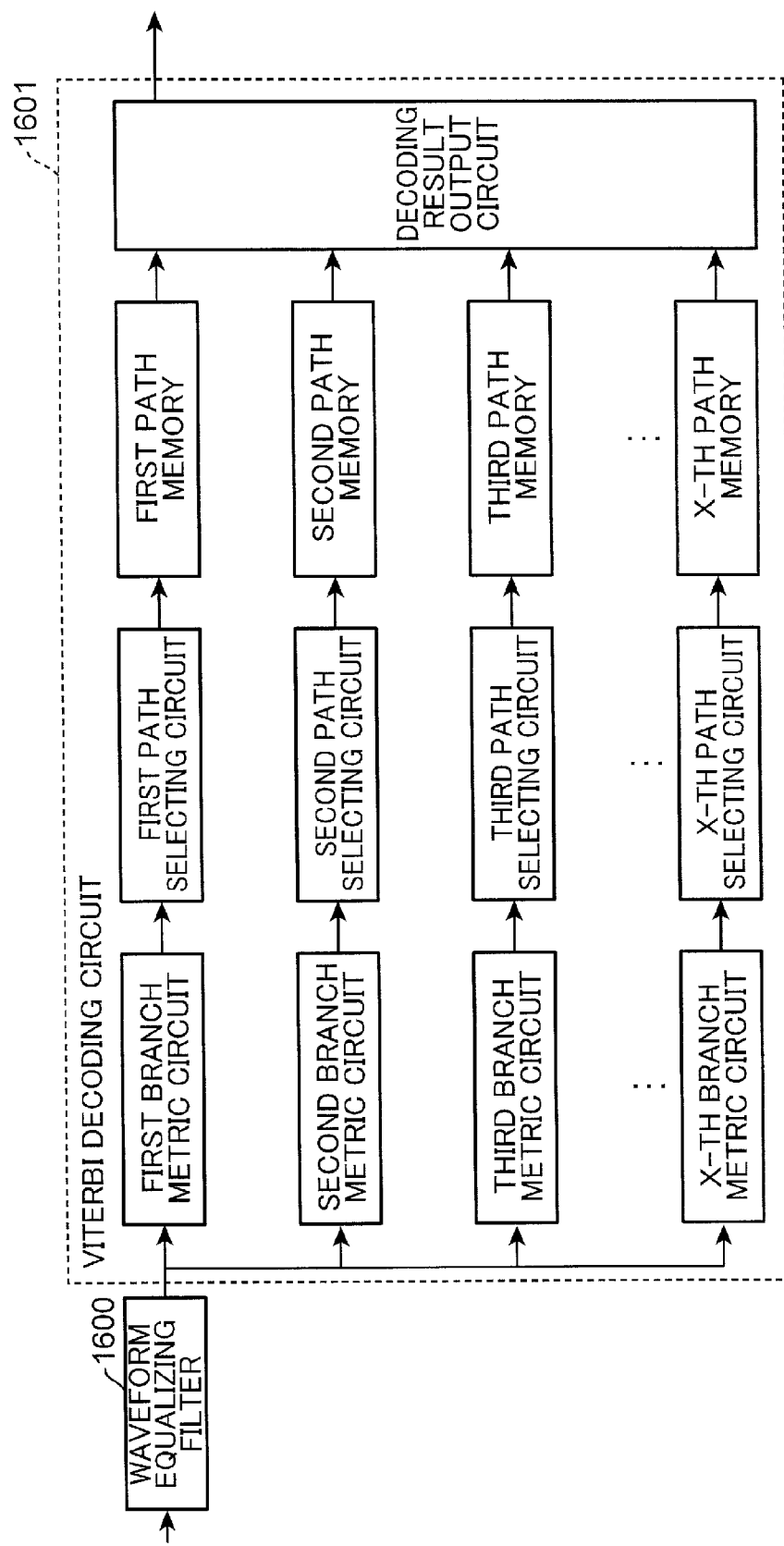
FIG. 12 is a diagram showing a configuration of a Viterbi decoding circuit according to a conventional PRML system.

FIG. 12 is a diagram showing a configuration of a Viterbi decoding circuit according to a conventional PRML system. With a conventional PRML system, a single waveform equalizing filter 1600 performs a waveform equalization process on a reproduced signal so as to conform the reproduced signal to frequency characteristics of a PR class to be applied. In addition, a Viterbi decoding circuit 1601 decodes the signal which has been subjected to the waveform equalization process by the waveform equalizing filter 1600.

In contrast, according to the present first embodiment, a most likely recorded code bit sequence is predicted in accordance with each state of a trellis diagram, and an interference filter which cancels an interference component due to the predicted recorded code bit sequence from a reproduced signal is provided for each state. When reproducing an N-bit recorded code that is recorded on an optical disk, there are $2^N$-number of possible values of a reproduced recorded code bit sequence and a decoding circuit judges the recorded code bit sequence. A decoding circuit using a conventional PRML system performs decoding on the assumption that $2^M$-number of states exist and reduces a range in which an interference occurs down to M bits by canceling an interference signal component of intervals preceding and following a reproduced position using a single waveform equalizing filter having predetermined equalization characteristics.

However, as recording line density increases and optical resolution during reproduction decreases, canceling an interference signal component using a conventional single waveform equalizing filter having predetermined equalization characteristics becomes extremely difficult since high frequency band noise is amplified and SNR declines. On the other hand, increasing the number of states $2^M$ of a trellis diagram is unfeasible because a circuit size of a Viterbi decoding circuit increases exponentially.

The present first embodiment provides interference filters in accordance with the number of states $2^M$ of a trellis diagram while keeping the number of states $2^M$ equally as small as is conventional, expands a range of interference cancellation of the interference filters to K bits, and generates a reproduced signal from which an interference has been canceled in the K bit range for each of the number of states $2^M$ of the trellis diagram. The interference filters predict most likely $2^M$-number of reproduced signals in a recorded code bit sequence that is predicted in accordance with each of the $2^M$-number of states of the trellis diagram from states of $2^K$-number of likely reproduced signals in the K bit range.

The use of the interference filters enables the Viterbi decoding circuit to decode a recorded code while maintaining a most likely state as a recorded code bit sequence within the K bit range in which an interference has occurred. Therefore, extremely high reproduction performance can be realized as shown in FIG. 11. The decoding system according to the present first embodiment is an exceptional decoding system which is capable of decoding a reproduced signal in which an interference has occurred over a wide time range due to a limitation on frequency bands during reproduction without having to increase the number of states $2^M$ and producing a similar effect to a case where the number of states of a trellis diagram used in a Viterbi decoding circuit has been increased to $2^K$.

Second Embodiment

Figure 13:
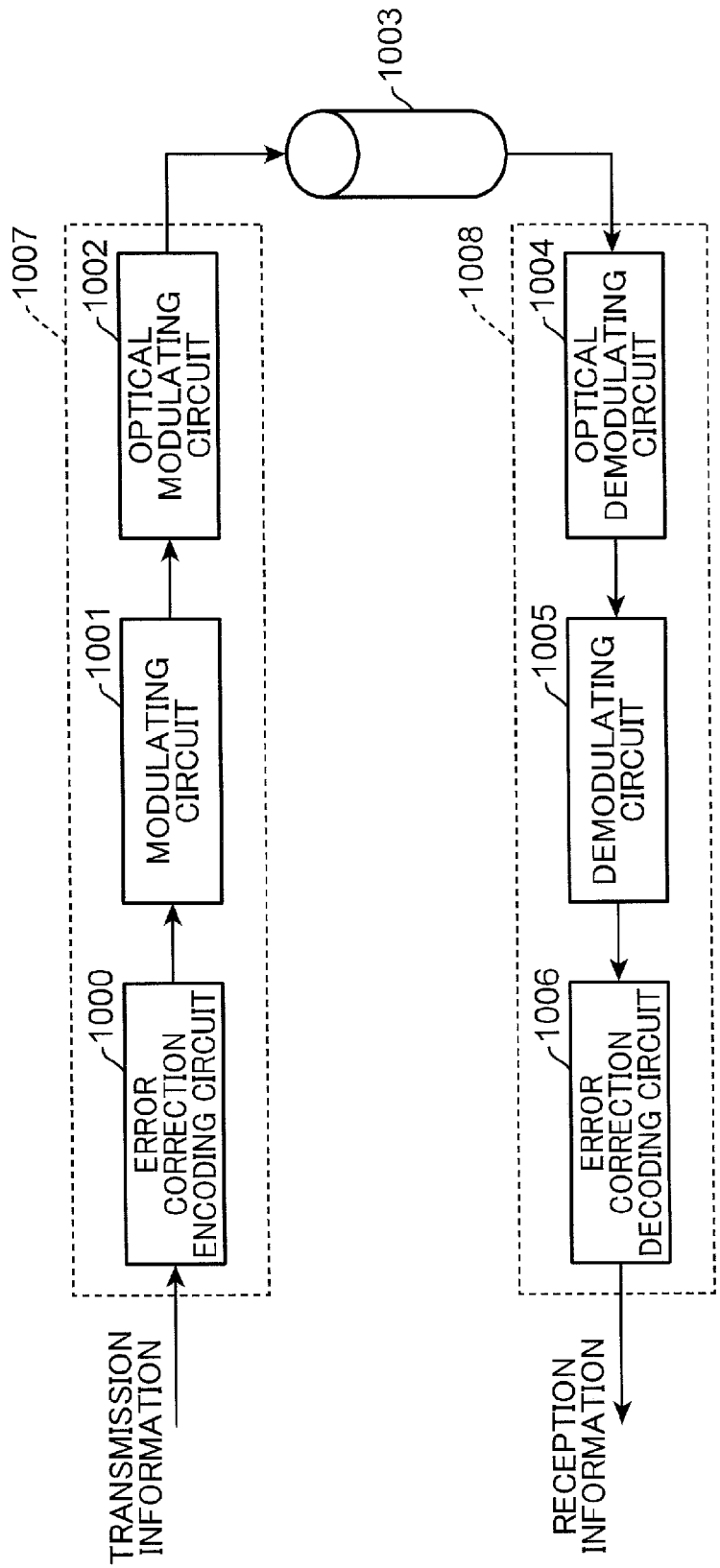
FIG. 13 is a diagram showing a configuration of an optical communication device according to a second embodiment of the present invention.

FIG. 13 is a diagram showing a configuration of an optical communication device according to a second embodiment of the present invention. The optical communication device comprises a transmitter 1007, an optical fiber 1003, and a receiver 1008.

The transmitter 1007 which transmits transmission information comprises an error correction encoding circuit 1000, a modulating circuit 1001, and an optical modulating circuit 1002. The error correction encoding circuit 1000 performs error correction encoding on transmission information to be transmitted. The modulating circuit 1001 digitally modulates the transmission information subjected to error correction encoding using a modulation system such as ASK (amplitude shift keying) or PSK (phase shift keying), and outputs the digitally modulated transmission information as a digital code. The optical modulating circuit 1002 generates an optical signal waveform having intensity or a phase of light with a predetermined waveform modulated in accordance with the digital code and sends the optical signal waveform to the optical fiber 1003.

The optical fiber 1003 transmits the optical signal waveform transmitted from the transmitter 1007 to the receiver 1008. The receiver 1008 comprises an optical demodulating circuit 1004, a demodulating circuit 1005, and an error correction decoding circuit 1006. The optical demodulating circuit 1004 detects the intensity or the phase of light transmitted by the optical fiber 1003 to convert the light into an electric signal and decodes the digital code. The demodulating circuit 1005 demodulates the digital code according to the modulation system such as ASK or PSK which had been used by the modulating circuit 1001. In addition, the error correction decoding circuit 1006 corrects locations of errors created by noise applied during transmission by the optical fiber 1003 and outputs reception information.

Figure 14:
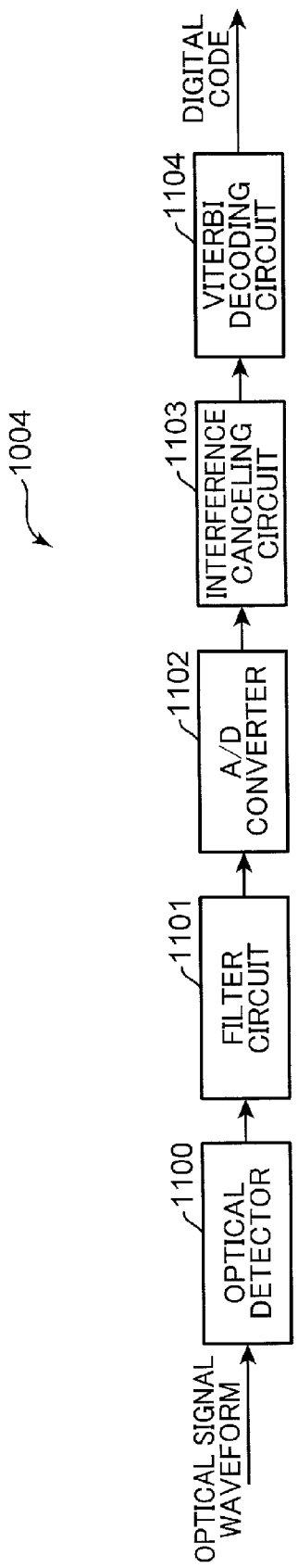
FIG. 14 is a block diagram showing a configuration of an optical demodulator shown in FIG. 13.

Hereinafter, the optical demodulating circuit 1004 of the receiver 1008 will be described in detail. FIG. 14 is a block diagram showing a configuration of the optical demodulating circuit 1004 shown in FIG. 13. The optical demodulating circuit 1004 comprises an optical detector 1100, a filter circuit 1101, an A/D converter 1102, an interference canceling circuit 1103, and a Viterbi decoding circuit 1104.

An optical signal waveform is inputted to the optical detector 1100 that is constituted by a photodetector or the like. The optical detector 1100 photoelectrically converts light transmitted by the optical fiber 1003 and outputs an electric signal. Photoelectric conversion performance has frequency characteristics.

Figure 15:
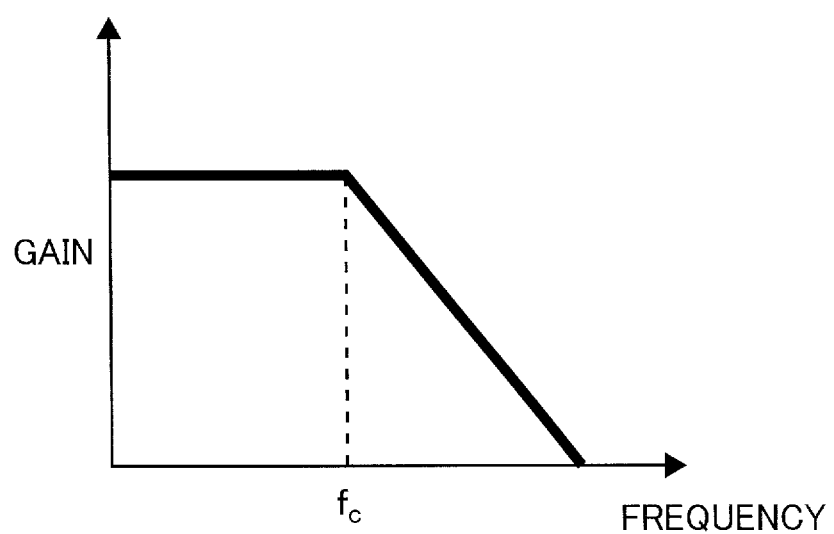
FIG. 15 is a diagram showing frequency characteristics of photoelectric conversion by an optical detector according to the second embodiment of the present invention.

FIG. 15 is a diagram showing frequency characteristics of photoelectric conversion by an optical detector according to the second embodiment of the present invention. As shown in FIG. 15, the frequency characteristics of the photoelectric conversion by the optical detector 1100 is low-pass characteristics. In order to increase communication rate, a channel frequency of a modulation process by the modulating circuit 1001 of the transmitter 1007 is set higher than twice a frequency $f_c$ at which a gain of the frequency characteristics shown in FIG. 15 starts to drop. In this case, in a similar manner to the optical disk device according to the first embodiment described earlier, an intersymbol interference occurs in which a signal transmitted at 1 channel bit width is detected as a waveform that has spread wider than 1 channel bit.

An electric signal in a state where the electric signal includes an intersymbol interference is inputted to the filter circuit 1101. The filter circuit 1101 reduces a low frequency band noise component and a high frequency band noise component within a range which does not adversely affect a component of a frequency band of a modulation code included in the electric signal. The A/D converter 1102 converts an output signal from the filter circuit 1101 into a digital signal which is sampled at a 1 channel bit interval that is a unit of the modulation code. The interference canceling circuit 1103 cancels an intersymbol interference component from a digital signal outputted by the A/D converter 1102 in order to keep the number of states of a trellis diagram in the Viterbi decoding circuit 1104 down to a predetermined number. The Viterbi decoding circuit 1104 decodes the digital signal from which the intersymbol interference has been canceled to the transmitted digital signal.

Configurations and operations of the interference canceling circuit 1103 and the Viterbi decoding circuit 1104 are similar to the configurations and operations of the interference canceling circuit 104 and the Viterbi decoding circuit 105 in the optical disk device according to the first embodiment described earlier. Detailed configurations of the interference canceling circuit 1103 and the Viterbi decoding circuit 1104 are the same as those of the interference canceling circuit 104 and the Viterbi decoding circuit 105 shown in FIG. 2, and operations of an interference filter in the interference canceling circuit 1103 are the same as operations of the interference filter in the interference canceling circuit 104 shown in FIG. 3.

Moreover, in the present second embodiment, the optical communication device corresponds to an example of the decoding device, the optical fiber 1003 corresponds to an example of the medium, the interference canceling circuit 1103 corresponds to an example of the interference canceling unit, and the Viterbi decoding circuit 1104 corresponds to an example of the first decoding unit.

While a processing interval of the interference filter is set to 32 channel bits in the first embodiment as shown in FIG. 3, a width of the processing interval is favorably longer than a spreading width (a width of an intersymbol interference) of an electric signal that is obtained by photoelectric conversion by the optical detector 1100 with respect to a transmitted optical signal waveform of 1 channel bit. When the width of the processing interval is shorter than the width of an intersymbol interference, an influence of a signal component of a bit sequence of an interval other than that from time k to time k+4 remains in the digital signal from which the interference digital signal has been subtracted and is retained as an error in a branch metric value. An increase in the error of the branch metric value results in a degradation in decoding performance. Therefore, by setting the width of the processing interval longer than the width of an intersymbol interference that is determined by frequency characteristics of the photoelectric conversion shown in FIG. 15, a signal component of a bit sequence of an interval other than that from time k to time k+4 does not remain and a digital code can be outputted by performing decoding under optimum conditions.

Accordingly, the influence of an intersymbol interference due to frequency characteristics of the photoelectric conversion by the optical detector 1100 can be canceled and transmission information can be decoded in a simple manner and without degrading performance, and communication rate can be increased by raising a channel frequency of the modulating circuit 1001.

Alternatively, components of the optical disk device according to the first embodiment or the optical communication device according to the second embodiment can be realized by an LSI (Large Scale Integration) that is an example of an integrated circuit. Components of the optical disk device and the optical communication device may be individually configured as single chips. In addition, a part of or all of the components may constitute a single chip.

Moreover, while an LSI has been cited as an example of an integrated circuit, the optical disk device and the optical communication device may be realized by an IC (Integrated Circuit), a super LSI, or an ultra LSI depending on degrees of integration.

In addition, the integrated circuits in the present first and second embodiments are not limited to LSIs and may be realized using a dedicated circuit or a general-purpose processor. Furthermore, an FPGA (Field Programmable Gate Array) that can be programmed after LSI production or a reconfigurable processor that allows reconfiguration of connections and settings of circuit cells inside an LSI after LSI production may also be used.

Moreover, if techniques for realizing integrated circuits which replace LSIs should emerge due to progress made in semiconductor technology or due to derivative technology, it is obvious that the function blocks may be integrated using such techniques. Examples of integration technology which may possibly replace LSIs include an adaptation of biotechnology.

Third Embodiment

First, before describing a decoding device and a decoding method according to a third embodiment of the present invention, problems found in conventional art will be described.

In recent years, due to higher density of optical disks, a shortest mark length that is a length of a shortest recording mark is approaching a limit of optical resolution and an increase in intersymbol interferences and degradation of SNRs (Signal Noise Rates) are becoming more noticeable. In consideration thereof, a PRML (Partial Response Maximum Likelihood) system is generally used as a signal processing method.

The PRML system is a technique that combines a partial response (PR) with maximum likelihood decoding (ML) and is a system which selects a most likely signal sequence from a reproduced waveform on the premise that a known intersymbol interference is to occur. Therefore, the PRML system is known for improved decoding performance as compared to conventional level judgment systems.

A signal reproduced from an optical disk is first subjected to partial response equalization using a waveform equalizer, a digital filter, and the like so as to have predetermined frequency characteristics and is subsequently decoded to a corresponding original modulated signal by selecting a most likely state transition sequence from a trellis diagram using Viterbi decoding or the like. Generally, an Euclidean distance is used as a value which represents a likelihood of a state transition to a state Sn (where n denotes the number of states) until time k.

Figure 16:
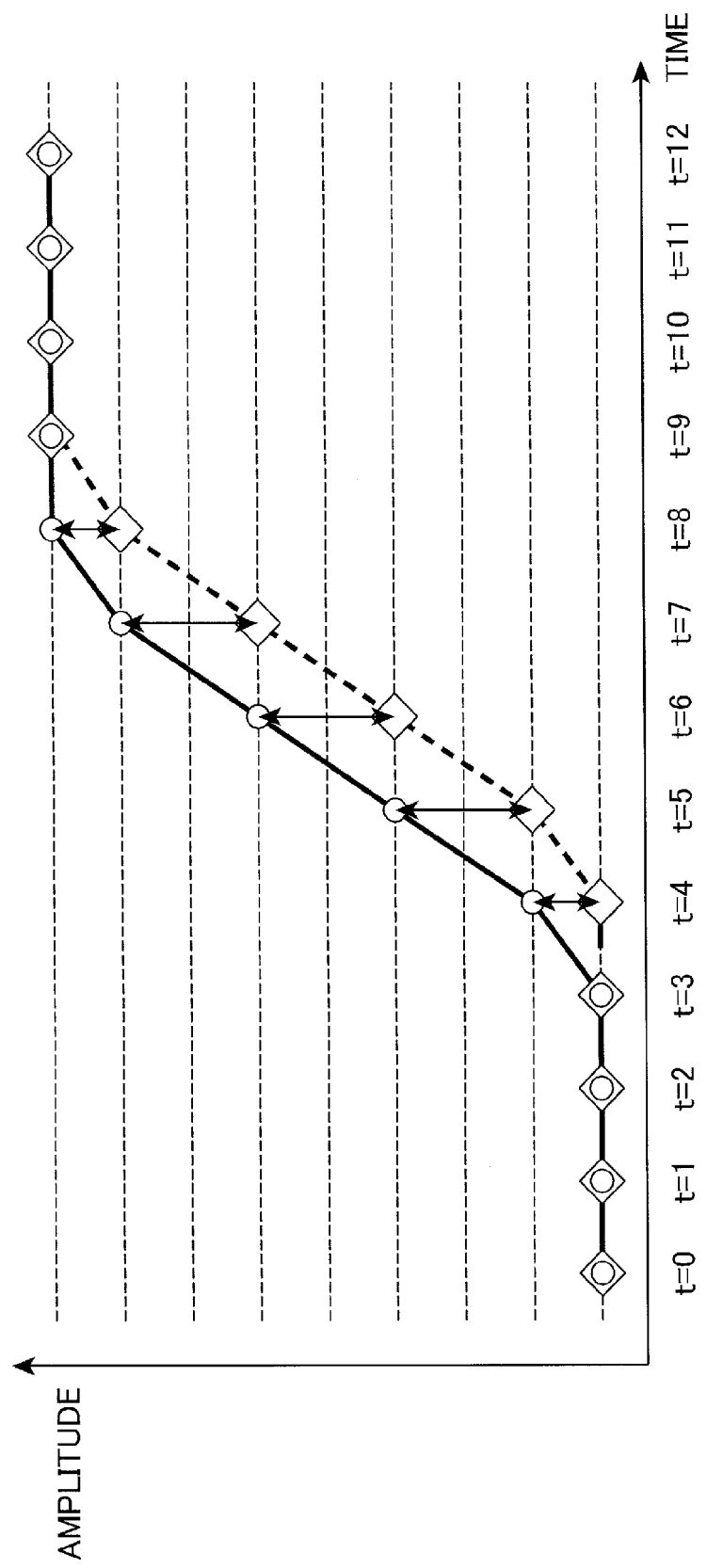
FIG. 16 is a diagram showing how an Euclidean distance is obtained.

FIG. 16 is a diagram showing how an Euclidean distance is obtained. For example, a difference between an actual reproduced signal that is depicted by a solid line and an ideal reproduced signal that is depicted by a dashed line is created between time t=4 and time t=8. By integrating a square of a difference between an actual reproduced signal and an ideal reproduced signal, an Euclidean distance between the two waveforms is obtained. For example, in Viterbi decoding, for each state Sn at each time, a state transition sequence with a smaller Euclidean distance between two state transition sequences that lead to the state Sn is selected and decoded into a modulated signal that corresponds to the state transition sequence. A difference in Euclidean distances is used as a value that represents a likelihood of selection of the two state transition sequences. A difference L in Euclidean distances is defined by Equation (2) below.

$$L = \left| \sum_{i=0}^{k} (y_i - A_i)^2 - \sum_{i=0}^{k} (y_i - B_i)^2 \right| \quad (2)$$

In Equation (2) above, $y_i$ denotes a value of a reproduced signal at time i and $A_i$ and $B_i$ denote values of ideal reproduced signals corresponding to the two expected state transition sequences. The greater the difference L in Euclidean distances, the higher the likelihood of selection of a state transition sequence, and the smaller the difference L in Euclidean distances, the lower the likelihood of selection of a state transition sequence. When the difference L in Euclidean distances is small, the possibility of selecting an incorrect state transition sequence due to the effect of noise increases.

As the density of optical disks become higher, intersymbol interferences and SNR degradation become more problematic. Reproduction performance can be maintained by adopting a high-order PRML system as the PRML system. For example, when a 12 cm-diameter optical disk has a storage capacity of 25 GB per recording layer, favorable reproduction performance can be maintained by adopting a PR (1, 2, 2, 1) ML system. Meanwhile, when the storage capacity per layer is 33.3 GB, a PR (1, 2, 2, 2, 1) ML system must be adopted. In actuality, BDXLs which have a storage capacity of 33.4 GB per layer are already in practical use. BDXLs adopt the PR (1, 2, 2, 2, 1) ML system (for example, refer to Non Patent Literature 1).

Figure 17:
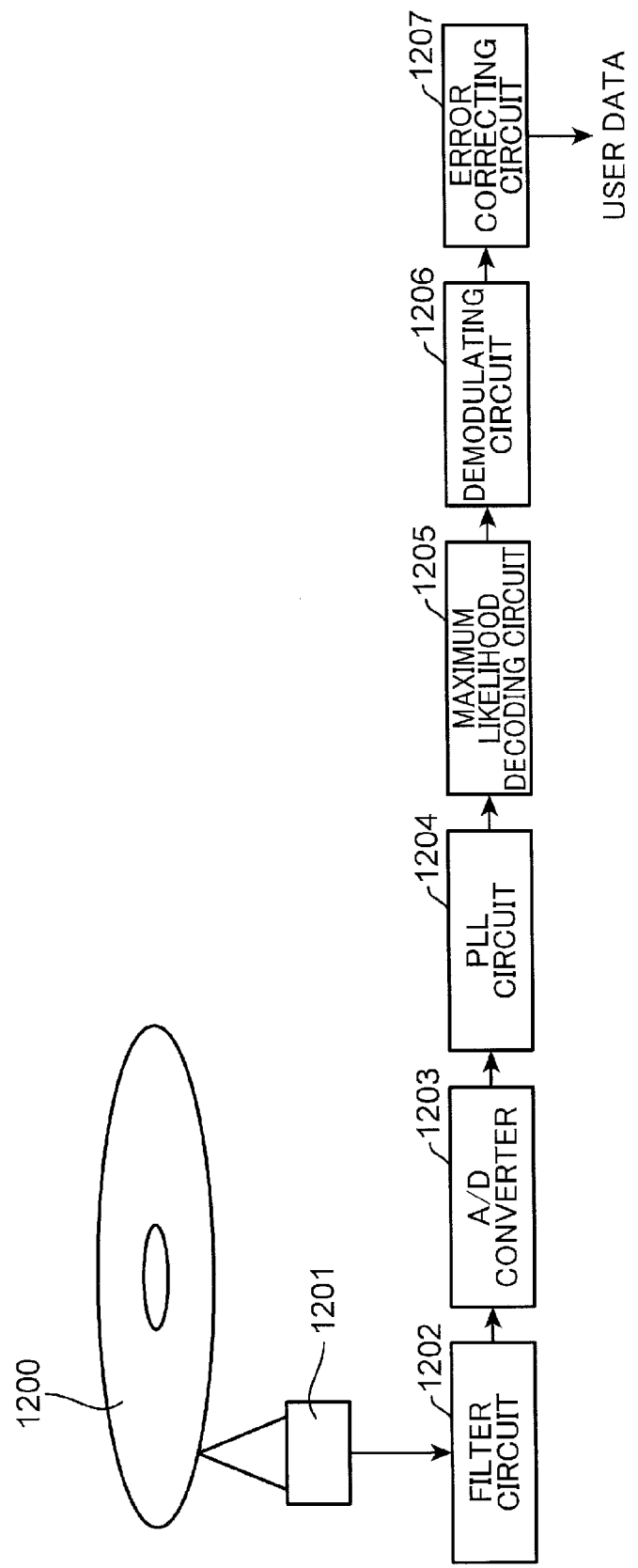
FIG. 17 is a diagram showing a configuration of a conventional optical disk device.

FIG. 17 is a diagram showing a configuration of a conventional optical disk device. FIG. 17 shows a configuration of a portion related to a processing system which reproduces user data recorded on an optical disk 1200. The optical disk device shown in FIG. 17 comprises an optical pickup 1201, a filter circuit 1202, an A/D converter 1203, a PLL (Phase Locked Loop) circuit 1204, a maximum likelihood decoding circuit 1205, a demodulating circuit 1206, and an error correcting circuit 1207.

A recording mark is formed on a track on the optical disk 1200 in accordance with a modulated signal obtained by performing predetermined error correction encoding and predetermined modulation encoding on user data. Reproduction of recorded user data is performed by utilizing the fact that the amount of reflected light with respect to laser light irradiated from the optical pickup 1201 on a track varies in accordance with a recording mark that is formed on the track.

The optical pickup 1201 detects a reproduced signal in accordance with an amount of reflected light. The filter circuit 1202 reduces a low frequency band noise component and a high frequency band noise component within a range which does not adversely affect a component of a frequency band of a modulation code included in the reproduced signal detected by the optical pickup 1201. An output signal of the filter circuit 1202 is converted by the A/D converter 1203 and the PLL circuit 1204 into a digital signal sampled at a 1 channel bit interval that is a unit of the modulation code. In accordance with the PRML system described earlier, the maximum likelihood decoding circuit 1205 decodes the digital signal into the modulated signal that is recorded on the track.

The demodulating circuit 1206 demodulates the modulated signal decoded by the maximum likelihood decoding circuit 1205 into a bit sequence prior to the modulation encoding in accordance with the modulation system. The error correcting circuit 1207 corrects an error included on the bit sequence demodulated by the demodulating circuit 1206 in accordance with the error correction encoding system and outputs user data. With BDs and BDXLs, an RLL (1, 7)

modulation encoding system is used as the modulation system and a Reed-Solomon encoding system is used as the error correction encoding system. Accordingly, performance for reproducing user data without error is secured by correcting a decoding error of a modulated signal which occurs due to a scratch on a recording surface of an optical disk or a stain on the recording surface of an optical disk, or due to a decline in SNR caused by increased density (for example, refer to Non Patent Literature 1).

In addition, the development of high-speed optical communication is being promoted in order to accommodate an explosion of information traffic in recent years. With the increase in information traffic, there is an apparent upward trend in inputted optical power and a physical limit of optical fibers where non-linear optical effects and thermal destruction occur is quickly approaching. In order to improve the communication efficiency of optical communication, there is a primary focus on improving the performance of transmitters and optical fibers which constitute transmission paths such as an optical wavelength multiplexing modulation system which uses light with a plurality of wavelengths and a dispersion-compensating fiber or an optical amplifier which compensate for distortion of an optical signal waveform due to dispersion caused by propagation characteristics of optical fibers.

With a PRML system used in optical disks as described above, a reproduced signal is equalized to frequency characteristics of a target PR class, and maximum likelihood decoding by a Viterbi algorithm or the like is performed on the PR-equalized reproduced signal according to a trellis diagram constructed based on the same PR class. For example, in the case of a BDXL with a storage capacity of 33.4 GB per layer, a PR (1, 2, 2, 2, 1) class is used.

Figure 18:
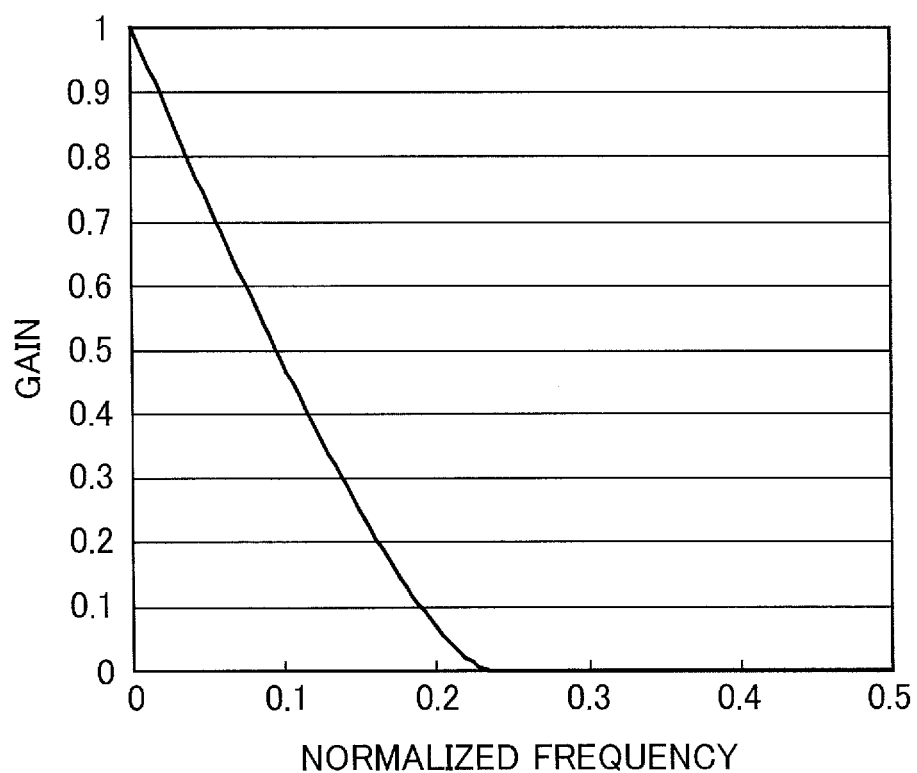
FIG. 18 is a diagram showing frequency characteristics of an OTF of a BDXL.
Figure 19:
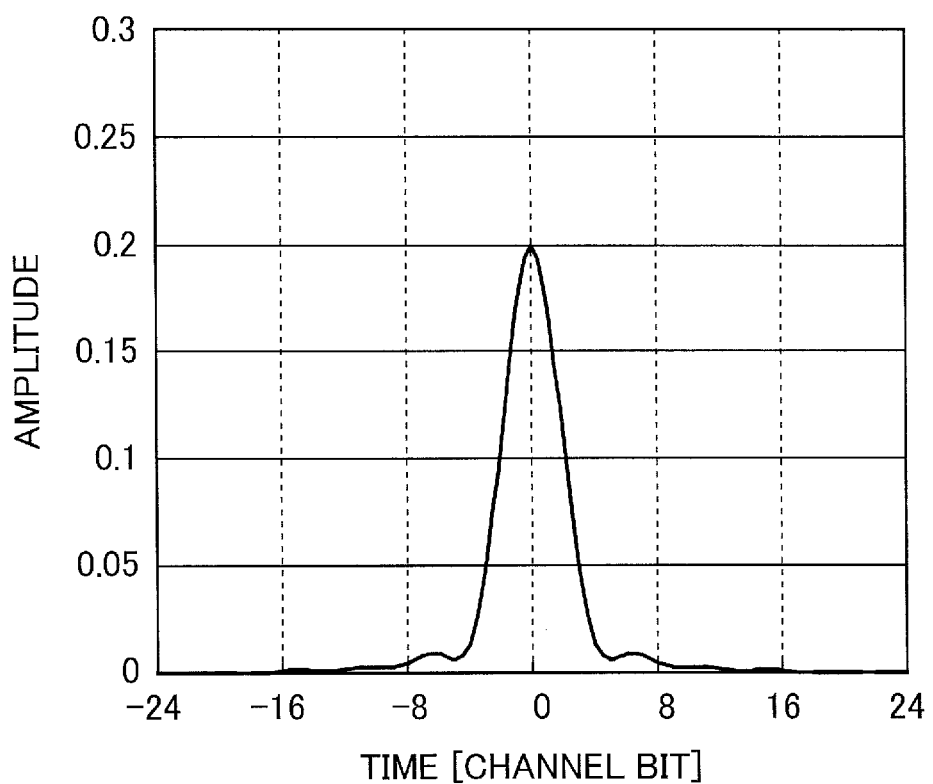
FIG. 19 is a diagram showing a reproduced signal that is obtained when reproducing a 1 channel bit recording mark according to the frequency characteristics shown in FIG. 18.

FIG. 18 is a diagram showing frequency characteristics of an optical transfer function (OTF) of a BDXL, and FIG. 19 is a diagram showing a reproduced signal that is obtained when reproducing a 1 channel bit recording mark according to the frequency characteristics shown in FIG. 18. High frequency noise is prevented from being greatly amplified by setting a target of equalization of a reproduced signal to a PR (1, 2, 2, 2, 1) class that is close to the frequency characteristics of the OTF. In this case, a reproduced signal corresponding to a recording mark of 1 channel bit is PR-equalized to a signal waveform of 5 channel bit width having an amplitude of (1, 2, 2, 2, 1). This is a state where an intersymbol interference of 5 channel bit width is created.

A shortest mark/space length when an RLL (1, 7) modulation encoding system is used as the modulation system as in the case of BDs is 2 channel bits and a shortest mark/space length when an RLL (2, 10) modulation encoding system is used as in the case of DVDs is 3 channel bits. In the case of a PR (1, 2, 2, 2, 1) class, since the width of an intersymbol interference is 5 channel bit width as described earlier, an intersymbol interference does not occur at a preceding location that is separated from a channel bit at a center position by 3 channel bits or more or a subsequent location that is separated from the channel bit at a center position by 3 channel bits or more. Accordingly, it is shown that patterns of intersymbol interferences which must be considered are limited to a small number.

Figure 20:
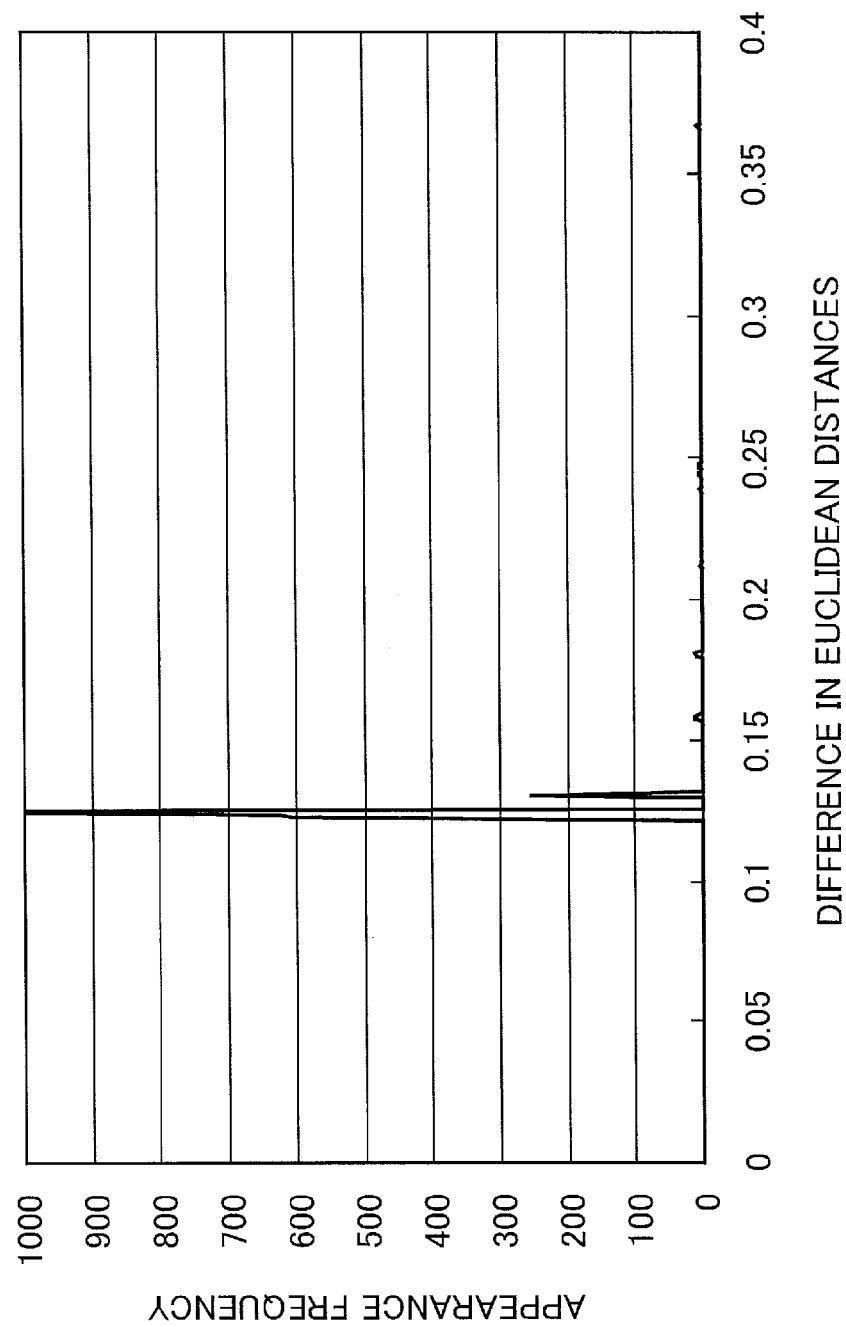
FIG. 20 is a diagram showing an appearance frequency of differences in Euclidean distances for judging a state transition sequence that is generated when performing maximum likelihood decoding on a reproduced signal.

FIG. 20 is a diagram showing an appearance frequency of a difference in Euclidean distances for judging a state transition sequence that is created when performing maximum likelihood decoding on a reproduced signal in a case where light used by an optical pickup has a wavelength of 405 nm, an objective lens used by the optical pickup has a numerical aperture (NA) of 0.85, the modulation system is an RLL (2, 10) modulation encoding system, and 1 channel bit has a length of 55.8 nm. A judgment of a state transition sequence with a difference in Euclidean distances of 0.12 which occurs with high frequency is performed by comparing patterns with a 1 channel bit difference in which a boundary between a mark and a space only differs by 1 channel bit. The difference in Euclidean distances of 0.12 which is created by the 1 channel bit difference is equal to a square integral value (hereinafter, referred to as 1 channel bit energy) of a waveform (FIG. 19) of a 1 channel bit reproduced signal at the same line density condition, and it can be said that maximum likelihood decoding is performed by effectively utilizing an SNR.

Figure 21:
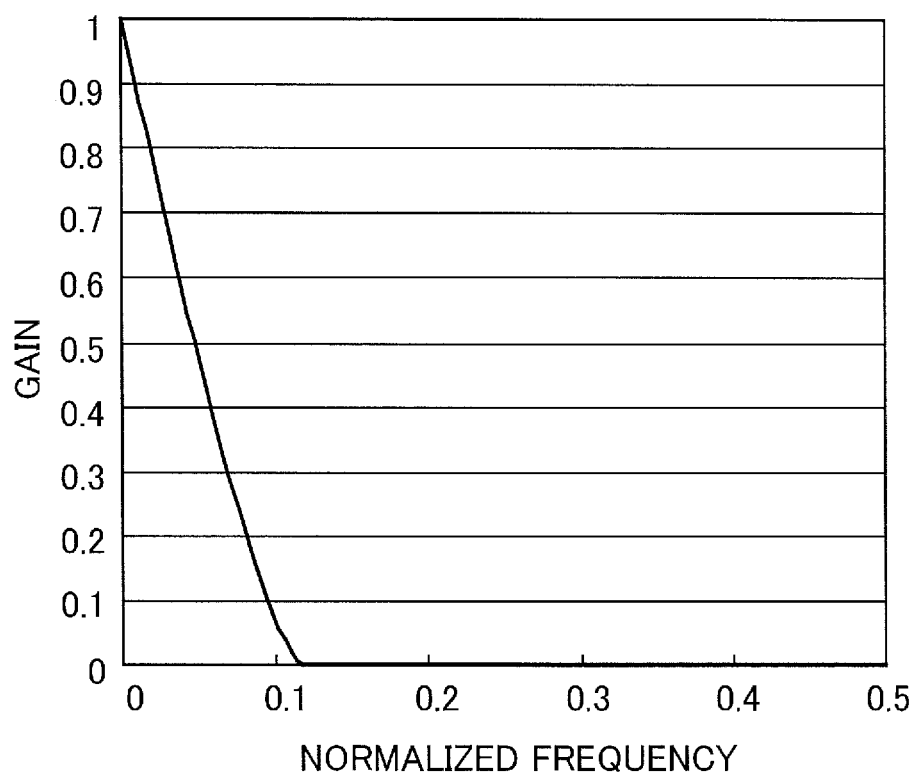
FIG. 21 is a diagram showing frequency characteristics of an OTF when line density is increased until a length of 1 channel bit equals 28 nm.
Figure 22:
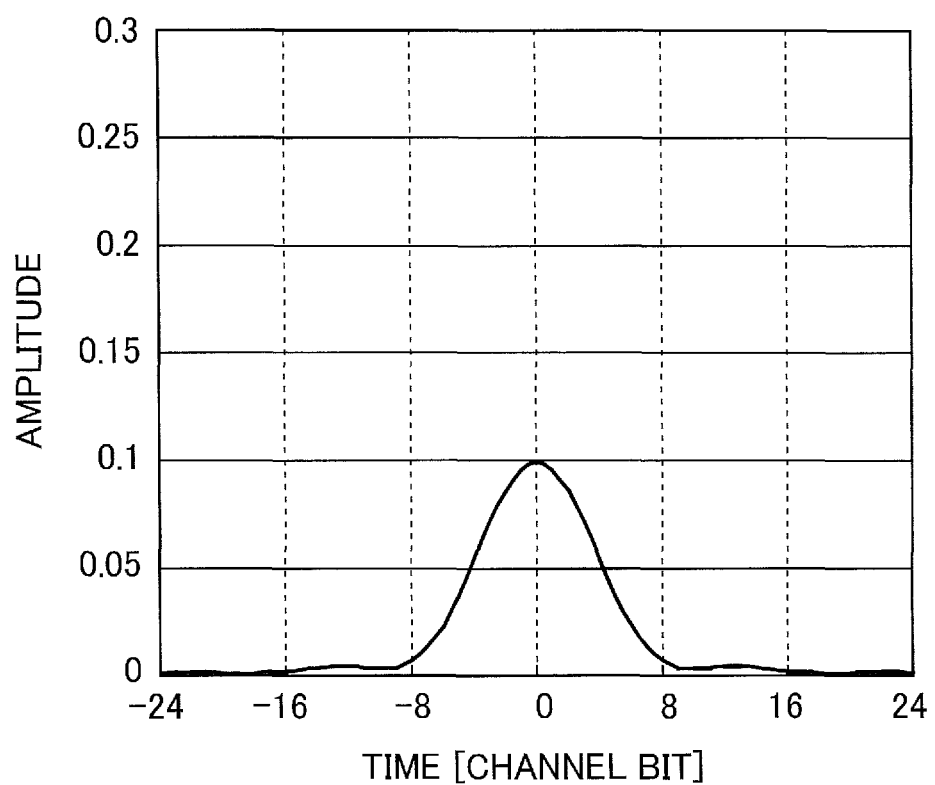
FIG. 22 is a diagram showing a reproduced signal that is obtained when reproducing a 1 channel bit recording mark according to the frequency characteristics shown in FIG. 21.

FIG. 21 is a diagram showing frequency characteristics of an OTF when line density is increased until 1 channel bit has a length of 28 nm, and FIG. 22 is a diagram showing a reproduced signal that is obtained when reproducing a 1 channel bit recording mark according to the frequency characteristics shown in FIG. 21. When the state shown in FIG. 21 remains the same, a waveform of a 1 channel bit reproduced signal spreads to around 32 channel bits including preceding and subsequent channel bits as shown in FIG. 22 and an intersymbol interference occurs over an extremely wide range. For example, a reproduced signal may be equalized to frequency characteristics of a PR (1, 2, 3, 4, 5, 6, 6, 6, 5, 4, 3, 2, 1) class in conformance with an OTF as is conventional. However, even in this case, an intersymbol interference of 13 channel bit width still remains. When an intersymbol interference occurs across such a large width, bit patterns of modulated signals which may exist in the width affected by the intersymbol interference increase exponentially.

Figure 23:
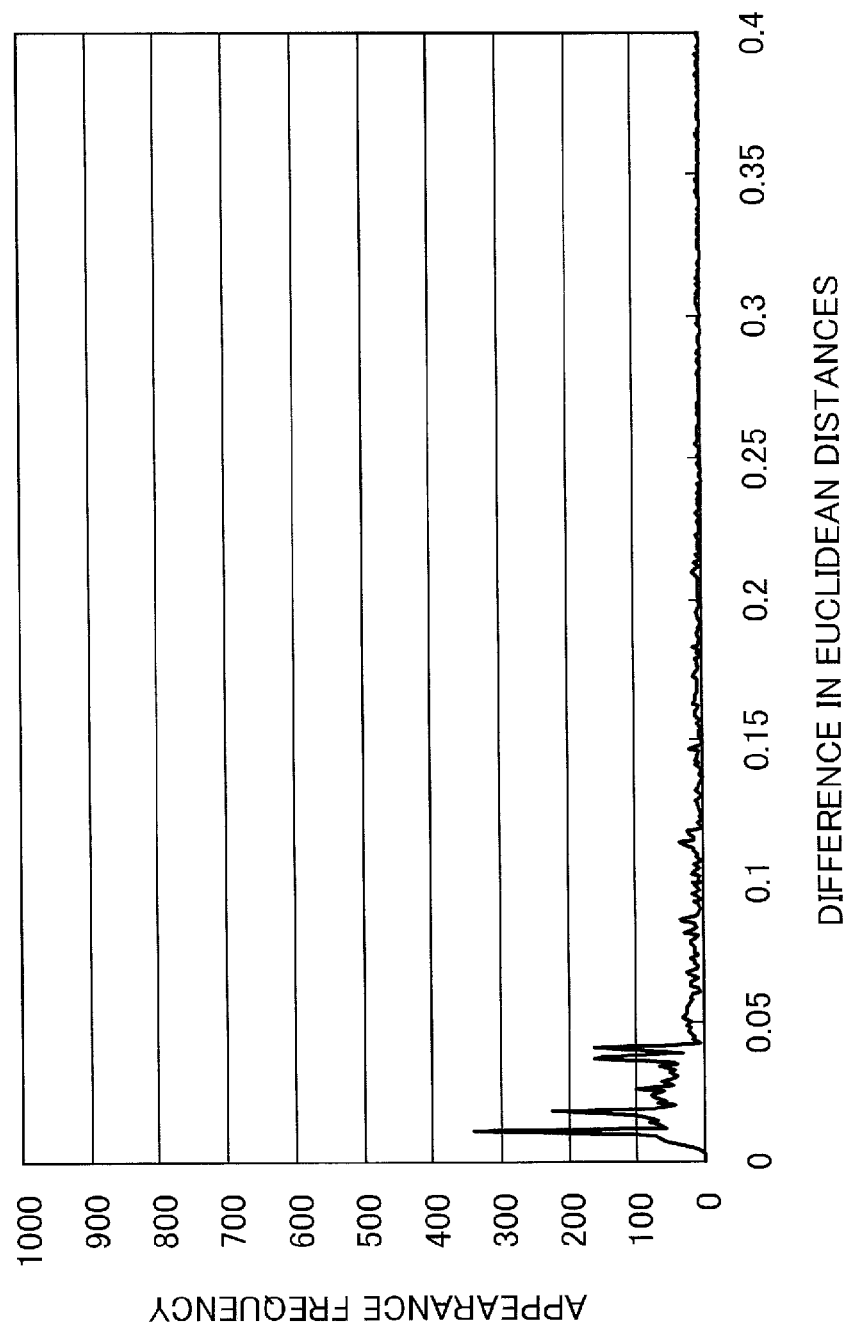
FIG. 23 is a diagram showing an appearance frequency of differences in Euclidean distances for judging a state transition sequence that is generated during maximum likelihood decoding when a length of 1 channel bit is 28 nm.

FIG. 23 is a diagram showing an appearance frequency of differences in Euclidean distances for judging a state transition sequence that is generated during maximum likelihood decoding when a length of 1 channel bit is 28 nm. 1 channel bit energy under line density conditions where the length of 1 channel bit is 28 nm has a value of 0.04. FIG. 23 shows that 1 channel bit energy that is smaller than the 1 channel bit energy under line density conditions where the length of 1 channel bit is 55.8 nm which has been described earlier has been created in extremely large amounts. These are patterns which include a mark/space with a length of 5 channel bits or less with a frequency that is higher than a cutoff frequency shown in FIG. 21 where a gain of the OTF drops to zero and, for example, include a pattern in which a 3 channel bit mark has moved forward or backward by precisely 1 channel bit to create a difference of 2 channel bits.

As shown, with conventional maximum likelihood decoding based on a difference in Euclidean distances, when line density is increased and an intersymbol interference expands, channel bit widths to be simultaneously processed increase. As a result, differences in Euclidean distances for which a plurality of channel bit differences exist in a judged state transition sequence must be compared with one another. Since a plurality of channel bit differences are affected by the frequency characteristics of the OTF, differences in Euclidean distances become extremely small. In other words, regardless of a large Hamming distance between original modulated signals, a difference in Euclidean distances of reproduced signals obtained via a transmission path with a limited frequency band becomes extremely small.

However, since noise included in reflected light or noise on a circuit is similarly applied regardless of recording line density, judgment of a state transition sequence with a small difference in Euclidean distances becomes extremely prone to errors due to the influence of noise. As a result, since the Hamming distance of binary-decoded modulated signals is large, the number of error bits is extremely large. As described above, while 1 channel bit energy is 0.04, there is a problem that an SNR cannot be effectively utilized due to band-limited frequency characteristics and increasing line density becomes extremely difficult.

Figure 24:
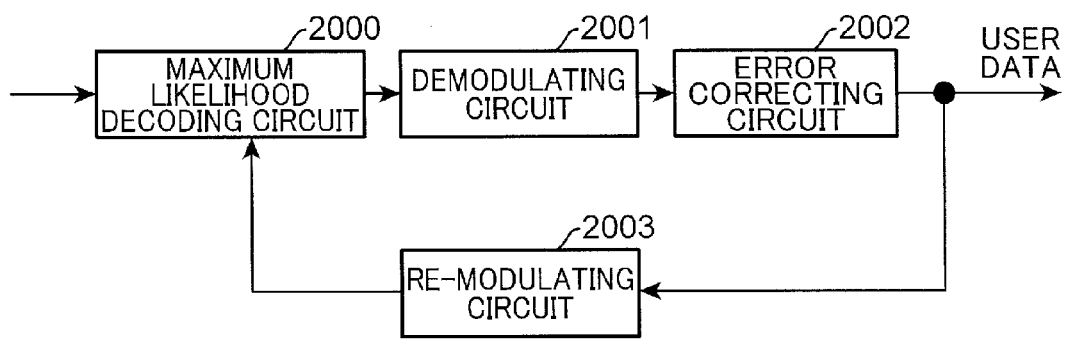
FIG. 24 is a diagram showing a configuration of another conventional optical disk device.

In addition, as a method of improving decoding performance with respect to a gap or a distortion of a reproduced signal, as shown in FIG. 24, a configuration is proposed in which a re-modulated signal that is obtained by re-modulating an error correction result is provided as feedback (for example, refer to Non Patent Literature 2 and Patent Literature 2). FIG. 24 is a diagram showing a configuration of another conventional optical disk device.

A maximum likelihood decoding circuit 2000 decodes a digital signal into a modulated signal recorded on a track. A demodulating circuit 2001 demodulates the decoded modulated signal into a bit sequence prior to the modulation encoding. An error correcting circuit 2002 corrects an error included on the bit sequence demodulated in accordance with the error correction encoding system and outputs user data. A re-modulating circuit 2003 outputs a re-modulated signal that is obtained by re-modulating a result of error correction. For a second reproduction process, the maximum likelihood decoding circuit 2000 re-decodes the digital signal into a modulated signal while correcting a reproduced signal at a location where a decoding error had occurred in a first reproduction process using a re-modulated signal. Operations of the demodulating circuit 2001 and subsequent components in the second reproduction process are similar to those performed in the first reproduction process.

However, according to a conventional system, since the maximum likelihood decoding circuit 2000 simply repeats reproduction processes under the same conditions as the first reproduction process, the fact that a judgment of decoding is being performed with a small difference in Euclidean distances remains unchanged. Therefore, the fact that the difference in Euclidean distances is small remains as a dominant factor in decoding performance and an effect of improving a bit error rate with respect to SNR cannot be produced in a decoding result. With a conventional system, errors can be reduced by correcting a gap or a distortion of a reproduced signal through a plurality of decoding processes. However, since an effect of improving a bit error rate with respect to SNR cannot be produced, a problem in increasing line density in that SNR declines with a limitation of frequency bands cannot be solved.

In addition, in optical communication, efficiency is achieved by the optical wavelength multiplexing modulation system, a dispersion-compensating fiber, or an optical amplifier as described earlier. Alternatively, in order to increase the amount of information that is transferred per wavelength of light, speed of optical modulation can be increased and a wider frequency band can be used to increase communication rate. However, in order to accurately receive an optical signal waveform that is modulated using a wide frequency band, an optical detector of a receiver must also be improved. An optical detector converts a received optical signal waveform into an electric signal. A frequency band that can be efficiently converted by an optical detector is limited.

Therefore, an intersymbol interference occurs during photoelectric conversion by an optical detector in which a signal transmitted at 1 channel bit width is detected as a waveform that has spread beyond the 1 channel bit width. The higher a channel frequency at an optical modulator of a transmitter, the wider the channel bit width of the intersymbol interference. Therefore, in a similar manner to optical disks, there is a problem in conventional optical communication in that when decoding digital information from a reception signal, the difficulty in achieving a balance between decoding performance and simplification of a trellis diagram prevents an improvement in communication rate or prevents a reduction in delay time. In addition, while sensitivity of an optical detector can be increased, this problematically requires an optical detector with a large size and greater power consumption.

Figure 25:
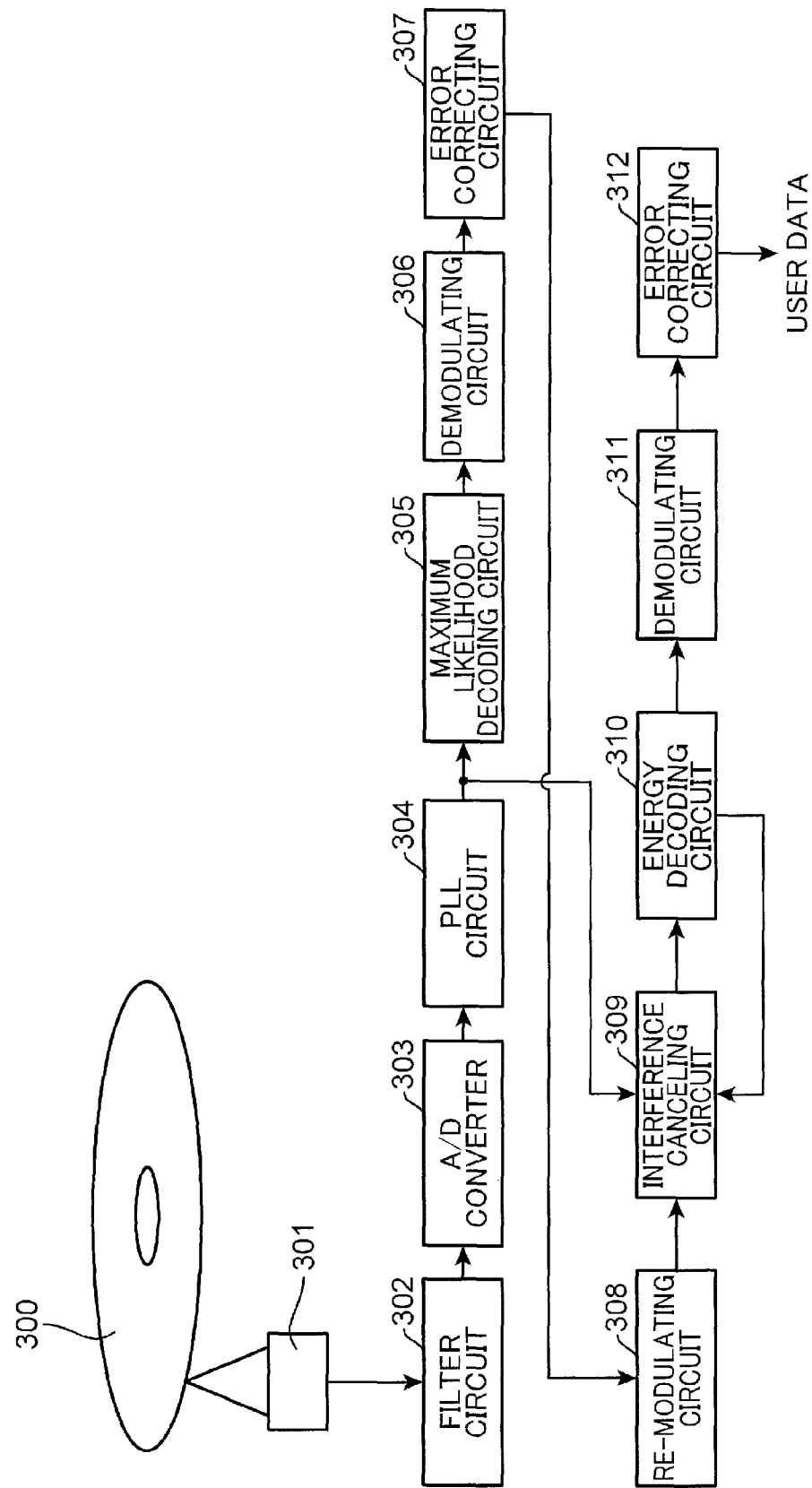
FIG. 25 is a diagram showing a configuration of an optical disk device according to a third embodiment of the present invention.

FIG. 25 is a diagram showing a configuration of an optical disk device according to the third embodiment of the present invention. Moreover, FIG. 25 shows a configuration of a portion related to a processing system which reproduces user data from an optical disk 300. The optical disk device shown in FIG. 25 comprises an optical pickup 301, a filter circuit 302, an A/D converter 303, a PLL circuit 304, a maximum likelihood decoding circuit 305, a demodulating circuit 306, an error correcting circuit 307, a re-modulating circuit 308, an interference canceling circuit 309, an energy decoding circuit 310, a demodulating circuit 311, and an error correcting circuit 312.

A recording mark is formed on a track on the optical disk 300 in accordance with a modulated signal obtained by performing predetermined error correction encoding and predetermined modulation encoding on user data. A reproduction process for reproducing recorded user data is performed by utilizing the fact that the amount of reflected light with respect to laser light irradiated from the optical pickup 301 on a track varies in accordance with a recording mark that is formed on the track.

The optical pickup 301 irradiates laser light on the optical disk 300 and receives reflected light from the optical disk 300. The optical pickup 301 detects a reproduced signal (a detected signal) corresponding to the amount of reflected light from the optical disk 300. The filter circuit 302 reduces a low frequency band noise component and a high frequency band noise component within a range which does not adversely affect a component of a frequency band of a modulation code included in the reproduced signal detected by the optical pickup 301. The A/D converter 303 and the PLL circuit 304 convert an output signal from the filter circuit 302 into a digital signal which is sampled at a 1 channel bit interval that is a unit of the modulation code.

The maximum likelihood decoding circuit 305 decodes the digital signal into an original modulated signal recorded on the track. The maximum likelihood decoding circuit 305 calculates a difference between a detected signal that is obtained when digital information subjected to error correction encoding according to a predetermined error correction encoding system and modulation encoding according to a predetermined modulation system is passed through the optical disk 300 and an expectation signal that is obtained when an arbitrary pattern signal is passed through the optical disk 300, and outputs a pattern signal for which the calculated difference is smallest as a decoded signal (a first decoded signal). Moreover, favorably, the modulation system is a run-length limited modulation encoding system. In addition, favorably, the error correction encoding system has a code rate which retains error correction performance that is capable of reducing a bit error rate of a demodulated signal from the demodulating circuit 306.

The maximum likelihood decoding circuit 305 extracts a pattern signal with a minimum difference from a detected signal from $2^K$-number of pattern signals that are likely within a range of K bit width where an interference between bits occurs as the first decoded signal.

The demodulating circuit 306 demodulates the modulated signal decoded by the maximum likelihood decoding circuit 305 into a bit sequence prior to modulation encoding in accordance with rules of the modulation system. The demodulating circuit 306 generates a demodulated signal (a first demodulated signal) by demodulating the first decoded signal outputted by the maximum likelihood decoding circuit 305 in accordance with the modulation system.

The error correcting circuit 307 corrects an error included on the bit sequence demodulated by the demodulating circuit 306 in accordance with the error correction encoding system. The error correcting circuit 307 generates a digital signal (a first digital signal) by performing error correction on the first demodulated signal in accordance with the error correction encoding system.

The re-modulating circuit 308 once again modulates, in accordance with the modulation system, the bit sequence on which error correction has been performed by the error correcting circuit 307, and outputs the signal subjected to re-modulation as a re-modulated signal. The re-modulating circuit 308 generates a re-modulated signal by re-modulating the first digital signal in accordance with the modulation system.

The interference canceling circuit 309 cancels an intersymbol interference occurring in the digital signal using the re-modulated signal outputted by the re-modulating circuit 308. Using the re-modulated signal, the interference canceling circuit 309 extracts, from states of $2^K$-number of detected signals that are likely within a range of K bit width where an interference between bits of the digital information occurs due to the predetermined frequency characteristics, most likely $2^M$-number of detected signals respectively corresponding to states of $2^M$-number of detected signals which exist within a range of M bit width that is included in the range of K bit width. Moreover, favorably, the M bit width is two bit width.

The energy decoding circuit 310 decodes the digital signal for which the intersymbol interference has been canceled by the interference canceling circuit 309 into a modulated signal using 1 channel bit energy. The energy decoding circuit 310 generates a decoded signal (a second decoded signal) by calculating difference integrated values in the K bit width range between the $2^M$-number of detected signals extracted by the interference canceling circuit 309 and expectation signals respectively corresponding to the $2^M$-number of detected signals and selecting a transition sequence of a state of a detected signal for which the calculated difference integrated value is smallest. The energy decoding circuit 310 selects a transition sequence of a state using a Viterbi algorithm.

The demodulating circuit 311 demodulates the modulated signal decoded by the energy decoding circuit 310 into a bit sequence prior to modulation encoding in accordance with rules of the modulation system in a similar manner to the demodulating circuit 306 described earlier. The demodulating circuit 311 generates a demodulated signal (a second demodulated signal) by demodulating the second decoded signal outputted by the energy decoding circuit 310 in accordance with the modulation system.

The error correcting circuit 312 corrects an error included on the bit sequence demodulated by the demodulating circuit 311 in accordance with the error correction encoding system and outputs user data. The error correcting circuit 312 generates user data (a second digital signal) by performing error correction on the second demodulated signal outputted from the demodulating circuit 311 in accordance with the error correction encoding system.

As described above, the optical disk device according to the third embodiment of the present invention reproduces user data by performing two decoding processes.

Figure 26:
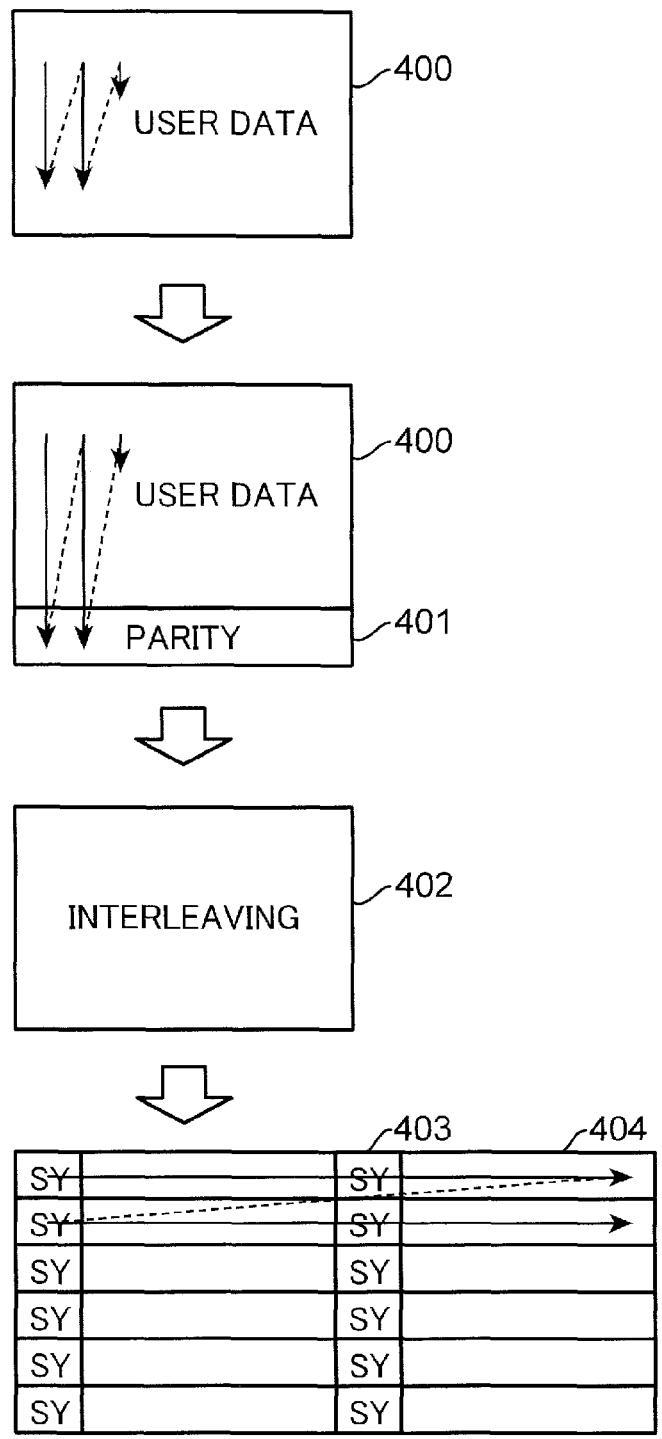
FIG. 26 is a diagram showing a flow of an error correction encoding process and a modulation encoding process when recording user data on a track of an optical disk.

FIG. 26 is a diagram showing a flow of an error correction encoding process and a modulation encoding process when recording user data on a track of the optical disk 300. Original user data 400 is arranged in a predetermined order. In addition, parities 401 that are calculated for each code in accordance with a low-density parity check code (hereinafter, referred to as an LDPC) system are added to the user data 400. Next, interleaving is performed in which the generated user data 400 and parities 401 are rearranged according to a predetermined rule. The interleaved data 402 is delimited in a predetermined unit and converted into a modulated signal 404 in accordance with a modulation encoding system such as the RLL (2, 10) modulation encoding system. A synchronous code 403 which includes ID information so as to enable judgment of a bit position is inserted between the divided modulated signals 404. The synchronous code 403 and the modulated signal 404 are recorded on a track of the optical disk 300. The maximum likelihood decoding circuit 305, the demodulating circuit 306, and the error correcting circuit 307 perform the first decoding processing in accordance with the modulation system and the error correction encoding system described above.

With a reproduction system which is subjected to band limiting during reproduction and which includes interferences such as an optical disk, there is a problem in that a difference in Euclidean distances becomes smaller and sufficient reproduction performance cannot be produced. In order to describe a feature of the present third embodiment which solves this problem in detail, first, performance of an LDPC in an ideal binary transmission path that is completely free of interference will be described with reference to FIG. 27.

Figure 27:
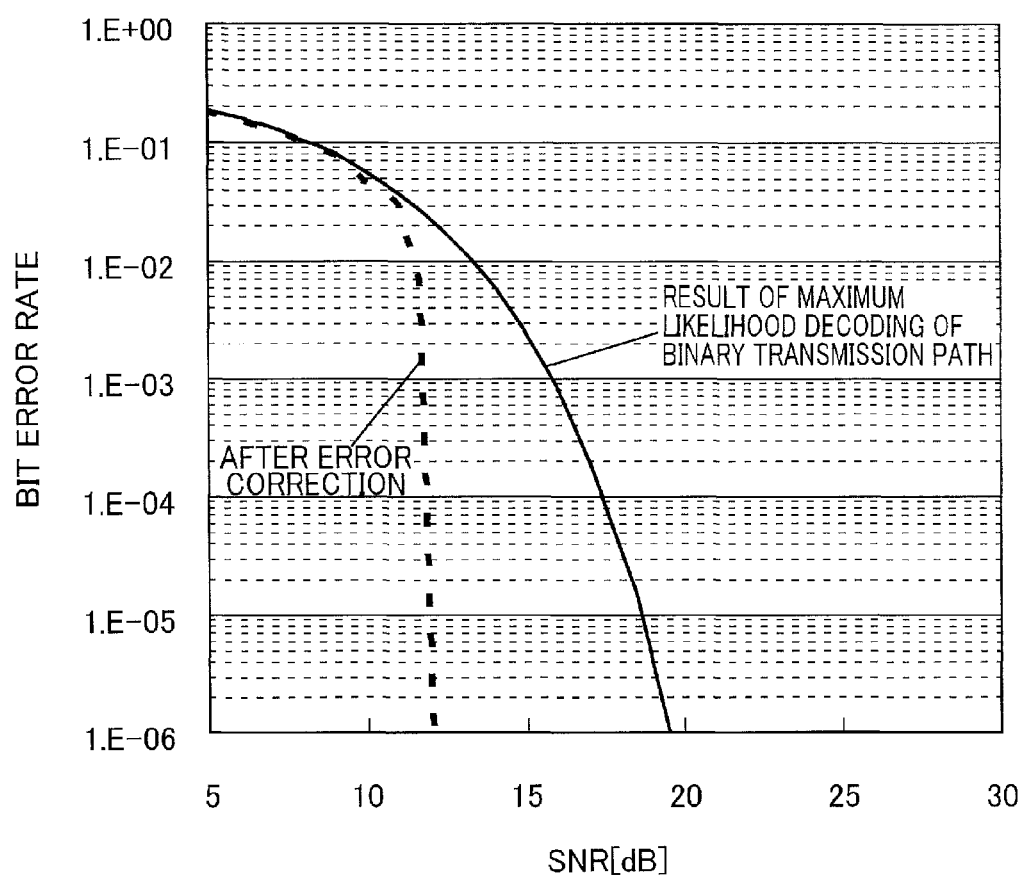
FIG. 27 is a diagram showing error correction performance of a binary transmission path model of an LDPC with a code rate of 0.87.

FIG. 27 is a diagram showing error correction performance of an LDPC binary transmission path model with a code rate of 0.87. An LDPC is generally known to produce extremely high error correction performance. For example, it is shown that by setting an extremely long code length of 10000 bits or longer, a bit error rate after error correction is kept low when a bit error rate prior to error correction falls under $2\times10^{-2}$.

In FIG. 27, an abscissa represents an SNR which is a ratio between an amplitude of a reproduced signal and a standard deviation σ of Gaussian noise that is applied when the amplitude of the reproduced signal is assumed to be 1. The SNR at a correction limit of the LDPC is approximately 12 dB and enables performance approaching the Shannon limit to be achieved in a binary transmission path that is completely free of intersymbol interferences. However, for example, when attempting to increase recording line density in a processing system which reproduces user data from an optical disk, sufficient performance cannot be realized even though the processing system has an SNR of a reproduction system that can be sufficiently corrected by the LDPC. This is because an increase in the recording line density of an optical disk creates the need to reproduce recording marks that are smaller than a resolution of an optical beam. In this case, a problem in that a difference in Euclidean distances during judgment of a state transition sequence occurs as described earlier and a bit error rate after decoding cannot be lowered. Such characteristics will now be described with reference to FIG. 28.

Figure 28:
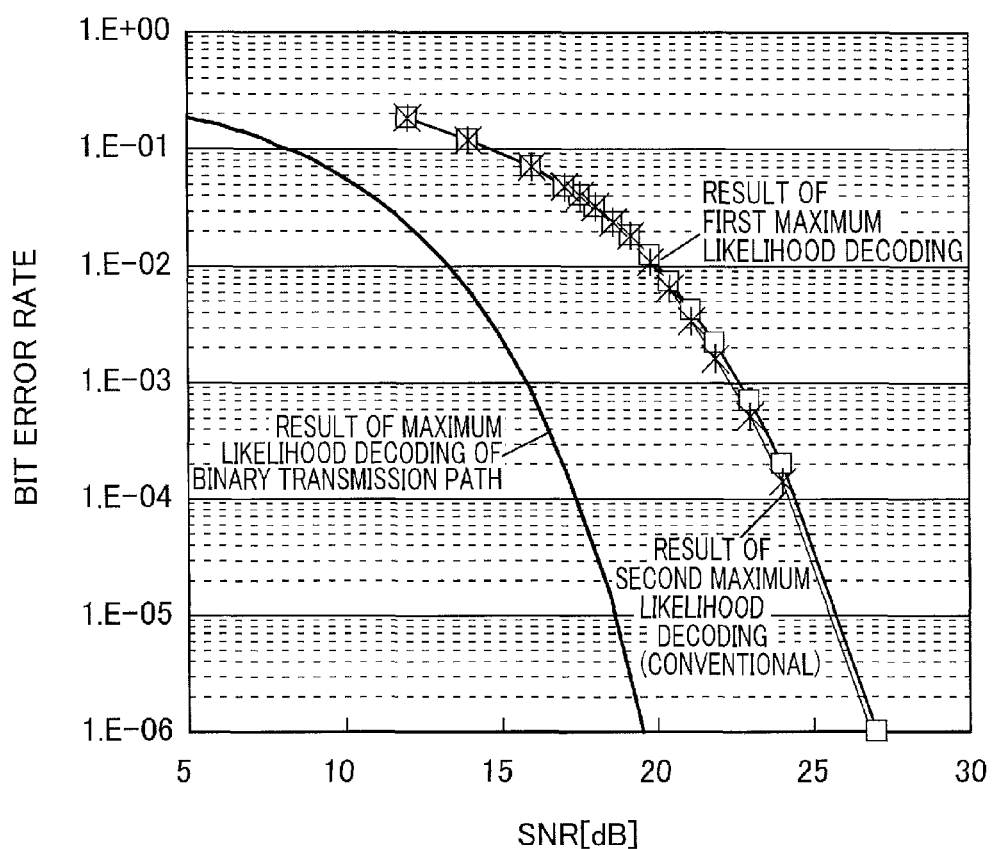
FIG. 28 is a diagram showing a relationship between bit error rate and SNR of a signal decoded by a maximum likelihood decoding circuit from a reproduced signal detected by an optical pickup from an optical disk having low-pass frequency characteristics.

FIG. 28 is a diagram showing a relationship between bit error rate and SNR of a signal decoded by the maximum likelihood decoding circuit 305 from a reproduced signal detected by the optical pickup 301 from the optical disk 300 having low-pass frequency characteristics. Even though a most likely decoding is performed by maximum likelihood decoding, a result of a first maximum likelihood decoding is far inferior to the characteristics represented by the result of the maximum likelihood decoding of the binary transmission path. In order to obtain a bit error rate that is comparable to the binary transmission path, the SNR of the reproduction system of the optical disk must be improved by approximately 7 dB. In addition, even when a second decoding is performed by the same maximum likelihood decoding circuit 305 as the first decoding as with a conventional system, the difference in Euclidean distances remains small as described earlier. Therefore, characteristics of bit error rate to SNR remain the same and no improvements are made.

The maximum likelihood decoding circuit 305 decodes a digital signal to an original modulated signal based on a difference in Euclidean distances. For example, as shown in FIG. 22, a 1 channel bit reproduced signal is spread across approximately 32 channel bits and an intersymbol interference has occurred over a width of approximately 32 channel bits. The maximum likelihood decoding circuit 305 searches for a modulated signal with a minimum Euclidean distance between an expectation signal corresponding to a modulated signal which may exist in the 32 channel bit width over which the intersymbol interference has occurred and an actually obtained reproduced signal, and outputs the retrieved modulated signal as a decoding result. Since a decoding method used by the maximum likelihood decoding circuit 305 is as described above, when a frequency band is significantly limited to a low frequency-side due to increased line density, a difference in Euclidean distances related to a pattern including a short mark/space with a frequency that is higher than a cutoff frequency where a gain of the OTF drops to zero becomes extremely small. As a result, a bit error rate deteriorates to far below the result of maximum likelihood decoding of a binary transmission path.

As described above, performance at the Shannon limit cannot be realized with a band-limited reproduction transmission path even if the transmission path originally has a sufficient SNR for error correction despite of the band limitation. The present third embodiment provides means which fundamentally solves the problem in that performance at the Shannon limit cannot be realized with a signal having passed through a band-limited transmission path even when using an LDPC which is supposed to enable the Shannon limit to be approached.

Unlike repeating decoding processes with the maximum likelihood decoding circuit 305 under the same conditions as with a conventional system, a feature of the present third embodiment is that, for a second decoding process, decoding is performed by the interference canceling circuit 309 and the energy decoding circuit 310 under conditions that differ from a first decoding process. The interference canceling circuit 309 and the energy decoding circuit 310 will be described in detail later.

The re-modulating circuit 308 performs processes similar to the error correction encoding process and the modulation encoding process which are performed when recording the user data shown in FIG. 26 on a track of the optical disk 300. Detailed configurations of the interference canceling circuit 309 and the energy decoding circuit 310 which use a re-modulated signal obtained by the re-modulating circuit 308 will now be described with reference to FIG. 29.

Figure 29:
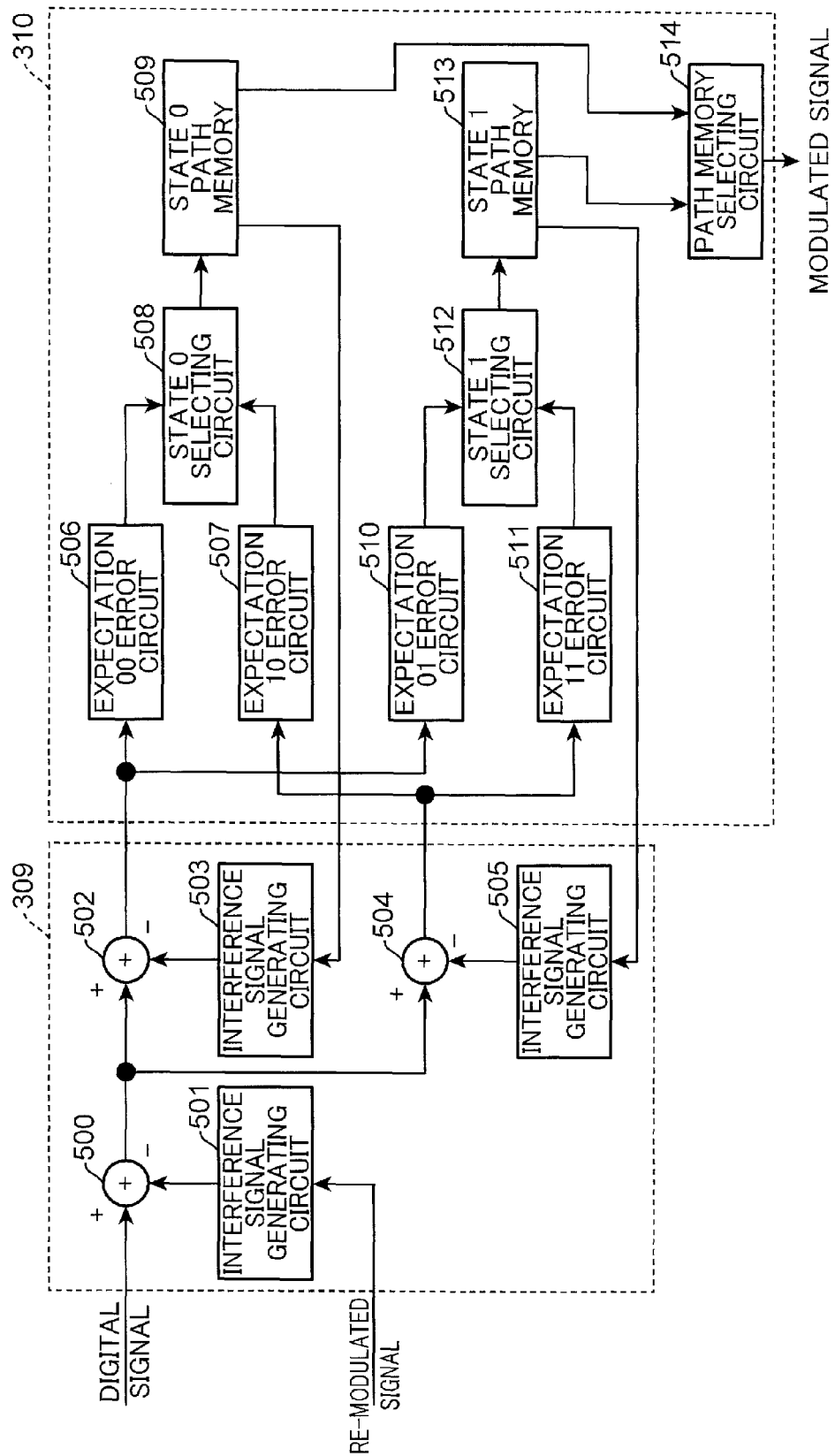
FIG. 29 is a block diagram showing a detailed configuration of an interference canceling circuit and an energy decoding circuit according to the third embodiment of the present invention.

FIG. 29 is a block diagram showing a detailed configuration of an interference canceling circuit and an energy decoding circuit according to the third embodiment of the present invention. The interference canceling circuit 309 comprises interference signal generating circuits 501, 503, and 505 and subtracters 500, 502, and 504.

The interference signal generating circuit 501 generates an interference signal that is a partial reproduced signal obtained when recording a re-modulated signal on the optical disk 300 and detecting the re-modulated signal by the optical pickup 301. The interference signal generating circuits 503 and 505 respectively generate two corresponding interference signals based on two judgment results of the energy decoding circuit 310 in a similar manner to the interference signal generating circuit 501. The subtracters 500, 502, and 504 subtract these interference signals from digital signals obtained by sampling the reproduced signal for every 1 channel bit.

For each state of $2^M$-number of detected signals, the interference signal generating circuits 503 and 505 generate a first interference component which is obtained when a bit sequence in accordance with a transition sequence of a state of a first predetermined interval that corresponds to a time preceding a M bit-width range within a K bit-width range is passed through the medium. For each state of $2^M$-number of detected signals, the interference signal generating circuit 501 generates a second interference component which is obtained when a bit sequence of a re-modulated signal that corresponds to a second predetermined interval that corresponds to a time subsequent to the M bit-width range within the K bit-width range is passed through the optical disk 300. The subtracters 500, 502, and 504 output signals obtained by canceling the first interference component and the second interference component from a digital signal (detected signal) to the energy decoding circuit 310.

The energy decoding circuit 310 comprises an expectation 00 error circuit 506, an expectation 10 error circuit 507, a state 0 selecting circuit 508, a state 0 path memory 509, an expectation 01 error circuit 510, an expectation 11 error circuit 511, a state 1 selecting circuit 512, a state 1 path memory 513, and a path memory selecting circuit 514.

The expectation 00 error circuit 506 receives a digital signal after the two interferences have been canceled from the interference canceling circuit 309, and calculates an error between the received digital signal and an expectation signal in a case where a value of a 2 channel bit is 00. In a similar manner to the expectation 00 error circuit 506, the expectation 10 error circuit 507 receives a digital signal after the two interferences have been canceled from the interference canceling circuit 309, and calculates an error between the received digital signal and an expectation signal in a case where the value of the 2 channel bit is 10. The expectation 01 error circuit 510 receives a digital signal after the two interferences have been canceled from the interference canceling circuit 309, and calculates an error between the received digital signal and an expectation signal in a case where the value of the 2 channel bit is 01. The expectation 11 error circuit 511 receives a digital signal after the two interferences have been canceled from the interference canceling circuit 309, and calculates an error between the received digital signal and an expectation signal in a case where the value of the 2 channel bit is 11.

The state 0 selecting circuit 508 compares the error from the expectation value 00 calculated by the expectation 00 error circuit 506 and the error from the expectation value 10 calculated by the expectation 10 error circuit 507, and selects one of the errors. The state 1 selecting circuit 512 compares the error from the expectation value 01 calculated by the expectation 01 error circuit 510 and the error from the expectation value 11 calculated by the expectation 11 error circuit 511, and selects one of the errors. The state 0 path memory 509 stores a result of the selection made by the state 0 selecting circuit 508. The state 1 path memory 513 stores a result of the selection made by the state 1 selecting circuit 512. The path memory selecting circuit 514 ultimately outputs a modulated signal.

Moreover, in the present third embodiment, the optical disk device corresponds to an example of the decoding device, the optical disk 300 corresponds to an example of the medium, the optical pickup 301 corresponds to an example of the optical pickup, the interference canceling circuit 309 corresponds to an example of the interference canceling unit, the energy decoding circuit 310 corresponds to an example of the first decoding unit, the maximum likelihood decoding circuit 305 corresponds to an example of the second decoding unit, the demodulating circuit 306 corresponds to an example of the first demodulating unit, the error correcting circuit 307 corresponds to an example of the first error correction unit, the re-modulating circuit 308 corresponds to an example of the re-modulating unit, the demodulating circuit 311 corresponds to an example of the second demodulating unit, the error correcting circuit 312 corresponds to an example of the second error correction unit, the interference signal generating circuits 503 and 505 correspond to examples of the first interference generating unit, the interference signal generating circuit 501 corresponds to an example of the second interference generating unit, and the subtracters 500, 502, and 504 correspond to examples of the signal canceling unit.

First, operations of the interference canceling circuit 309 will be described. The interference canceling circuit 309 comprises the subtracters 502 and 504 in accordance with a state of the energy decoding circuit 310, and using a bit sequence of a path memory that stores a judgment result in each state and a bit sequence of a re-modulated signal corresponding to a state transition sequence that is consecutive to each state, cancels interference signal components attributable to the respective bit sequences from a digital signal.

Figure 30:
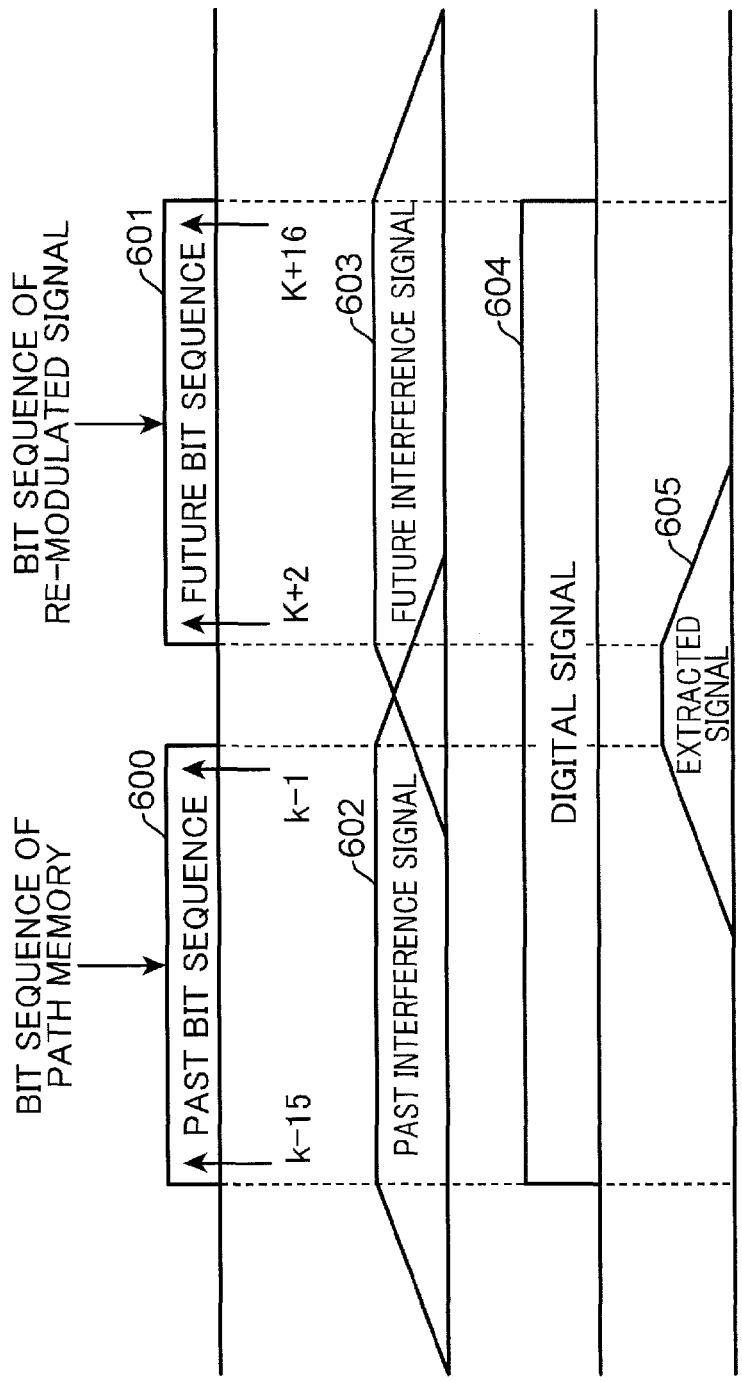
FIG. 30 is a diagram for describing operations of signal processing of the interference canceling circuit shown in FIG. 29.

FIG. 30 is a diagram for describing operations of signal processing by the interference canceling circuit 309 shown in FIG. 29.

At the present time k, the interference signal generating circuits 503 and 505 extract a past bit sequence 600 from the state 0 path memory 509 and the state 1 path memory 513 which are judged with respect to a state S (where S is 0 or 1) by the energy decoding circuit 310 in a 15 channel bit interval from time k−15 to time k−1 in the past. In addition, the interference signal generating circuit 501 extracts a future bit sequence 601 from a re-modulated signal obtained from the re-modulating circuit 308 in a 15 channel bit interval from time k+2 to time k+16 which are consecutive to the state S. As a result, a bit sequence of 32 channel bits from time k−15 to time k+16 is created.

The interference signal generating circuits 503 and 505 respectively calculate a bit sequence preceding the present time which is recorded on the optical disk 300 as an interference signal that is included in a digital signal obtained through frequency characteristics of a corresponding reproduction processing system from detection by the optical pickup 301 until passage through the filter circuit 302 and the A/D converter 303. In addition, the interference signal generating circuit 501 calculates a bit sequence subsequent to the present time which is recorded on the optical disk 300 as an interference signal that is included in a digital signal obtained through frequency characteristics of a corresponding reproduction processing system from detection by the optical pickup 301 until passage through the filter circuit 302 and the A/D converter 303.

The interference signal generating circuits 501, 503, and 505 calculate interference signals by multiplying a frequency spectrum that is a Fourier transform of a bit sequence by the frequency characteristics of the reproduction processing system. Alternatively, the interference signal generating circuits 501, 503, and 505 may calculate interference signals by calculating a reproduced signal of a 1 channel bit recording mark from the frequency characteristics of the reproduction processing system and performing a convolution computation of the calculated reproduced signal and a bit sequence.

The subtracters 500, 502, and 504 subtract the three interference signals obtained in this manner from the digital signal of the interval from time k−15 to time k+16 which is outputted from the PLL circuit 304. First, the subtracter 500 subtracts a future interference signal 603 generated by the interference signal generating circuit 501 based on the future bit sequence 601 from a digital signal 604. Next, the subtracter 502 subtracts the past interference signal 602 generated by the interference signal generating circuit 503 based on the past bit sequence 600 with respect to a state 0 from the digital signal 604 and outputs a digital signal after interference cancellation with respect to the state 0. In a similar manner, the subtracter 504 subtracts the past interference signal 602 generated by the interference signal generating circuit 505 based on the past bit sequence 600 with respect to a state 1 from the digital signal 604 and outputs a digital signal after interference cancellation with respect to the state 1. Accordingly, digital signals after interference cancellation are obtained from which signal components attributable to bit sequences of an interval from time k−15 to time k−1 and an interval from time k+1 to time k+16 are canceled.

Next, operations of the energy decoding circuit 310 will be described.

Figure 31:
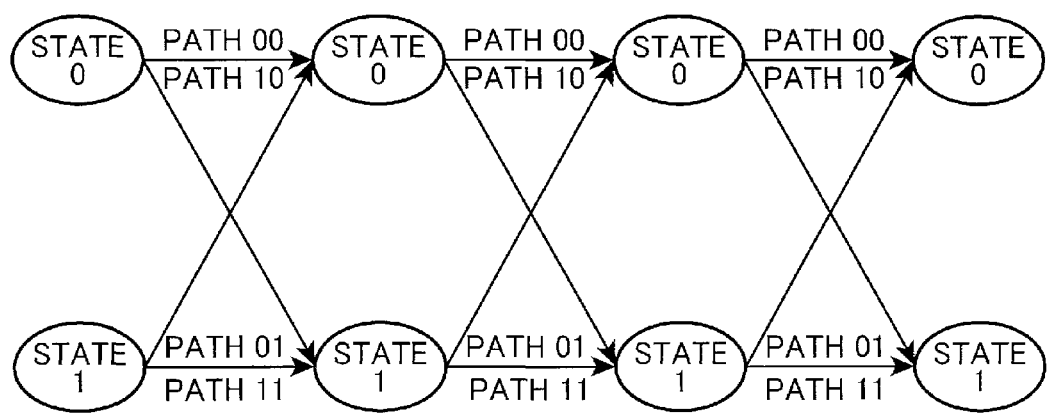
FIG. 31 is a diagram showing a trellis diagram that is applied to an energy decoding circuit.

A digital signal after interference cancellation only includes a bit sequence of a 2 channel bit interval from time k to time k+1. Therefore, the energy decoding circuit 310 is capable of judging a state transition sequence in accordance with a trellis diagram having a constraint length of 2 and having an extremely simple configuration as shown in FIG. 31 and outputting a modulated signal as a decoding result. FIG. 31 is a diagram showing a trellis diagram that is applied to an energy decoding circuit.

In the trellis diagram shown in FIG. 31, a path 00 corresponds to the expectation value 00 described earlier, a path 10 corresponds to the expectation value 10 described earlier, a path 01 corresponds to the expectation value 01 described earlier, and a path 11 corresponds to the expectation value 11 described earlier. An error from an expectation value of each path is calculated by the expectation 00 error circuit 506, the expectation 10 error circuit 507, the expectation 01 error circuit 510, and the expectation 11 error circuit 511. In a similar manner to the generation of interference signals described earlier, expectation signals corresponding to the respective expectation values can be obtained a bit sequence of 32 channel bits obtained by adding an expectation value to 2 channel bits from time k to time k+1 as digital signals acquired through frequency characteristics of a reproduction processing system corresponding to recording on the optical disk 300, detecting with the optical pickup 301, the filter circuit 302, the A/D converter 303, and the PLL circuit 304.

Errors between the digital signals after interference cancellation and the respective expectation signals are values obtained by calculating a square of a difference in amplitude values for each time position between time k−15 to time k+16 and integrating the squares by an interval between time k−15 to time k+16. Alternatively, the errors between the digital signals after interference cancellation and the respective expectation signals may be values obtained for a frequency spectrum of each signal by calculating a square of differences in spectrum values for each frequency and integrating the squares by a frequency band from frequency zero to a frequency where gain of the OTF becomes zero.

After errors from the respective expectation values have been calculated, the state 0 selecting circuit 508 compares the error from the expectation value 00 and the error from the expectation value 10 with each other in accordance with the trellis diagram shown in FIG. 31 and selects the error with the smaller value. In other words, when a value of a bit at a position of time k+1 is assumed to be 0, the state 0 selecting circuit 508 judges whether a value of a bit at a position of time k is 0 or 1. When the error from the expectation value 00 is smaller than the error from the expectation value 10, the state 0 path memory 509 stores 0 as the value of the bit at time k. On the other hand, when the error from the expectation value 10 is smaller than the error from the expectation value 00, the state 0 path memory 509 replaces a value of a bit preceding time k−1 with a value retained in the state 1 path memory 513 and stores 1 as the value of the bit at time k.

In a similar manner, the state 1 selecting circuit 512 compares the error from the expectation value 01 and the error from the expectation value 11 with each other and selects the error with the smaller value. In other words, when a value of a bit at a position of time k+1 is assumed to be 1, the state 1 selecting circuit 512 judges whether a value of a bit at a position of time k is 0 or 1. When the error from the expectation value 11 is smaller than the error from the expectation value 01, the state 1 path memory 513 stores 1 as the value of the bit at time k. On the other hand, when the error from the expectation value 01 is smaller than the error from the expectation value 11, the state 1 path memory 513 replaces a value of a bit preceding time k−1 with a value retained in the state 0 path memory 509 and stores 0 as the value of the bit at time k.

When a constraint length is increased with an increase in line density as is the case of a conventional PRML system, the number of states of a trellis diagram increases and, as a result, various state transition sequences must be compared over a long time interval. These comparisons of the state transition sequences include a comparison of patterns which include a short recording mark/space with a frequency that is higher than a cutoff frequency where a gain of the OTF drops to zero such as a pattern in which a 3 channel bit recording mark has moved forward or backward by precisely 1 channel bit to create a difference of 2 channel bits. The effect of frequency characteristics due to an increase in line density causes a difference between patterns or, in other words, a difference in Euclidean distances to be extremely small. As a result, errors are more likely to occur due to noise.

However, with the third embodiment of the present invention, since the interference canceling circuit 309 limits the bits to be judged to 2 channel bits, there are only two states as shown in the trellis diagram in FIG. 31. As a result, a state transition sequence is to be always selected and comparisons between different state transition sequences over a long time interval as is conventional are no longer necessary. Therefore, when a comparison of state transition sequences is performed by the state 0 selecting circuit 508 and the state 1 selecting circuit 512, a sudden reduction in a difference in Euclidean distances under the influence of frequency characteristics due to an increase in line density no longer occurs.

Figure 32:
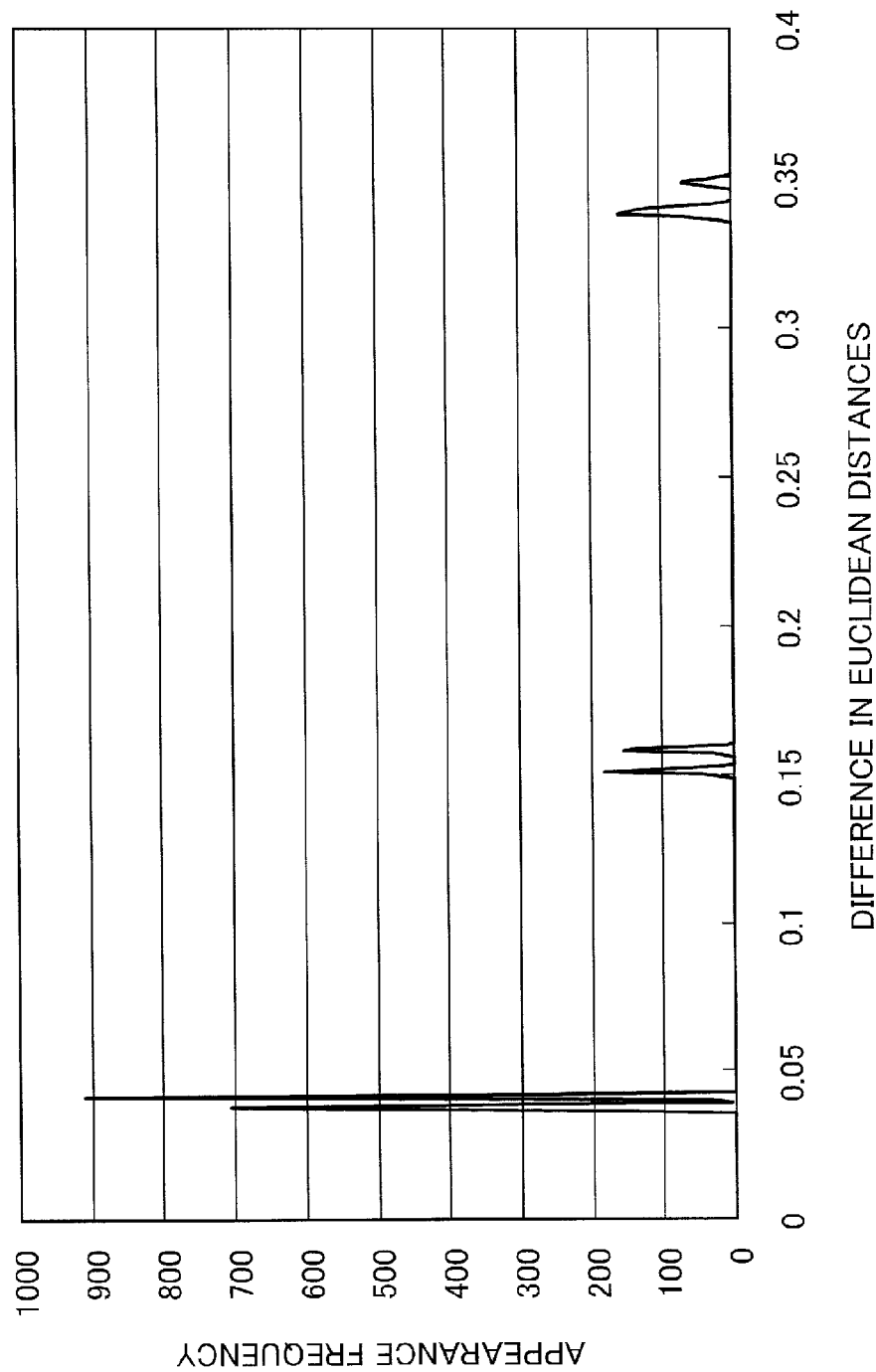
FIG. 32 is a diagram showing an appearance frequency of a difference in errors from expectation values used in comparison determination of state transition sequences or, in other words, a difference in Euclidean distances between a state 0 selecting circuit and a state 1 selecting circuit.

FIG. 32 is a diagram showing an appearance frequency of a difference in errors from expectation values used in comparison determination of state transition sequences or in other words, a difference in Euclidean distances between the state 0 selecting, circuit 508 and the state 1 selecting circuit 512. In FIG. 23 which shows a difference in Euclidean distances for judging a state transition sequence that has occurred in conventional maximum likelihood decoding, values that are smaller than the value 0.04 of 1 channel bit energy occurs in extremely large numbers. In contrast, there are no occurrences of a value that is smaller than the value 0.04 of 1 channel bit energy in FIG. 32. In other words, one could argue that decoding is realized which takes full advantage of an SNR of a transmission path involving recording on the optical disk 300 and detecting with the optical pickup 301.

With a conventional system, since a decoding process under the same conditions is simply repeated, a difference in Euclidean distances remains unchanged. However, in the present third embodiment, since a second decoding process is performed so as to extract 1 channel bit energy, a difference in Euclidean distances can be increased from a difference in Euclidean distances during a first decoding process as shown in FIG. 32.

The path memory selecting circuit 514 selects one of the bit sequence retained in the state 0 path memory 509 and the bit sequence retained in the state 1 path memory 513, and outputs the selected bit sequence as a decoded modulated signal. The path memory selecting circuit 514 compares a value of the error selected by the state 0 selecting circuit 508 and a value of the error selected by the state 1 selecting circuit 512 with each other and selects and outputs the error with a smaller value.

Figure 33:
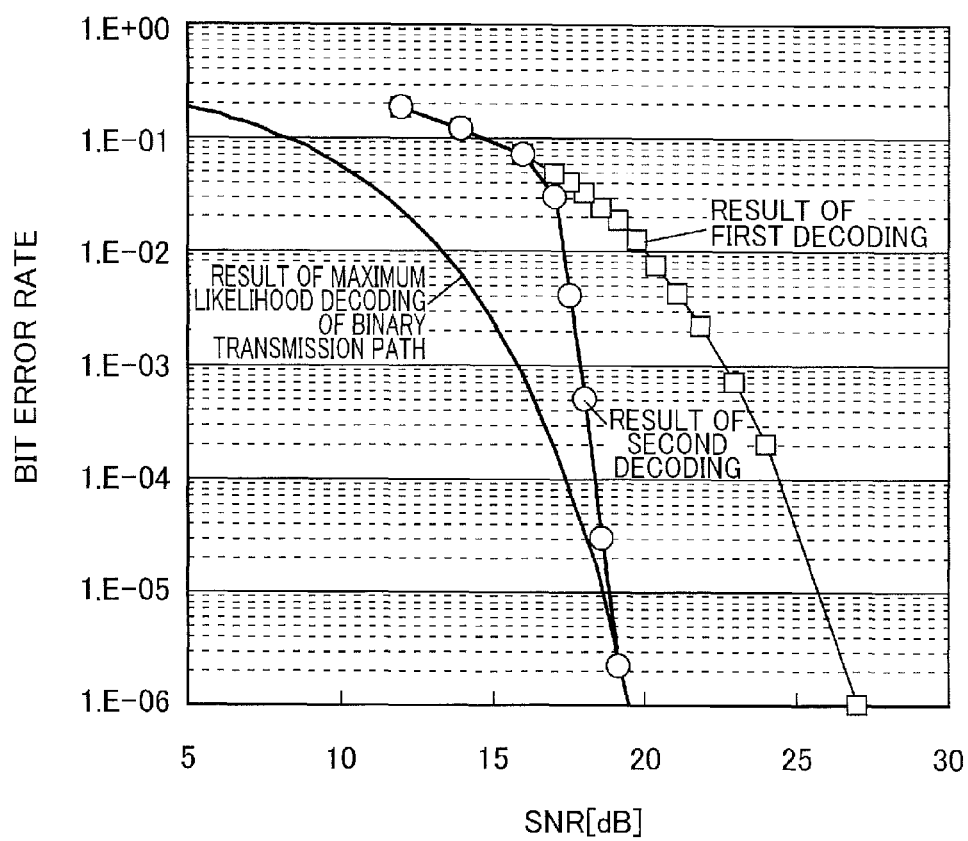
FIG. 33 is a diagram showing a result of an evaluation by simulation of bit error rates after decoding.

FIG. 33 is a diagram showing a result of an evaluation by simulation of bit error rates after decoding. As described earlier, since a bit error rate after a first decoding by the maximum likelihood decoding circuit 305 is a result in a state where the difference in Euclidean distances had remained small prior to utilizing 1 channel bit energy, the obtained bit error rate is not adequately good. By performing a second decoding process through the interference canceling circuit 309 and the energy decoding circuit 310 using results of error correction by an LDPC which has a long code length and high error correction performance, the bit error rate after the second decoding process is significantly improved from the bit error rate of the first decoding process and approaches characteristics of a binary transmission path.

In a reproduction system of an optical disk, if an SNR and a bit error rate which are similar to the characteristics of a binary transmission path are realized, it is likely that the SNR is fully utilized and performance at the Shannon limit is realized. With a conventional system, since a difference in Euclidean distances during judgment for decoding remains small, the SNR is not utilized and is lower by approximately 7 dB than the characteristics of a binary transmission path. With the decoding method according to the present third embodiment, a bit error rate that is approximately comparable to a binary transmission path is achieved in a region where the SNR is equal to or higher than approximately 17 dB. Therefore, even with a signal having passed through a band-limited transmission path, performance of an LDPC which approaches the Shannon limit is realized in a similar manner to a binary transmission path.

While a discrepancy remains between a result of the second decoding and characteristics of a binary transmission path in a region where the SNR is equal to or lower than approximately 17 dB, this discrepancy is due to error correction performance of an LDPC. By varying a code rate or a code length of the LDPC to increase the error correction performance, even when the SNR is low, the result of the second decoding can be conformed to the characteristics of a binary transmission path.

The difference in Euclidean distances in the maximum likelihood decoding circuit 305 has a large number of values that are around 0.01. In contrast, as a result of the interference canceling circuit 309 and the energy decoding circuit 310 extracting 1 channel bit energy per data bit, the difference in Euclidean distances in the interference canceling circuit 309 and the energy decoding circuit 310 has a large number of values that are around 0.04. Therefore, decoding performance has been expanded approximately fourfold. This means that an allowance for random noise when judging a pattern has been increased approximately fourfold. As a result, decoding errors due to random noise of a similar level hardly occurs, which demonstrates that the system according to the present third embodiment realizes extremely high decoding performance as compared to a conventional system.

With a conventional system, since a difference in Euclidean distances decreases rapidly due to a limitation on frequency bands which is associated with increasing line density, it is difficult to secure sufficient reproduction performance even when using an LDPC with high error correction performance. However, with the decoding method according to the present third embodiment, since an LDPC is used for second and subsequent processes, the difference in Euclidean distances has been expanded to 1 channel bit energy to greatly increase decoding performance and to secure reproduction performance capable of accommodating an increase in line density. In order to achieve reproduction performance with a high frequency usage efficiency, an error correction code with high error correction performance such as an LDPC is essential as has been conventionally proposed. With a transmission path which is subjected to frequency band limitations and in which an intersymbol interference occurs, a decoding process for extracting 1 channel bit energy is also important. The present third embodiment is a decoding method which achieves the extraction of 1 channel bit energy, and the Shannon limit which is a limit level of reproduction performance made possible by fully utilizing 1 channel bit energy can even be approached in a state where an intersymbol interference due to frequency band limitations has occurred.

As described above, while the optical disk device according to the present third embodiment is configured so as to perform decoding process for two times, the present invention is not limited thereto and the optical disk device can be configured so as to perform decoding process for three times or more. If the error correction code is within a range that is lower than a bit error rate capable of reducing the number of errors even if only slightly, by performing a plurality of decoding processes while extracting 1 channel bit energy as described above, the bit error rate can be significantly lowered. If an encoding system, a code rate, a code length, and the like of error correction encoding are determined so as to produce error correction performance that is capable of reducing the number of errors with an SNR of a transmission path which performs recording on the optical disk 300 and detection with the optical pickup 301, information can be reproduced without errors.

Figure 34:
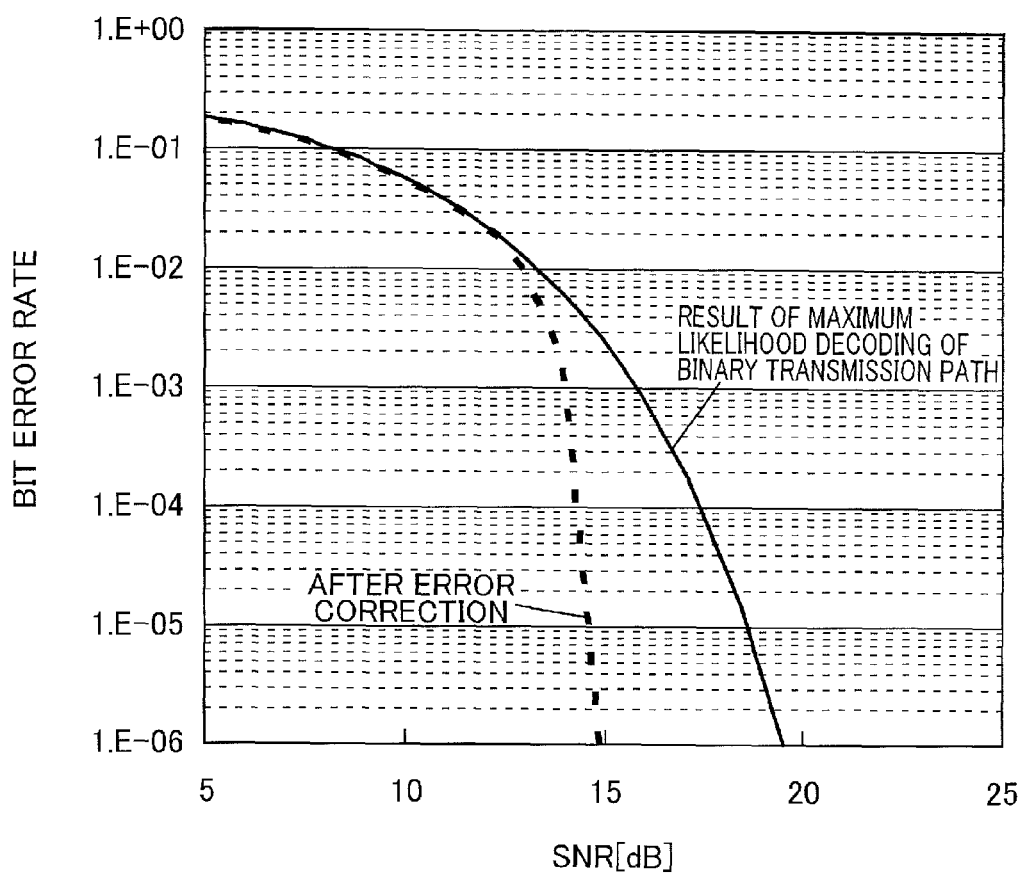
FIG. 34 is a diagram showing error correction performance according to a Reed-Solomon code with a code rate of 0.87.

In addition, while an LDPC is adopted as the error correction code in the description above, the present invention is not limited thereto. For example, a Reed-Solomon code may be used as the error correction code. FIG. 34 is a diagram showing error correction performance of a Reed-Solomon code with a code rate of 0.87. The error correction performance of the Reed-Solomon code is inferior to the error correction performance of the LDPC shown in FIG. 27. However, by using the interference canceling circuit 309 and the energy decoding circuit 310 at an SNR of a level where an effect of reducing the number of errors can be produced by the Reed-Solomon code, a bit error rate of a second decoding process can be significantly lowered in a similar manner to an LDPC.

Figure 35:
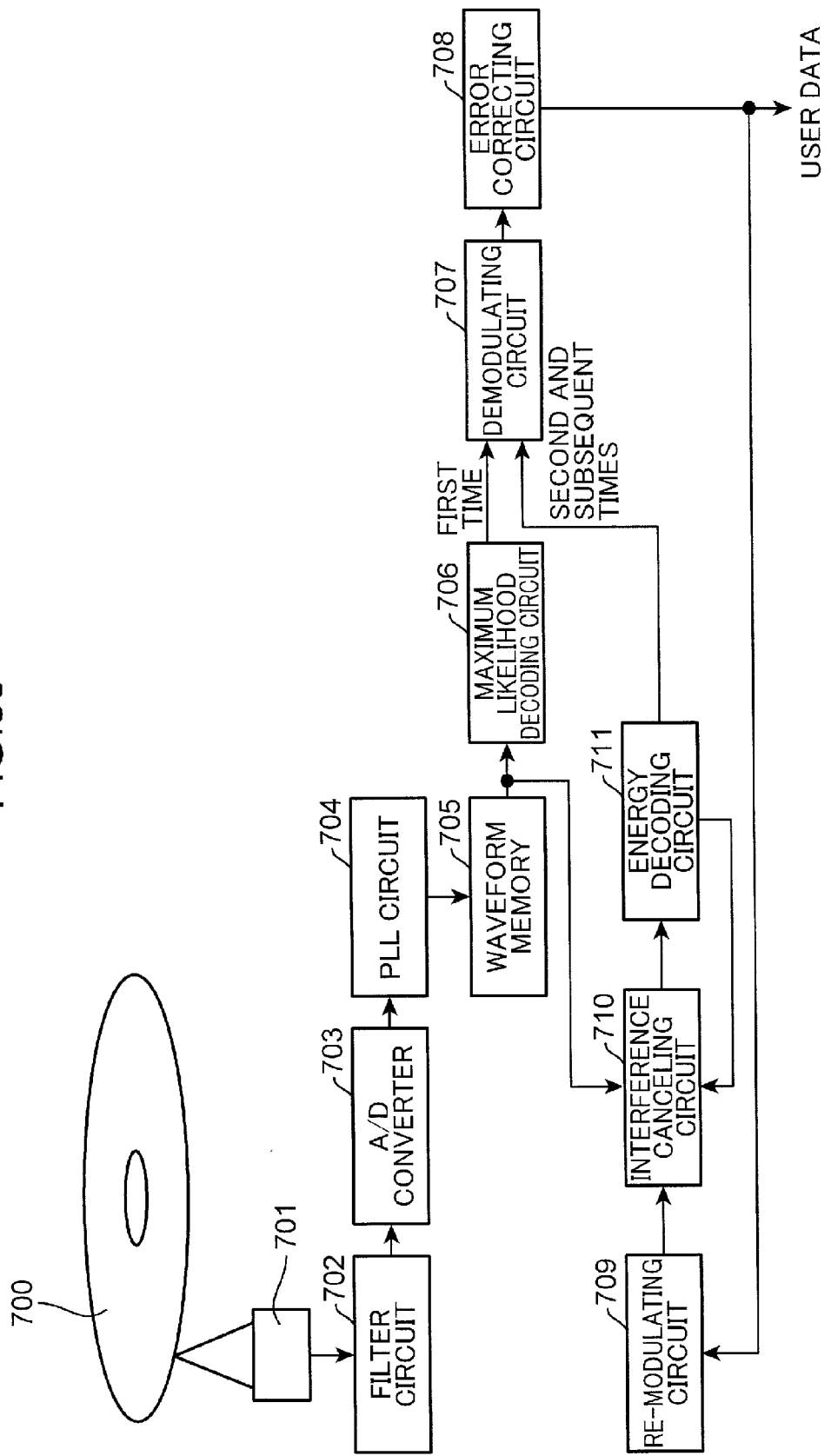
FIG. 35 is a diagram showing a configuration of an optical disk device according to a modification of the third embodiment of the present invention.

Furthermore, instead of the configuration shown in FIG. 25 in which the respective circuits are arranged in series, for example, the optical disk device may have a feedback configuration such as that shown in FIG. 35.

FIG. 35 is a diagram showing a configuration of an optical disk device according to a modification of the third embodiment of the present invention. The optical disk device shown in FIG. 35 comprises an optical pickup 701, a filter circuit 702, an A/D converter 703, a PLL circuit 704, a waveform memory 705, a maximum likelihood decoding circuit 706, a demodulating circuit 707, an error correcting circuit 708, a re-modulating circuit 709, an interference canceling circuit 710, and an energy decoding circuit 711.

A recording mark is formed on a track on the optical disk 700 in accordance with a modulated signal obtained by performing predetermined error correction encoding and predetermined modulation encoding on user data. A reproduction process for reproducing recorded user data is performed by utilizing the fact that the amount of reflected light with respect to laser light irradiated from the optical pickup 701 on a track varies in accordance with a recording mark that is formed on the track.

The optical pickup 701 irradiates laser light on the optical disk 700 and receives reflected light from the optical disk 700. The optical pickup 701 detects a reproduced signal in accordance with an amount of reflected light. The filter circuit 702 reduces a low frequency band noise component and a high frequency band noise component within a range which does not adversely affect a component of a frequency band of a modulation code included in the reproduced signal detected by the optical pickup 701. The A/D converter 703 and the PLL circuit 704 convert an output signal from the filter circuit 702 into a digital signal which is sampled at a 1 channel bit interval that is a unit of the modulation code.

The waveform memory 705 stores digital signals sampled in units of blocks in which user data is converted in accordance with the error correction encoding system shown in FIG. 26. The maximum likelihood decoding circuit 706 decodes digital signals sequentially read out from the waveform memory 705 into original modulated signals recorded on the track. The demodulating circuit 707 demodulates the decoded modulated signals into a bit sequence prior to modulation encoding in accordance with rules of the modulation system. The error correcting circuit 708 corrects an error included on the bit sequence demodulated by the demodulating circuit 707 in accordance with the error correction encoding system and outputs the user data.

The re-modulating circuit 709 once again modulates, in accordance with the modulation system, the bit sequence on which error correction has been performed by the error correcting circuit 708, and outputs the signal subjected to re-modulation as a re-modulated signal. The interference canceling circuit 710 sequentially reads out digital signals from the waveform memory 705 and cancels an intersymbol interference occurring in the digital signal using the re-modulated signal outputted by the re-modulating circuit 709.

The energy decoding circuit 711 decodes the digital signal from which the intersymbol interference has been canceled by the interference canceling circuit 710 into a modulated signal using 1 channel bit energy. The modulated signal decoded by the energy decoding circuit 711 is outputted to the demodulating circuit 707.

For second and subsequent decoding processes, the demodulating circuit 707 demodulates the modulated signal outputted from the energy decoding circuit 711 into a bit sequence prior to modulation encoding in accordance with rules of the modulation system. For the second and subsequent decoding processes, the error correcting circuit 708 corrects an error included on the bit sequence demodulated by the demodulating circuit 707 in accordance with the error correction encoding system and outputs the user data in a similar manner to the first decoding process.

As described above, even with a feedback configuration in which the waveform memory 705 is added to the optical disk device, the effect of the present third embodiment can be produced.

In a band-limited transmission path, an occurrence of an intersymbol interference causes information of 1 channel bit to diffuse along a time axis. Performance of maximum likelihood decoding can be maximized by setting K channel bit width close to a width of an intersymbol interference that is a width of diffusion of 1 channel bit. Therefore, for the first decoding process, desirably, the width of an intersymbol interference and a value of K bit width are brought close to each other. In the second decoding process, the interference canceling circuit 309 uses a re-modulated signal to extract $2^M$-number of patterns with M channel bit width that is smaller than K channel bit width. The energy decoding circuit 310 performs decoding by selecting a pattern whose Euclidean distance to the reproduced signal is smallest from the $2^M$-number of patterns. By setting the M channel bit width of the second decoding process to or below 2 channel bit width at which preceding and subsequent intersymbol interferences can be most canceled with respect to the K channel bit width of the first decoding process, an SNR can be maximized and a bit error rate can be minimized.

However, there may be cases where an error remains in a re-modulated signal fed back from an LDPC that is used to cancel an intersymbol interference. Therefore, maximum performance is not always produced when M channel bit width is set to 2 channel bit width. However, setting K channel bit width larger than M channel bit width enables a decoding process to be performed which maximizes an SNR of a signal while canceling preceding and subsequent intersymbol interferences. In other words, a condition necessary for maximizing an SNR is K channel bit width>M channel bit width. The present third embodiment is able to produce a maximum effect when decoding processes are performed a plurality of times while satisfying the condition expressed as K channel bit width>M channel bit width. For example, in the present third embodiment, since 1 channel bit is diffused to 32 channel bit width as shown in FIG. 22, K channel bit width is set to 32 channel bit width and, at the same time, M channel bit width is set to 2 channel bit width in order to maximize the SNR in the second decoding process.

As described earlier, while a system in which a maximum likelihood decoding process is once again performed using a result of the error correcting circuit 307 has been conventionally proposed, with the conventional system, a first decoding process and second and subsequent decoding processes are performed under the same conditions. In other words, instead of K channel bit width>M channel bit width, a value of the K channel bit width in the first decoding process and a value of the M channel bit width in the second and subsequent decoding processes are the same. When K channel bit width and M channel bit width have the same value, a difference in Euclidean distances between patterns that exist within the K channel bit width remains extremely small due to a limitation in frequency bandwidth in the second decoding process in a similar manner to the first decoding process. As a result, a decoding process which uses the energy of 1 channel bit is not realized.

Therefore, when decoding processes are performed a plurality of times by a conventional system, while an effect of repetitive processing can be produced with respect to correcting errors such as gaps in a signal, an effect of repetitive processing is hardly produced with respect to errors caused by random noise. This point is a major difference from the present third embodiment.

As described above, a major feature of the present third embodiment is that a configuration is adopted which is capable of realizing reproduction performance appropriate for an SNR of a detection system in a memory channel such as an optical disk where intersymbol interferences occur without being affected by a limitation in frequency bands due to increased line density or the like. In the present third embodiment, since decoding processes are performed a plurality of times so as to extract 1 channel bit energy instead of simply repeating decoding processes under the same conditions as is the case of a conventional system, extremely high reproduction performance can be realized as shown in FIG. 33. A state of M channel bits from which preceding and subsequent interferences has been canceled is judged based on a state of K channel bit width by re-using an error correction result that is obtained by extending a code length of an LDPC. Accordingly, an energy difference when judging a pattern in a second decoding process can be increased and high reproduction performance can be realized.

The decoding method according to the present third embodiment achieves reproduction performance comparable to when processing an ideal reproduced signal that is totally free of interference with respect to a reproduced signal in which an interference has occurred over a wide time range due to a limitation in frequency bands during reproduction. The Shannon limit which is a limit of reproduction performance that can be realized when maximizing energy of 1 channel bit is premised on a memoryless channel in which no intersymbol interference occurs. Therefore, the reproduction performance of a conventional system in a memory channel where an intersymbol interference has occurred is far inferior to the Shannon limit. The decoding method according to the present third embodiment is an exceptional decoding method which is capable of realizing reproduction performance that approaches the Shannon limit even in a memory channel.

Fourth Embodiment

Figure 36:
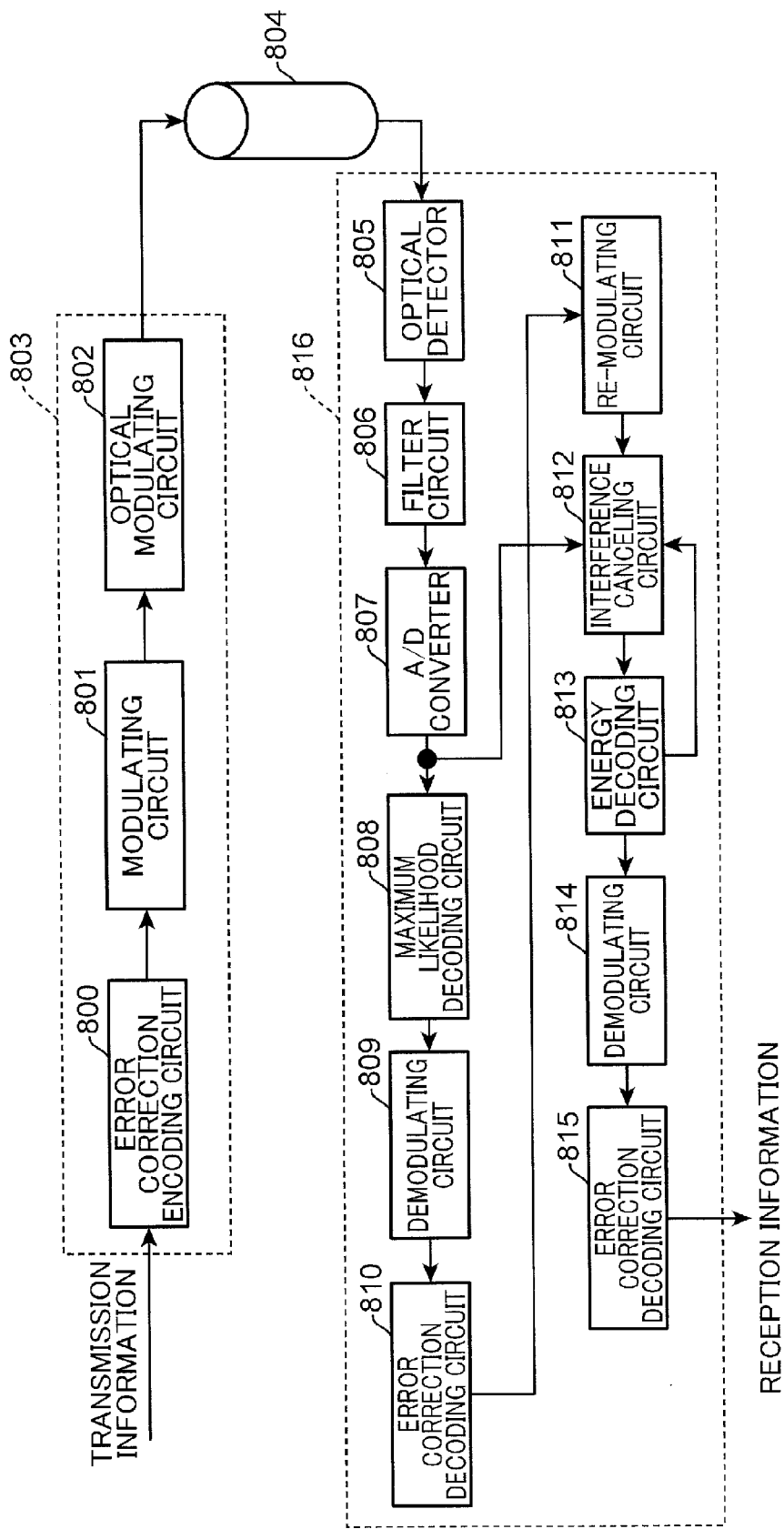
FIG. 36 is a diagram showing a configuration of an optical communication device according to a fourth embodiment of the present invention.

FIG. 36 is a diagram showing a configuration of an optical communication device according to a fourth embodiment of the present invention. The optical communication device comprises a transmitter 803, an optical fiber 804, and a receiver 816.

The transmitter 803 which transmits transmission information comprises an error correction encoding circuit 800, a modulating circuit 801, and an optical modulating circuit 802. The error correction encoding circuit 800 performs error correction encoding on transmission information to be transmitted. The modulating circuit 801 digitally modulates transmission information subjected to error correction encoding using a modulation system such as amplitude shift keying (ASK) or phase shift keying (PSK) and outputs the digitally modulated transmission information as a digital code. The optical modulating circuit 802 generates an optical signal waveform having intensity or a phase of light with a predetermined waveform modulated in accordance with the digital code and sends the optical signal waveform to the optical fiber 804.

The optical fiber 804 transmits the optical signal waveform transmitted from the transmitter 803 to the receiver 816. The receiver 816 comprises an optical detector 805, a filter circuit 806, an A/D converter 807, a maximum likelihood decoding circuit 808, a demodulating circuit 809, an error correction decoding circuit 810, a re-modulating circuit 811, an interference canceling circuit 812, an energy decoding circuit 813, a demodulating circuit 814, and an error correction decoding circuit 815.

An optical signal waveform is inputted to the optical detector 805 that is constituted by a photodetector or the like. The optical detector 805 detects an intensity or a phase of light transmitted by the optical fiber 804, photoelectrically converts the light, and outputs an electric signal. Photoelectric conversion performance has frequency characteristics.

Figure 37:
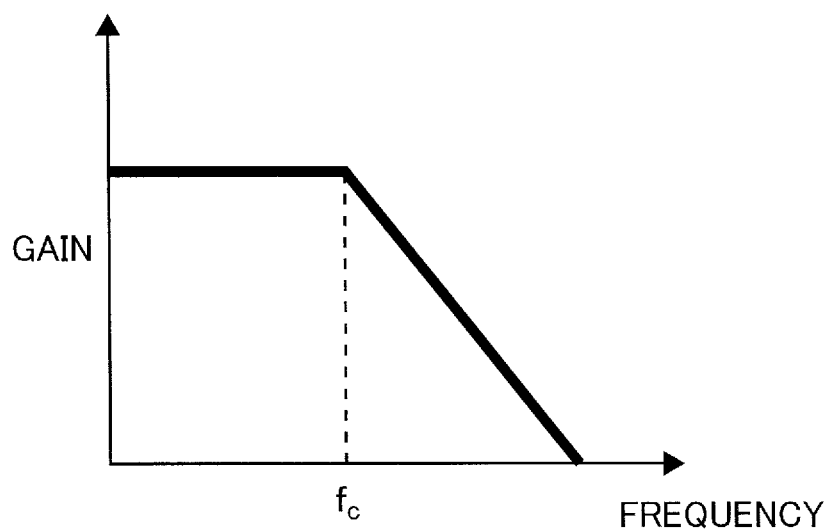
FIG. 37 is a diagram showing frequency characteristics of photoelectric conversion by an optical detector according to the fourth embodiment of the present invention.
Figure 38:
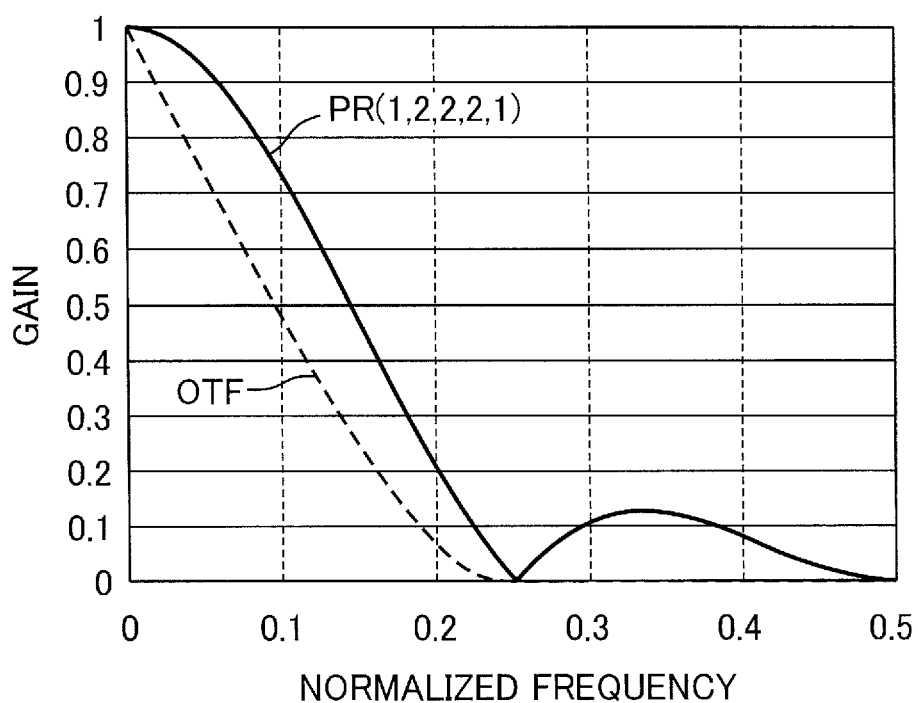
FIG. 38 is a diagram showing frequency characteristics of an OTF of a BDXL and a PR (1, 2, 2, 2, 1) class.

FIG. 37 is a diagram showing frequency characteristics of photoelectric conversion by an optical detector according to the fourth embodiment of the present invention. As shown in FIG. 37, the frequency characteristics of the photoelectric conversion by the optical detector 805 is low-pass characteristics. In order to increase communication rate, a channel frequency of a modulation process by the modulating circuit 801 of the transmitter 803 is set higher than twice a frequency $f_c$ where gain of the frequency characteristics shown in FIG. 37 starts to drop. In this case, in a similar manner to the optical disk device according to the third embodiment described earlier, an intersymbol interference occurs in which a signal transmitted at 1 channel bit width is detected as a waveform that has spread beyond the 1 channel bit.

An electric signal in a state where the electric signal includes an intersymbol interference is inputted to the filter circuit 806. The filter circuit 806 reduces a low frequency band noise component and a high frequency band noise component within a range which does not adversely affect a component of a frequency band of a modulation code included in the electric signal. The A/D converter 807 converts an output signal from the filter circuit 806 into a digital signal which is sampled at a 1 channel bit interval that is a unit of the modulation code. The maximum likelihood decoding circuit 808 decodes the digital signal from the A/D converter 807 into the transmitted digital code. The maximum likelihood decoding circuit 808 selects the original digital code by judging an expectation signal whose Euclidean distance from the digital signal is smallest.

The demodulating circuit 809 demodulates the digital code according to the modulation system such as ASK or PSK which had been used by the modulating circuit 801. The error correction decoding circuit 810 corrects locations of errors created by noise applied during transmission by the optical fiber 804 to reduce the number of errors.

The re-modulating circuit 811 outputs the digitally-modulated digital code using a modulation system similar to that of the modulating circuit 801 of the transmitter 803.

Configurations and operations of the interference canceling circuit 812 and the energy decoding circuit 813 are similar to the configurations and operations of the interference canceling circuit 309 and the energy decoding circuit 310 in the optical disk device according to the third embodiment described earlier. Detailed configurations of the interference canceling circuit 812 and the energy decoding circuit 813 are the same as the interference canceling circuit 309 and the energy decoding circuit 310 shown in FIG. 29, and operations of the interference canceling circuit 812 are the same as operations of the interference canceling circuit 309 shown in FIG. 30.

The interference canceling circuit 812 generates an interference signal that is predicted when the digital code obtained from the re-modulating circuit 811 is passed through the optical modulating circuit 802, the optical fiber 804, the optical detector 805, the filter circuit 806, and the A/D converter 807, and subtracts the generated interference signal from a digital signal sampled by the A/D converter 807. In addition, the interference canceling circuit 812 generates an interference signal from a past bit sequence that is retained by the energy decoding circuit 813 and subtracts the generated interference signal from the digital signal. The energy decoding circuit 813 uses the digital signal after interference cancellation to judge a state transition sequence in accordance with a trellis diagram shown in FIG. 31 and outputs a decoding result.

While a processing interval of the interference canceling circuit 812 is set to 32 channel bits in the third embodiment as shown in FIG. 30, a width of the processing interval is favorably set longer than a spreading width (a width of an intersymbol interference) of an electric signal that is obtained by photoelectric conversion by the optical detector 805 with respect to a transmitted optical signal waveform of 1 channel bit. When the width of the processing interval is shorter than the width of an intersymbol interference, an influence of a signal component of a bit sequence of an interval other than a 2 channel bit interval from time k to time k+1 remains in the digital signal from which the interference signal has been subtracted and is retained as an error from an expectation value. An increase in the error causes a degradation in decoding performance. Therefore, by setting the width of the processing interval longer than the width of an intersymbol interference that is determined by frequency characteristics of the photoelectric conversion shown in FIG. 37, a signal component of a bit sequence of an interval other than that from time k to time k+1 does not remain and a digital code can be outputted after performing decoding under optimum conditions.

The demodulating circuit 814 demodulates the digital code in accordance with the modulation system such as ASK or PSK which had been used by the modulating circuit 801 in a similar manner to the demodulating circuit 809 that performs the first decoding process. Furthermore, the error correction decoding circuit 815 corrects errors remaining in the demodulated digital code, and outputs the digital code subjected to error correction as reception information.

Accordingly, the influence of an intersymbol interference due to frequency characteristics of the photoelectric conversion by the optical detector 805 can be canceled, and transmission information can be decoded through performance comparable to an SNR in a simple manner and without degrading performance, and communication rate can be increased by raising a channel frequency of the modulating circuit 801.

Moreover, in the present fourth embodiment, the optical communication device corresponds to an example of the decoding device, the optical fiber 804 corresponds to an example of the medium, the interference canceling circuit 812 corresponds to an example of the interference canceling unit, the energy decoding circuit 813 corresponds to an example of the first decoding unit, the maximum likelihood decoding circuit 808 corresponds to an example of the second decoding unit, the demodulating circuit 809 corresponds to an example of the first demodulating unit, the error correction decoding circuit 810 corresponds to an example of the first error correction unit, the re-modulating circuit 811 corresponds to an example of the re-modulating unit, the demodulating circuit 814 corresponds to an example of the second demodulating unit, and the error correction decoding circuit 815 corresponds to an example of the second error correction unit.

Alternatively, components of the optical disk device according to the third embodiment or the optical communication device according to the fourth embodiment can be realized by an LSI (Large Scale Integration) that is an example of an integrated circuit. Components of the optical disk device and the optical communication device may be individually configured as single chips. In addition, a part of or all of the components may constitute a single chip.

Moreover, while an LSI has been cited as an example of an integrated circuit, the optical disk device and the optical communication device may be realized by an IC (Integrated Circuit), an LSI, a super LSI, or an ultra LSI depending on degrees of integration.

In addition, the integrated circuits in the present third and fourth embodiments are not limited to LSIs and may be realized using a dedicated circuit or a general-purpose processor. Furthermore, an FPGA (Field Programmable Gate Array) that can be programmed after LSI production or a reconfigurable processor that allows reconfiguration of connections and settings of circuit cells inside an LSI after LSI production may also be used.

Moreover, if techniques for realizing integrated circuits which replace LSIs should emerge due to progress made in semiconductor technology or due to derivative technology, it is obvious that the function blocks may be integrated using such techniques. Examples of integration technology which may possibly replace LSIs include an adaptation of biotechnology.

Moreover, the specific embodiments described above primarily include an invention configured as described below.

A decoding device according to an aspect of the present invention is a decoding device which decodes digital information based on a detected signal obtained from a medium having predetermined frequency characteristics, the decoding device comprising: an interference canceling unit which extracts, from states of $2^K$-number (where K is a natural number) of detected signals that are likely within a range of K bit width where an interference between bits of the digital information occurs due to the predetermined frequency characteristics, most likely $2^M$-number (where M is a natural number) of detected signals respectively corresponding to states of $2^M$-number of detected signals which exist within a range of M bit width that is included in the range of K bit width; and a first decoding unit which generates a decoded signal by calculating differences between the $2^M$-number of detected signals extracted by the interference canceling unit and expectation signals respectively corresponding to the $2^M$-number of detected signals and also by selecting a transition sequence of a state of a detected signal for which the calculated difference is smallest.

According to this configuration, an interference canceling unit extracts, from states of $2^K$-number (where K is a natural number) of detected signals that are likely within a range of K bit width where an interference between bits of the digital information occurs due to the predetermined frequency characteristics, most likely $2^M$-number (where M is a natural number) of detected signals respectively corresponding to states of $2^M$-number of detected signals which exist within a range of M bit width that is included in the range of K bit width. A first decoding unit generates a decoded signal by calculating differences between the $2^M$-number of detected signals extracted by the interference canceling unit and expectation signals respectively corresponding to the $2^M$-number of detected signals and selecting a transition sequence of a state of a detected signal for which the calculated difference is smallest.

Therefore, since a component corresponding to an intersymbol interference can be canceled from a detected signal, a constraint length can be reduced without worsening an SNR and degradation of decoding performance can be prevented.

In addition, favorably, the decoding device described above further comprises: a second decoding unit which calculates a difference between a detected signal that is obtained when the digital information subjected to error correction coding in accordance with a predetermined error correction encoding system and also subjected to modulation encoding in accordance with a predetermined modulation system is passed through the medium and expectation signals that are obtained when arbitrary pattern signals are passed through the medium, and which outputs a pattern signal for which the calculated difference is smallest as a first decoded signal; a first demodulating unit which demodulates the first decoded signal in accordance with the modulation system to generate a first demodulated signal; a first error correcting unit which performs error correction on the first demodulated signal in accordance with the error correction encoding system to generate a first digital signal; and a re-modulating unit which re-modulates the first digital signal in accordance with the modulation system to generate a re-modulated signal, wherein the interference canceling unit extracts, using the re-modulated signal, from states of $2^K$-number of detected signals that are likely within the range of K bit width where an interference between bits of the digital information occurs due to the predetermined frequency characteristics, most likely $2^M$-number of detected signals respectively corresponding to states of $2^M$-number of detected signals which exist within the range of M bit width that is included in the range of K bit width, the first decoding unit generates a second decoded signal by calculating difference integrated values in the range of K bit width between the $2^M$-number of detected signals extracted by the interference canceling unit and expectation signals respectively corresponding to the $2^M$-number of detected signals and also by selecting a transition sequence of a state of a detected signal for which the calculated difference integrated value is smallest, the decoding device further comprising: a second demodulating unit which demodulates the second decoded signal in accordance with the modulation system to generate a second demodulated signal; and a second error correcting unit which performs error correction on the second demodulated signal in accordance with the error correction encoding system to generate a second digital signal.

According to this configuration, the second decoding unit calculates a difference between a detected signal that is obtained when the digital information subjected to error correction coding in accordance with a predetermined error correction encoding system and modulation encoding in accordance with a predetermined modulation system is passed through the medium and expectation signals that are obtained when arbitrary pattern signals are passed through the medium, and outputs a pattern signal for which the calculated difference is smallest as a first decoded signal. The first demodulating unit demodulates the first decoded signal in accordance with the modulation system to generate a first demodulated signal. The first error correcting unit performs error correction on the first demodulated signal in accordance with the error correction encoding system to generate a first digital signal. The re-modulating unit re-modulates the first digital signal in accordance with the modulation system to generate a re-modulated signal. Using the re-modulated signal, the interference canceling unit extracts, from states of $2^K$-number of detected signals that are likely within the range of K bit width where an interference between bits of the digital information occurs due to the predetermined frequency characteristics, most likely $2^M$-number of detected signals respectively corresponding to states of $2^M$-number of detected signals which exist within the range of M bit width that is included in the range of K bit width. The first decoding unit generates a second decoded signal by calculating difference integrated values in the range of K bit width between the $2^M$-number of detected signals extracted by the interference canceling unit and expectation signals respectively corresponding to the $2^M$-number of detected signals and selecting a transition sequence of a state of a detected signal for which the calculated difference integrated value is smallest. The second demodulating unit demodulates the second decoded signal in accordance with the modulation system to generate a second demodulated signal. The second error correcting unit performs error correction on the second demodulated signal in accordance with the error correction encoding system to generate a second digital signal.

Therefore, while an error that is dependent on a difference in Euclidean distances remains in a first decoding process by the second decoding unit, by canceling an intersymbol interference occurring in a detected signal by using a signal in which the number of error bits has been reduced through an error correction process by the first error correcting unit and re-decoding the detected signal from which the intersymbol interference has been canceled, a bit error rate can be reduced and decoding performance can be improved.

In addition, favorably, in the decoding device described above, the error correction encoding system has a code rate which retains error correction performance that is capable of reducing a bit error rate of the first demodulated signal. According to this configuration, the bit error rate of the first demodulated signal can be reduced.

Furthermore, favorably, in the decoding device described above, the M bit width is 2 bit width. According to this configuration, by setting the M bit width to 2 bit width, an intersymbol interference can be most canceled and a bit error rate can be most reduced.

In addition, favorably, in the decoding device described above, the interference canceling unit comprises: a first interference generating unit which generates, for each state of the $2^M$-number of detected signals, a first interference component which is obtained when passing through the medium a bit sequence in accordance with a transition sequence of a state of a first predetermined interval that corresponds to a time preceding the M bit-width range within the K bit-width range; a second interference generating unit which generates, for each state of the $2^M$-number of detected signals, a second interference component which is obtained when passing through the medium a bit sequence of the re-modulated signal that corresponds to a second predetermined interval that corresponds to a time subsequent to the M bit-width range within the K bit-width range; and a signal canceling unit which outputs signals obtained by canceling the first interference component and the second interference component from the detected signals to the first decoding unit.

According to this configuration, for each state of the $2^M$-number of detected signals, the first interference generating unit generates a first interference component which is obtained when passing a bit sequence in accordance with a transition sequence of a state of a first predetermined interval that corresponds to a time preceding the M bit-width range within the K bit-width range through the medium. For each state of the $2^M$-number of detected signals, the second interference generating unit generates a second interference component which is obtained when passing a bit sequence of the re-modulated signal that corresponds to a second predetermined interval that corresponds to a time subsequent to the M bit-width range within the K bit-width range through the medium. The signal canceling unit outputs signals obtained by canceling the first interference component and the second interference component from the detected signals to the first decoding unit.

Therefore, since the influences of the first interference component in the first predetermined interval and the second interference component in the second predetermined interval are eliminated and a constraint length can be shortened, the number of states can be reduced without being affected by the frequency characteristics of the medium.

Furthermore, favorably, in the decoding device described above, the interference canceling unit comprises: a first interference generating unit which generates, for each state of the $2^M$-number of detected signals, a first interference component which is obtained when passing through the medium a bit sequence in accordance with a transition sequence of a state of a first predetermined interval that corresponds to a time preceding the M bit-width range within the K bit-width range; a second interference generating unit which generates, for each state of the $2^M$-number of detected signals, a second interference component which is obtained when passing through the medium a bit sequence in accordance with a transition sequence of a state of a second predetermined interval that corresponds to a time subsequent to the M bit-width range within the K bit-width range; and a signal canceling unit which outputs signals obtained by canceling the first interference component and the second interference component from the detected signals to the first decoding unit.

According to this configuration, for each state of the $2^M$-number of detected signals, the first interference generating unit generates a first interference component which is obtained when passing a bit sequence in accordance with a transition sequence of a state of a first predetermined interval that corresponds to a time preceding the M bit-width range within the K bit-width range through the medium. For each state of the $2^M$-number of detected signals, the second interference generating unit generates a second interference component which is obtained when passing a bit sequence in accordance with a transition sequence of a state of a second predetermined interval that corresponds to a time subsequent to the M bit-width range within the K bit-width range through the medium. The signal canceling unit outputs signals obtained by canceling the first interference component and the second interference component from the detected signals to the first decoding unit.

Therefore, since the influences of the first interference component in the first predetermined interval and the second interference component in the second predetermined interval are eliminated and a constraint length can be shortened, the number of states can be reduced without being affected by the frequency characteristics of the medium.

In addition, favorably, in the decoding device described above, the first interference generating unit generates the first interference component by using a transition sequence of each state that is selected by the first decoding unit.

According to this configuration, since the first interference generating unit generates the first interference component using a transition sequence of each state that is selected by the first decoding unit, the configuration can be simplified.

Furthermore, favorably, in the decoding device described above, among a plurality of second interference components that are generated from the transition sequences of a plurality of states that are likely in the second predetermined interval, the second interference generating unit uses a second interference component for which a most likely state transition sequence has been obtained for each state in the first decoding unit.

According to this configuration, since the second interference generating unit uses a second interference component for which a most likely state transition sequence has been obtained for each state in the first decoding unit among a plurality of second interference components that are generated from the transition sequences of a plurality of states that are likely in the second predetermined interval, a most likely second interference component is predicted in accordance with each state and the second interference component that is predicted from the detected signals can be canceled.

In addition, favorably, in the decoding device described above, the first interference generating unit generates the first interference component that is expressed by a signal waveform on a time axis, the second interference generating unit generates the second interference component that is expressed by a signal waveform on a time axis, and the signal canceling unit outputs signals obtained by subtracting the first interference component and the second interference component from the detected signals.

According to this configuration, since the first interference component and the second interference component are expressed by signal waveforms on a time axis, the first interference component and the second interference component can be calculated by a convolution computation of a 1 channel bit detected signal and a bit sequence.

Furthermore, favorably, in the decoding device described above, the first interference generating unit generates the first interference component that is expressed by a frequency spectrum, the second interference generating unit generates the second interference component that is expressed by a frequency spectrum, and the signal canceling unit outputs frequency spectra obtained by subtracting the frequency spectrum of the first interference component and the frequency spectrum of the second interference component from frequency spectra of the detected signals.

According to this configuration, since the first interference component and the second interference component are expressed by frequency spectra, the first interference component and the second interference component can be calculated by performing a Fourier transform on a bit sequence.

In addition, favorably, in the decoding device described above, the M bit width is smaller than a spreading width of a response signal that is obtained when a signal with 1 bit width is passed through the medium.

According to this configuration, by setting the M bit width smaller than a spreading width of a response signal that is obtained when passing a signal with 1 bit width through the medium, an intersymbol interference can be reduced.

Furthermore, favorably, in the decoding device described above, the first decoding unit selects a transition sequence of a state using a Viterbi algorithm. According to this configuration, a transition sequence of a state can be selected using a Viterbi algorithm.

In addition, favorably, in the decoding device described above, the modulation system is a run-length limited modulation encoding system. According to this configuration, the first demodulated signal and the re-modulated signal can be generated in accordance with the run-length limited modulation encoding system.

Furthermore, favorably, in the decoding device described above, the error correction encoding system is a low-density parity check encoding system. According to this configuration, error correction can be performed in accordance with the low-density parity check encoding system.

In addition, favorably, in the decoding device described above, the error correction encoding system is a Reed-Solomon encoding system. According to this configuration, error correction can be performed in accordance with the Reed-Solomon encoding system.

Furthermore, favorably, in the decoding device described above, the second decoding unit outputs as the first decoded signal a pattern signal with a smallest difference from the detected signal from $2^K$-number of pattern signals that are likely within the K bit width range where an interference between bits occurs. According to this configuration, a bit error rate can be reduced by a decoding processing by the second decoding unit before a decoding processing by the first decoding unit.

In addition, favorably, in the decoding device described above, the medium includes an optical disk and the decoding device further comprises an optical pickup which irradiates light on the optical disk and outputs the detected signal in accordance with reflected light from the optical disk. According to this configuration, digital information can be decoded based on a detected signal that is obtained from an optical disk having predetermined frequency characteristics.

A decoding method according to another aspect of the present invention is a decoding method of decoding digital information based on a detected signal obtained from a medium having predetermined frequency characteristics, the decoding method comprising: an interference canceling step in which, from states of $2^K$-number (where K is a natural number) of detected signals that are likely within a range of K bit width where an interference between bits of the digital information occurs due to the predetermined frequency characteristics, most likely $2^M$-number (where M is a natural number) of detected signals respectively corresponding to states of $2^M$-number of detected signals which exist within a range of M bit width that is included in the range of K bit width are extracted; and a decoding step in which a decoded signal is generated by calculating differences between the $2^M$-number of detected signals extracted in the interference canceling step and expectation signals respectively corresponding to the $2^M$-number of detected signals and also by selecting a transition sequence of a state of a detected signal for which the calculated difference is smallest.

According to this configuration, in an interference canceling step, from states of $2^K$-number (where K is a natural number) of detected signals that are likely within a range of K bit width where an interference between bits of the digital information occurs due to the predetermined frequency characteristics, most likely $2^M$-number (where M is a natural number) of detected signals respectively corresponding to states of $2^M$-number of detected signals which exist within a range of M bit width that is included in the range of K bit width are extracted. In a decoding step, a decoded signal is generated by calculating differences between the $2^M$-number of extracted detected signals and expectation signals respectively corresponding to the $2^M$-number of detected signals and selecting a transition sequence of a state of a detected signal for which the calculated difference is smallest.

Therefore, since a component corresponding to an intersymbol interference can be canceled from a detected signal, a constraint length can be reduced without worsening an SNR and degradation of decoding performance can be prevented.

It is to be understood that the specific embodiments or examples described in Description of Embodiments are merely illustrative of the technical contents of the present invention, and that the present invention should not be construed as being limited to such specific examples. Obviously, many modifications and variations of the present invention are possible without departing from the spirit of the invention and the scope of the following claims.

INDUSTRIAL APPLICABILITY

The decoding device and the decoding method according to the present invention are capable of reducing a constraint length without causing a deterioration in an SNR and preventing a degradation of decoding performance, and are useful as a decoding device and a decoding method which decode digital information based on a detected signal that is obtained from a medium having predetermined frequency characteristics.

The invention claimed is:

1. A decoding device which decodes digital information based on a detected signal obtained from a medium having predetermined frequency characteristics,
the decoding device comprising:
a first decoding unit which calculates a difference between a detected signal that is obtained when the digital information subjected to error correction coding in accordance with a predetermined error correction encoding system and also subjected to modulation encoding in accordance with a predetermined modulation system is passed through the medium and expectation signals that are obtained when arbitrary pattern signals are passed through the medium, and which outputs a pattern signal for which the calculated difference is smallest as a first decoded signal;
a first demodulating unit which demodulates the first decoded signal in accordance with the modulation system to generate a first demodulated signal;
a first error correcting unit which performs error correction on the first demodulated signal in accordance with the error correction encoding system to generate a first digital signal; and
a re-modulating unit which re-modulates the first digital signal in accordance with the modulation system to generate a re-modulated signal;
an interference canceling unit which extracts, using the re-modulated signal, from states of $2^K$-number (where K is a natural number) of detected signals that are predicted by the interference canceling unit to likely be within a range of K bit width where an interference between bits of the digital information occurs due to the predetermined frequency characteristics, $2^M$-number (where M is a natural number) of detected signals, most likely, as predicted by the interference canceling unit, respectively corresponding to states of $2^M$-number of detected signals which exist within a range of M bit width that is included in the range of K bit width;
a second decoding unit which generates a second decoded signal by calculating a difference integrated value in the K bit width range between the $2^M$-number of detected signals extracted by the interference canceling unit and expectation signals respectively corresponding to the $2^M$-number of detected signals and by selecting a transition sequence of a state of a detected signal for which the calculated difference integrated value is smallest;
a second demodulating unit which demodulates the second decoded signal in accordance with the modulation system to generate a second demodulated signal; and
a second error correcting unit which performs error correction on the second demodulated signal in accordance with the error correction encoding system to generate a second digital signal.

2. The decoding device according to claim 1, wherein the error correction encoding system has a code rate which retains error correction performance that is capable of reducing a bit error rate of the first demodulated signal.

3. The decoding device according to claim 1, wherein the M bit width is 2 bit width.

4. The decoding device according to claim 1, wherein the interference canceling unit comprises:
a first interference generating unit which generates, for each state of the $2^M$-number of detected signals, a first interference component which is obtained when passing through the medium a bit sequence in accordance with a transition sequence of a state of a first predetermined interval that corresponds to a time preceding the M bit-width range within the K bit-width range;
a second interference generating unit which generates, for each state of the $2^M$-number of detected signals, a second interference component which is obtained when passing through the medium a bit sequence of the re-modulated signal that corresponds to a second predetermined interval that corresponds to a time subsequent to the M bit-width range within the K bit-width range; and
a signal canceling unit which outputs signals obtained by canceling the first interference component and the second interference component from the detected signals to the second decoding unit.

5. The decoding device according to claim 1, wherein the interference canceling unit comprises:
a first interference generating unit which generates, for each state of the $2^M$-number of detected signals, a first interference component which is obtained when passing through the medium a bit sequence in accordance with a transition sequence of a state of a first predetermined interval that corresponds to a time preceding the M bit-width range within the K bit-width range;
a second interference generating unit which generates, for each state of the $2^M$-number of detected signals, a second interference component which is obtained when passing through the medium a bit sequence in accordance with a transition sequence of a state of a second predetermined interval that corresponds to a time subsequent to the M bit-width range within the K bit-width range; and
a signal canceling unit which outputs signals obtained by canceling the first interference component and the second interference component from the detected signals to the second decoding unit.

6. The decoding device according to claim 4, wherein the first interference generating unit generates the first interference component by using a transition sequence of each state that is selected by the second decoding unit.

7. The decoding device according to claim 4, wherein among a plurality of second interference components that are generated from the transition sequences of a plurality of states that are predicted by the interference canceling unit to likely be in the second predetermined interval, the second interference generating unit uses a second interference component for which a most likely state transition sequence, as predicted by the interference canceling unit, has been obtained for each state in the second decoding unit.

8. The decoding device according to claim 4, wherein
the first interference generating unit generates the first interference component that is expressed by a signal waveform on a time axis,
the second interference generating unit generates the second interference component that is expressed by a signal waveform on a time axis, and
the signal canceling unit outputs signals obtained by subtracting the first interference component and the second interference component from the detected signals.

9. The decoding device according to claim 4, wherein
the first interference generating unit generates the first interference component that is expressed by a frequency spectrum,
the second interference generating unit generates the second interference component that is expressed by a frequency spectrum, and
the signal canceling unit outputs frequency spectra obtained by subtracting the frequency spectrum of the first interference component and the frequency spectrum of the second interference component from frequency spectra of the detected signals.

10. The decoding device according to claim 1, wherein the M bit width is smaller than a spreading width of a response signal that is obtained when a signal with 1 bit width is passed through the medium.

11. The decoding device according to claim 1, wherein the second decoding unit selects a transition sequence of a state using a Viterbi algorithm.

12. The decoding device according to claim 1, wherein the modulation system is a run-length limited modulation encoding system.

13. The decoding device according to claim 1, wherein the error correction encoding system is a low-density parity check encoding system.

14. The decoding device according to claim 1, wherein the error correction encoding system is a Reed-Solomon encoding system.

15. The decoding device according to claim 1, wherein the first decoding unit outputs as the first decoded signal a pattern signal with a smallest difference from the detected signal from $2^K$-number of pattern signals that are predicted by the interference canceling unit to likely be within the K bit width range where an interference between bits occurs.

16. The decoding device according to claim 1, wherein the medium includes an optical disk,
the decoding device further comprising an optical pickup which irradiates light on the optical disk and outputs the detected signal in accordance with reflected light from the optical disk.

17. A decoding method of decoding digital information based on a detected signal obtained from a medium having predetermined frequency characteristics,
the decoding method comprising:
a first decoding step in which a difference between a detected signal that is obtained when the digital information subjected to error correction coding in accordance with a predetermined error correction encoding system and also subjected to modulation encoding in accordance with a predetermined modulation system is passed through the medium and expectation signals that are obtained when arbitrary pattern signals are passed through the medium is calculated, and which outputs a pattern signal for which the calculated difference is smallest as a first decoded signal;
a first demodulating step in which the first decoded signal is demodulated in accordance with the modulation system to generate a first demodulated signal;
a first error correcting step in which error correction is performed on the first demodulated signal in accordance with the error correction encoding system to generate a first digital signal; and
a re-modulating step in which the first digital signal is re-modulated in accordance with the modulation system to generate a re-modulated signal;
an interference canceling step in which, from states of $2^K$-number (where K is a natural number) of detected signals that are predicted in the interference canceling step to likely be within a range of K bit width where an interference between bits of the digital information occurs due to the predetermined frequency characteristics, $2^M$-number (where M is a natural number) of detected signals, most likely, as predicted in the interference canceling step, respectively corresponding to states of $2^M$-number of detected signals which exist within a range of M bit width that is included in the range of K bit width are extracted using the re-modulated signal;
a second decoding step in which a second decoded signal is generated by calculating a difference integrated value in the K bit width range between the $2^M$-number of detected signals extracted in the interference canceling step and expectation signals respectively corresponding to the $2^M$-number of detected signals and also by selecting a transition sequence of a state of a detected signal for which the calculated difference integrated value is smallest;
a second demodulating step in which the second decoded signal is demodulated in accordance with the modulation system to generate a second demodulated signal; and
a second error correcting step in which error correction is performed on the second demodulated signal in accordance with the error correction encoding system to generate a second digital signal.

\* \* \* \* \*